(12) United States Patent
Tobioka

(10) Patent No.: US 11,189,637 B2
(45) Date of Patent: Nov. 30, 2021

(54) THREE-DIMENSIONAL MEMORY ARRAY INCLUDING SELF-ALIGNED DIELECTRIC PILLAR STRUCTURES AND METHODS OF MAKING THE SAME

(71) Applicant: SANDISK TECHNOLOGIES LLC, Addison, TX (US)

(72) Inventor: Akihiro Tobioka, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/886,824

(22) Filed: May 29, 2020

(65) Prior Publication Data

US 2020/0295040 A1 Sep. 17, 2020

Related U.S. Application Data

(62) Division of application No. 16/353,048, filed on Mar. 14, 2019, now Pat. No. 10,861,871.

(51) Int. Cl.
*H01L 29/792* (2006.01)
*H01L 27/11582* (2017.01)
(Continued)

(52) U.S. Cl.
CPC .... *H01L 27/11582* (2013.01); *H01L 21/0337* (2013.01); *H01L 21/31144* (2013.01);
(Continued)

(58) Field of Classification Search
CPC .......... H01L 27/11582; H01L 21/0337; H01L 21/31144; H01L 23/481; H01L 23/5226;
(Continued)

(56) References Cited

U.S. PATENT DOCUMENTS 9,576,967 B1 2/2017 Kimura et al.
9,627,403 B2 4/2017 Liu et al.
(Continued)

OTHER PUBLICATIONS

USPTO Office Communication, Notice of Allowance and Fee(s), for U.S. Appl. No. 16/353,048, dated Aug. 10, 2020, 12 pages.
(Continued)

*Primary Examiner* — Tan N Tran
(74) *Attorney, Agent, or Firm* — The Marbury Law Group PLLC

(57) ABSTRACT

An alternating stack of insulating layers and spacer material layers is formed over a substrate. Memory stack structures are formed through the alternating stack. A pair of backside trenches and a set of nested trenches are simultaneously formed through the alternating stack. Each trench within the set of nested trenches is spaced from any other trench within the set of nested trenches by at least one patterned remaining portion of the alternating stack having a respective shape of an enclosing wall. The at least one patterned remaining portion of the alternating stack is removed from inside to outside using sequential etch processes. A dielectric pillar structure is formed within the pillar-shaped cavity. The sacrificial material layers are replaced with electrically conductive layers. A through-memory-level conductive via structure is formed through the dielectric pillar structure.

18 Claims, 58 Drawing Sheets

(51) Int. Cl.

| | | |
|---|---|---|
| *H01L 27/11565* | (2017.01) | |
| *H01L 27/1157* | (2017.01) | |
| *H01L 27/11573* | (2017.01) | |
| *H01L 21/311* | (2006.01) | |
| *H01L 21/033* | (2006.01) | |
| *H01L 23/48* | (2006.01) | |
| *H01L 23/522* | (2006.01) | |
| *H01L 23/528* | (2006.01) | |
| *H01L 23/532* | (2006.01) | |
| H01L 27/11526 | (2017.01) | |
| H01L 27/11519 | (2017.01) | |
| H01L 27/11524 | (2017.01) | |
| H01L 27/11556 | (2017.01) | |

(52) U.S. Cl.
CPC ........ *H01L 23/481* (2013.01); *H01L 23/5226* (2013.01); *H01L 23/5283* (2013.01); *H01L 23/5329* (2013.01); *H01L 27/1157* (2013.01); *H01L 27/11565* (2013.01); *H01L 27/11573* (2013.01); *H01L 27/11519* (2013.01); *H01L 27/11524* (2013.01); *H01L 27/11526* (2013.01); *H01L 27/11556* (2013.01)

(58) Field of Classification Search
CPC ............. H01L 23/5283; H01L 23/5329; H01L 27/11565; H01L 27/1157; H01L 27/11573
USPC ....................................................... 257/324
See application file for complete search history.

(56) References Cited

U.S. PATENT DOCUMENTS

| 9,679,906 | B2 | 6/2017 | Lu et al. | |
|---|---|---|---|---|
| 9,716,103 | B2* | 7/2017 | Noda | ................. H01L 27/1157 |
| 9,806,093 | B2 | 10/2017 | Toyama et al. | |
| 9,818,693 | B2 | 11/2017 | Toyama et al. | |
| 9,818,759 | B2 | 11/2017 | Kai et al. | |
| 10,038,006 | B2 | 7/2018 | Furihata et al. | |
| 2017/0179153 | A1 | 6/2017 | Ogawa et al. | |
| 2019/0115357 | A1* | 4/2019 | Oh | ................... H01L 27/11575 |

OTHER PUBLICATIONS

U.S. Appl. No. 16/295,292, filed Mar. 7, 2019, SanDisk Technologies LLC.
U.S. Appl. No. 15/991,268, filed Jun. 29, 2018, SanDisk Technologies LLC.
U.S. Appl. No. 16/251,863, filed Jan. 18, 2019, SanDisk Technologies LLC.
U.S. Appl. No. 15/909,036, filed Mar. 1, 2018, SanDisk Technologies LLC.
U.S. Appl. No. 16/020,637, filed Jun. 27, 2018, SanDisk Technologies LLC.
U.S. Appl. No. 16/020,739, filed Jun. 27, 2018, SanDisk Technologies LLC.
U.S. Appl. No. 16/020,817, filed Jun. 27, 2018, SanDisk Technologies LLC.
U.S. Appl. No. 15/956,139, filed Apr. 18, 2018, SanDisk Technologies LLC.
U.S. Appl. No. 15/898,544, filed Feb. 17, 2018, SanDisk Technologies LLC.
U.S. Appl. No. 16/213,180, filed Dec. 7, 2018, SanDisk Technologies LLC.
U.S. Appl. No. 16/213,382, filed Dec. 7, 2018, SanDisk Technologies LLC.
Endoh, T. et al., "Novel Ultra High Density Memory with a Stacked-Surrounding Gate Transistor (S-SGT) Structured Cell," IEDM Proc., (2001), 33-36.

* cited by examiner

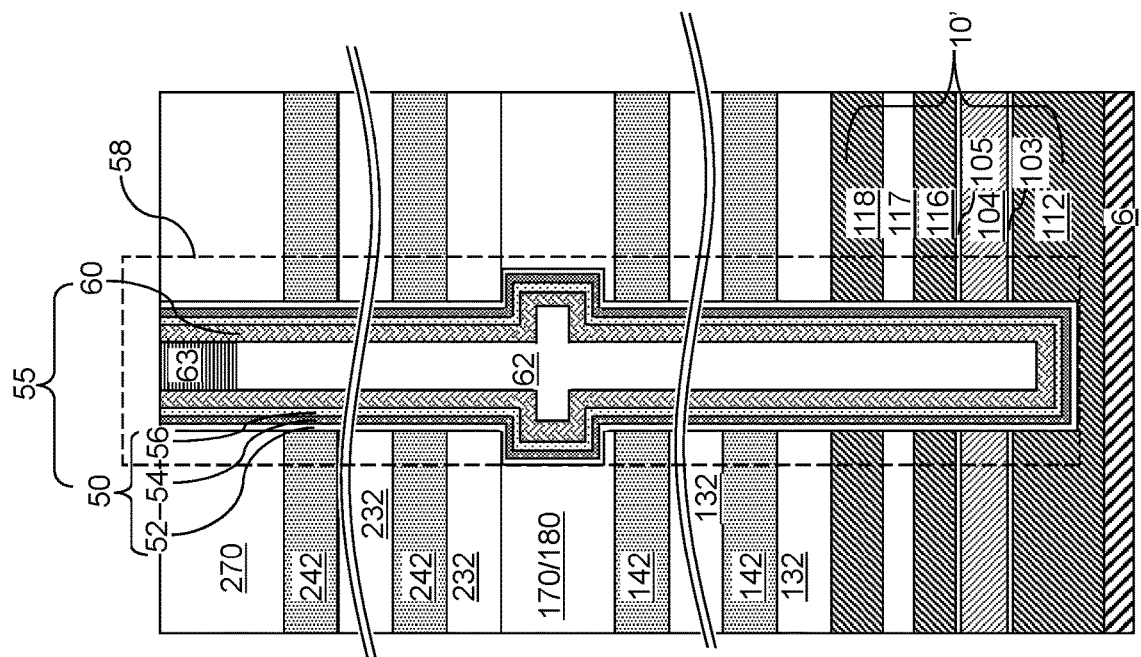
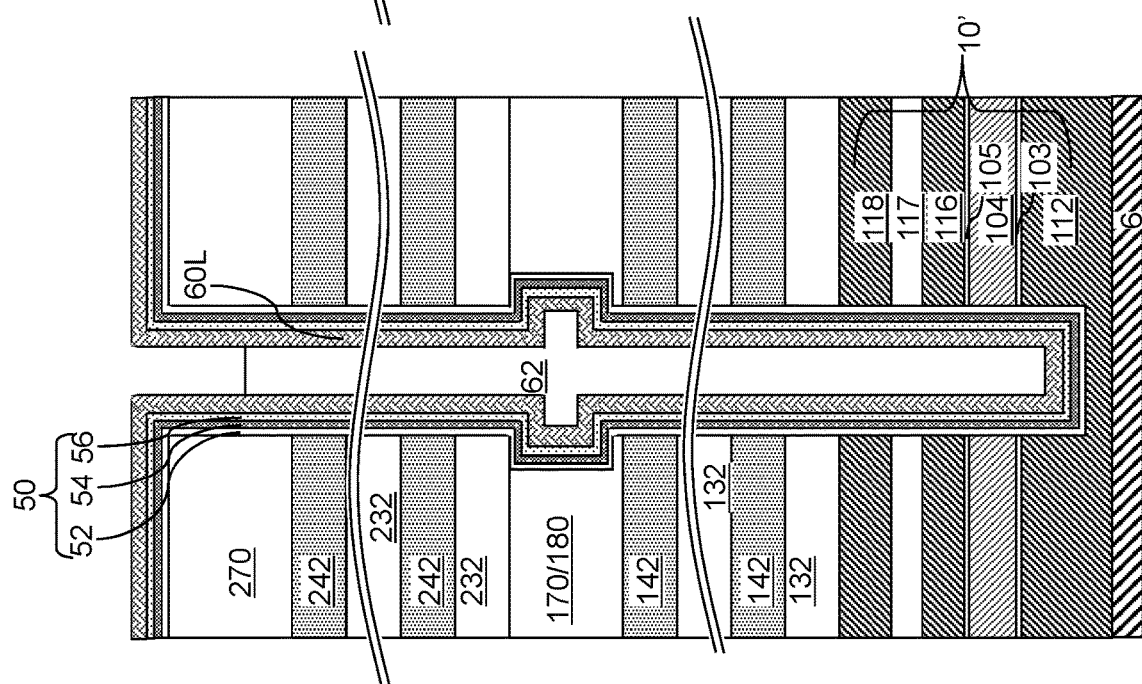
FIG. 9D
FIG. 9C

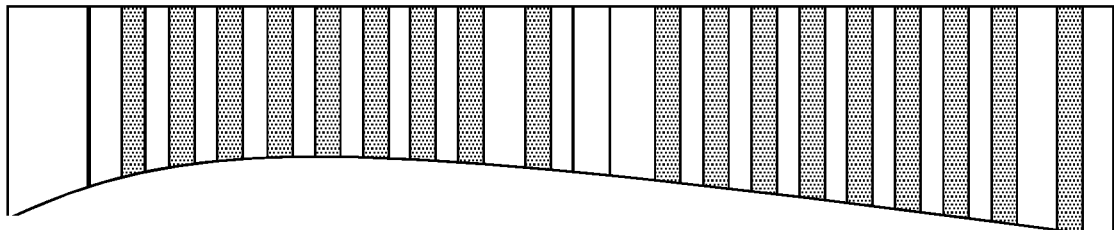
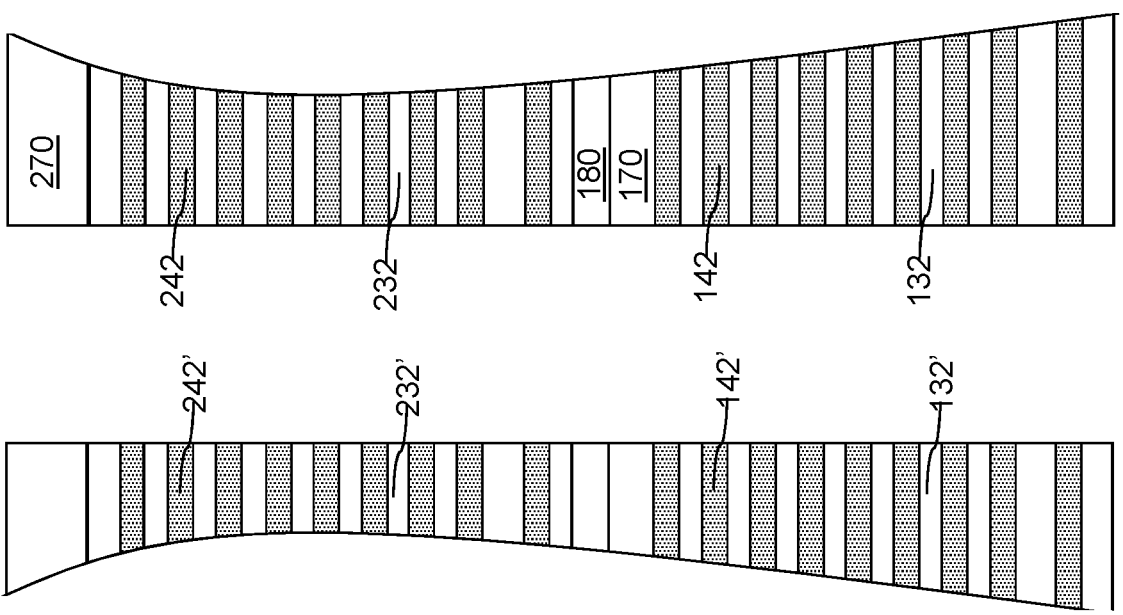
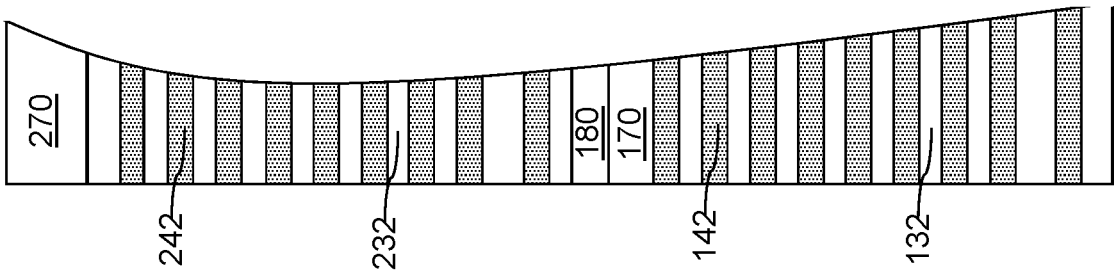
FIG. 11D  FIG. 11E

THREE-DIMENSIONAL MEMORY ARRAY INCLUDING SELF-ALIGNED DIELECTRIC PILLAR STRUCTURES AND METHODS OF MAKING THE SAME

FIELD

The present disclosure relates generally to the field of semiconductor devices and specifically to a three-dimensional memory device including a dielectric pillar structure and methods of making the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36. Recently, ultra-high-density storage devices using three-dimensional (3D) memory stack structures have been proposed. The memory stack structures overlie a substrate and extend through an alternating stack of insulating layers and electrically conductive layers. The memory stack structures include vertically stacks of memory elements provided at levels of the electrically conductive layers. Peripheral devices may be provided on the substrate underneath the alternating stack and the memory stack structures.

SUMMARY

According to an embodiment of the present disclosure, a method of forming a semiconductor structure is provided, which may comprise the steps of: forming an alternating stack of insulating layers and sacrificial material layers over a substrate; forming memory stack structures through the alternating stack; simultaneously forming a pair of backside trenches and a set of nested trenches through the alternating stack around the memory stack structures, wherein each trench within the set of nested trenches is spaced from any other trench within the set of nested trenches by at least one patterned remaining portion of the alternating stack having a respective shape of an enclosing wall; removing the at least one patterned remaining portion of the alternating stack using at least one etchant while preventing access of the at least one etchant to the pair of backside trenches, wherein a pillar-shaped cavity including all volumes of the set of nested trenches and the at least one patterned remaining portion of the alternating stack is formed; forming a dielectric pillar structure within the pillar-shaped cavity; replacing remaining portions of the sacrificial material layers with electrically conductive layers; and forming a through-memory-level conductive via structure through the dielectric pillar structure.

According to another embodiment of the present disclosure, a method of forming a semiconductor structure comprises forming an alternating stack of insulating layers and sacrificial material layers over a substrate, forming memory stack structures comprising a vertical semiconductor channel and a memory film through the alternating stack, simultaneously forming a pair of backside trenches and a set of nested trenches through the alternating stack around the memory stack structures, wherein each trench within the set of nested trenches is spaced from any other trench within the set of nested trenches by at least one patterned remaining portion of the alternating stack, forming a pair of sacrificial backside trench fill material structures in the pair of backside trenches and sacrificial nested trench fill structures in the set of nested trenches concurrently with formation of the pair of sacrificial backside trench fill material structures, forming an etch mask layer over the pair of sacrificial backside trench fill material structures and the set of sacrificial nested trench fill structures, forming an opening in the etch mask layer which exposes sacrificial inner trench fill structure of the set of sacrificial nested trench fill, while a sacrificial outer trench fill structure of the set of sacrificial nested trench fill structures and the pair of sacrificial backside trench fill material structures are covered by the etch mask layer, removing the sacrificial inner trench fill structure through the opening selective to the at least one patterned remaining portion of the alternating stack to form a void, removing the at least one patterned remaining portion of the alternating stack that is physically exposed to the opening and to the void, removing the sacrificial outer trench fill structure through the opening after the step of removing the at least one patterned remaining portion of the alternating stack, forming a dielectric pillar structure within the pillar-shaped cavity, removing the etch mask layer over the pair of sacrificial backside trench fill material structures, removing the pair of sacrificial backside trench fill material structures from the pair of backside trenches, replacing the sacrificial material layers of the alternating stack with electrically conductive layers through the pair of backside trenches, and forming a through-memory-level conductive via structure through the dielectric pillar structure.

According to another embodiment of the present disclosure, a semiconductor structure is provided, which may comprise: a semiconductor material layer overlying a substrate; an alternating stack of insulating layers and electrically conductive layers located over the semiconductor material layer; memory stack structures may vertically extend through the alternating stack; a peripheral circuitry may include field effect transistors and located over the substrate and underneath the semiconductor material layer; lower-level metal interconnect structures may be formed in lower-level dielectric material layers and located between the peripheral circuitry and the semiconductor material layer; a pair of backside trench fill structures may vertically extend through the alternating stack and laterally extend along a first horizontal direction; a dielectric pillar structure may extend through the alternating stack and located between the pair of backside trench fill structures, wherein each of the pair of backside trench fill structures and the dielectric pillar structure comprises sidewalls having a bowing profile that provides a greater width at a height between a topmost layer of the alternating stack and a bottommost layer of the alternating stack than at a height of the topmost layer of the alternating stack; and a through-memory-level conductive via structure vertically extending through the dielectric pillar structure and an opening in the semiconductor material layer and contacting one of the lower-level metal interconnect structures.

BRIEF DESCRIPTION OF THE DRAWINGS

FIGS. 9A-9D illustrate sequential vertical cross-sectional views of a memory opening during formation of a memory opening fill structure according to an embodiment of the present disclosure.

FIG. 11D is a vertical cross-sectional view of a trench within a set of nested trenches along a vertical plane D-D' of FIG. 11B.

FIG. 11E is a vertical cross-sectional view of a backside trench in the exemplary structure along a vertical plane E-E' of FIG. 11B.

DETAILED DESCRIPTION

Figure 1A:
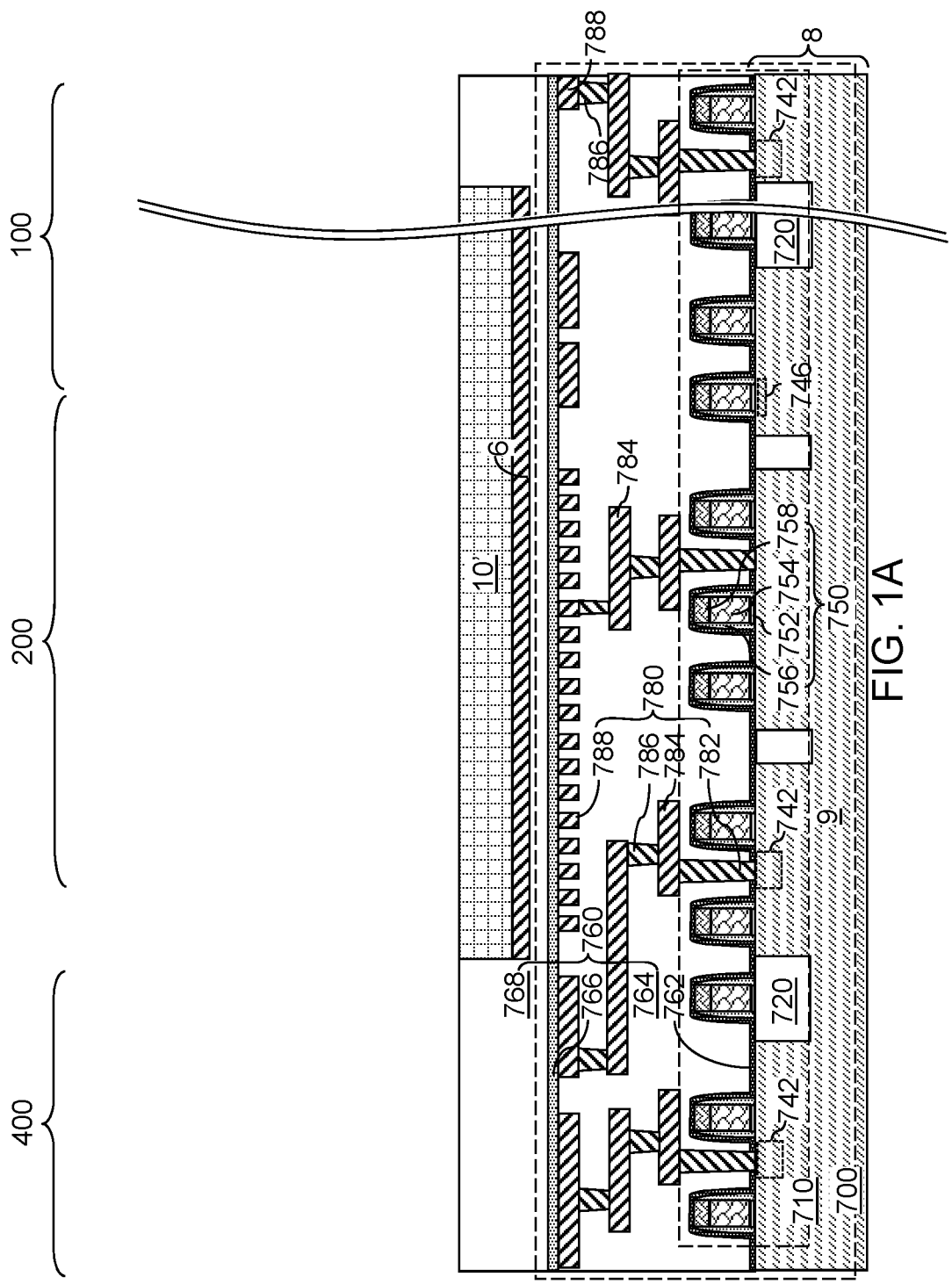
FIG. 1A is a vertical cross-sectional view of an exemplary structure after formation of semiconductor devices, lower level dielectric layers, lower metal interconnect structures, and in-process source level material layers on a semiconductor substrate according to a first embodiment of the present disclosure.

As discussed above, the present invention is directed to a three-dimensional memory device including a self-aligned dielectric pillar structure and methods of making the same, various embodiments of which are described herein in detail. The various embodiments of the present disclosure may be used to form a three-dimensional memory device such as a three-dimensional NAND memory array including a self-aligned dielectric pillar structure formed within an alternating stack of insulating layers and electrically conductive layers.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

The various three-dimensional memory devices of the present disclosure include a monolithic three-dimensional NAND string memory device, and may be fabricated using the various embodiments described herein. The monolithic three-dimensional NAND string may be located in a monolithic, three-dimensional array of NAND strings located over the substrate. At least one memory cell in the first device level of the three-dimensional array of NAND strings may be located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
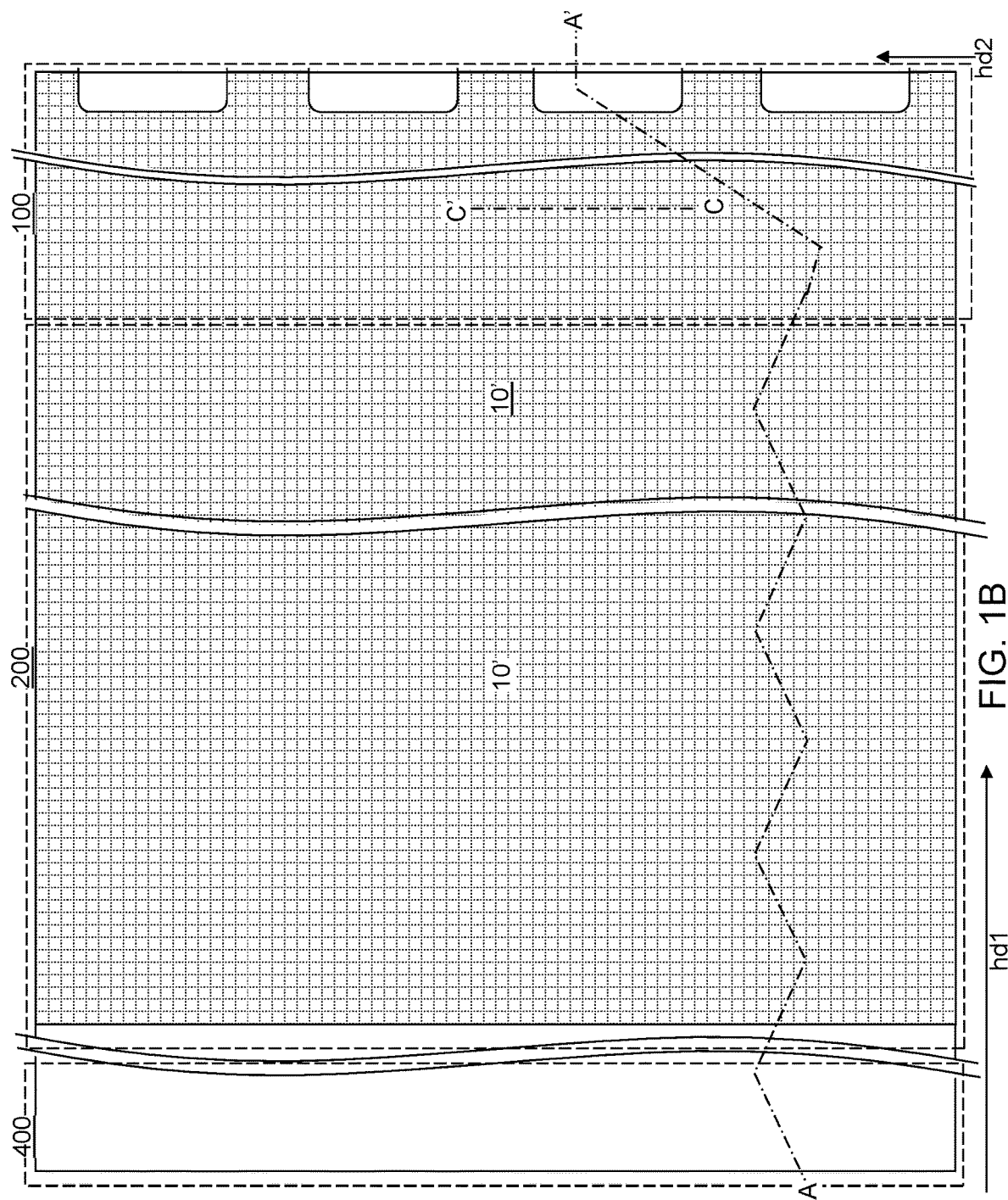
FIG. 1B is a top-down view of the exemplary structure of FIG. 1A. The hinged vertical plane A-A' is the plane of the vertical cross-sectional view of FIG. 1A.
Figure 1C:
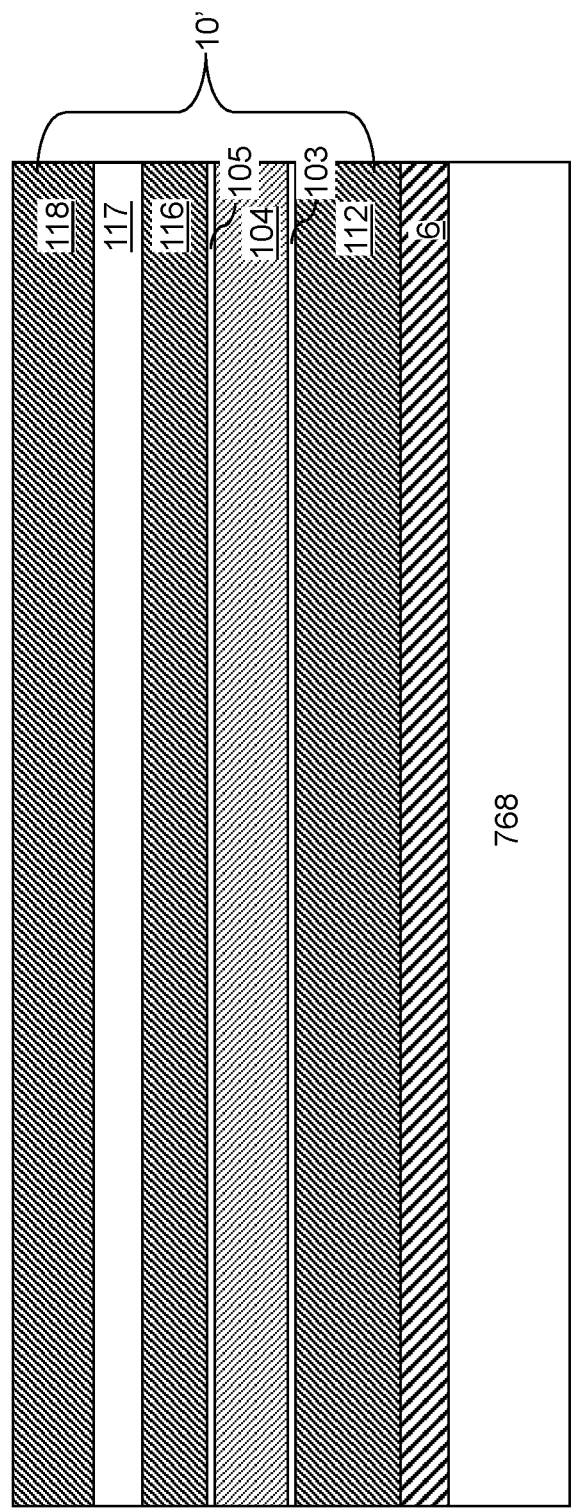
FIG. 1C is a magnified view of the in-process source level material layers along the vertical plane C-C' of FIG. 1B.

Referring to FIGS. 1A-1C, an exemplary structure according to a first embodiment of the present disclosure is illustrated. FIG. 1C is a magnified view of an in-process source-level material layers 10' illustrated in FIGS. 1A and 1B. The exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from the semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure that may be subsequently formed, which is typically referred to as a driver circuitry, which is also known as peripheral circuitry.

The peripheral circuitry may be configured to control charge storage elements within memory stack structures in a three-dimensional memory device to be subsequently formed. As used herein, peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices 710, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768. The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760 and overlies the field effect transistors. The lower-level metal interconnect structures 780 comprise a lower-level metal line structure located under and optionally contacting a bottom surface of the silicon nitride layer 766. The lower-level metal interconnect structures 780 may be formed in the lower-level dielectric material layers 760 and overlies the peripheral circuitry.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and may be lithographically patterned to provide an optional conductive plate layer 6 and in-process source-level material layers 10'. The optional conductive plate layer 6, if present, provides a high conductivity conduction path for electrical current that flows into, or out of, the in-process source-level material layers 10'. The optional conductive plate layer 6 may include a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 10' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 10' may include, from bottom to top, a lower source-level material layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level material layer 112 and the upper source-level semiconductor layer 116 may include a doped semiconductor material such as doped polysilicon or doped amorphous silicon. The conductivity type of the lower source-level material layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level material layer 112 and the upper source-level semiconductor layer 116 have a doping of a second conductivity type that is the opposite of the first conductivity type. The thickness of each of the lower source-level material layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 10' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 10' may be patterned to provide openings in areas in which through-memory-level contact via structures, through-dielectric contact via structures, and conductive via structures may be subsequently formed. Patterned portions of the stack of the conductive plate layer 6 and the in-process source-level material layers 10' may be present in each memory array region 100 in which three-dimensional memory stack structures are to be subsequently formed. The openings through the optional conductive plate layer 6 and the in-process source-level material layers 10' may be formed within the memory array region 100 in areas in which dielectric pillar structures are to be subsequently formed.

The optional conductive plate layer 6 and the in-process source-level material layers 10' may be patterned such that an opening extends over a staircase region 200 in which contact via structures contacting word line electrically conductive layers may be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 10' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed within the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level conductive via structures to be subsequently formed.

Figure 2:
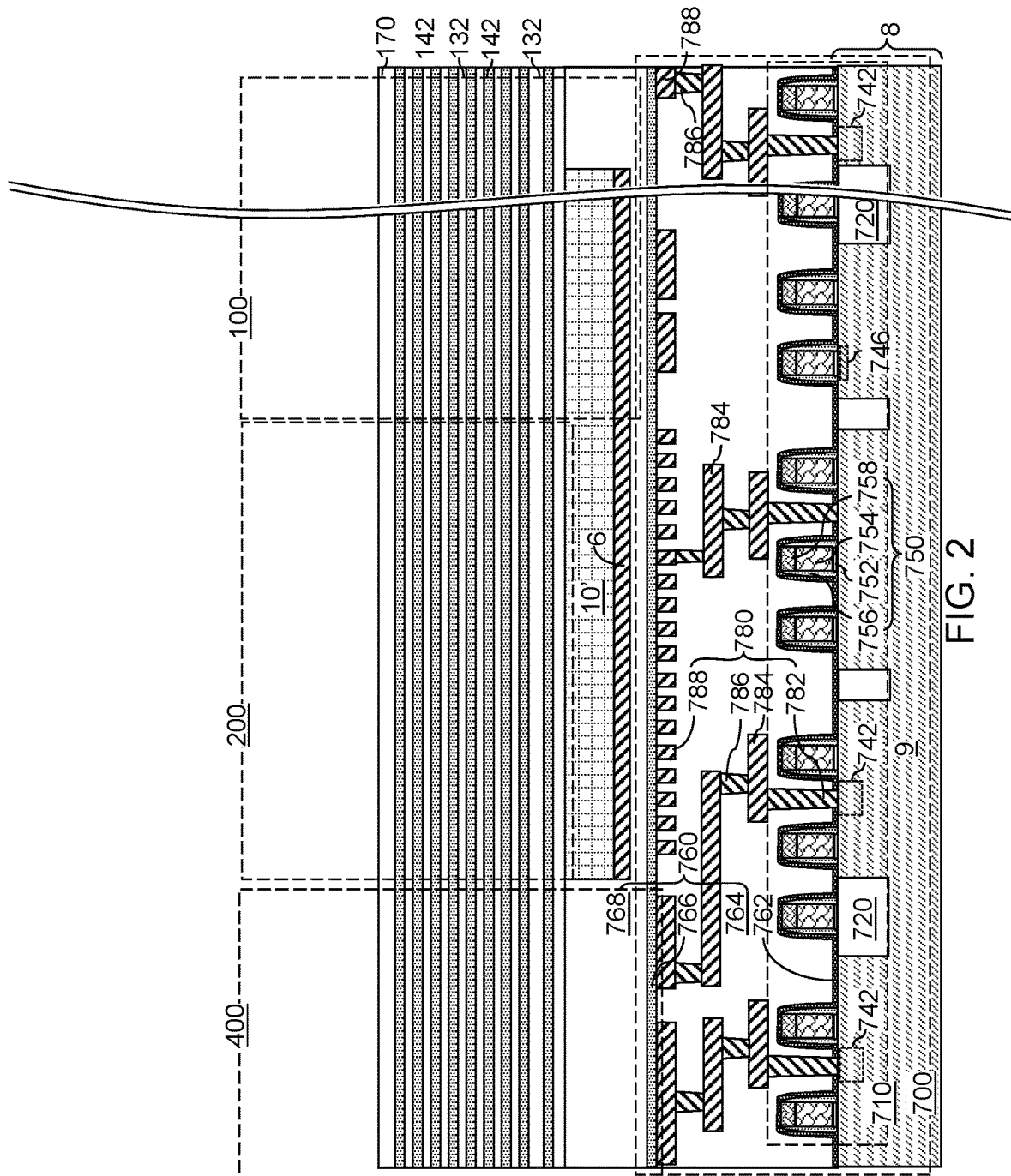
FIG. 2 is a vertical cross-sectional view of the exemplary structure after formation of a first-tier alternating stack of first insulting layers and first spacer material layers according to an embodiment of the present disclosure.

Referring to FIG. 2, an alternating stack of first material layers and second material layers may be subsequently formed. Each first material layer may include a first material, and each second material layer may include a second material that is different from the first material. In embodiments in which at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 10'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first-tier alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
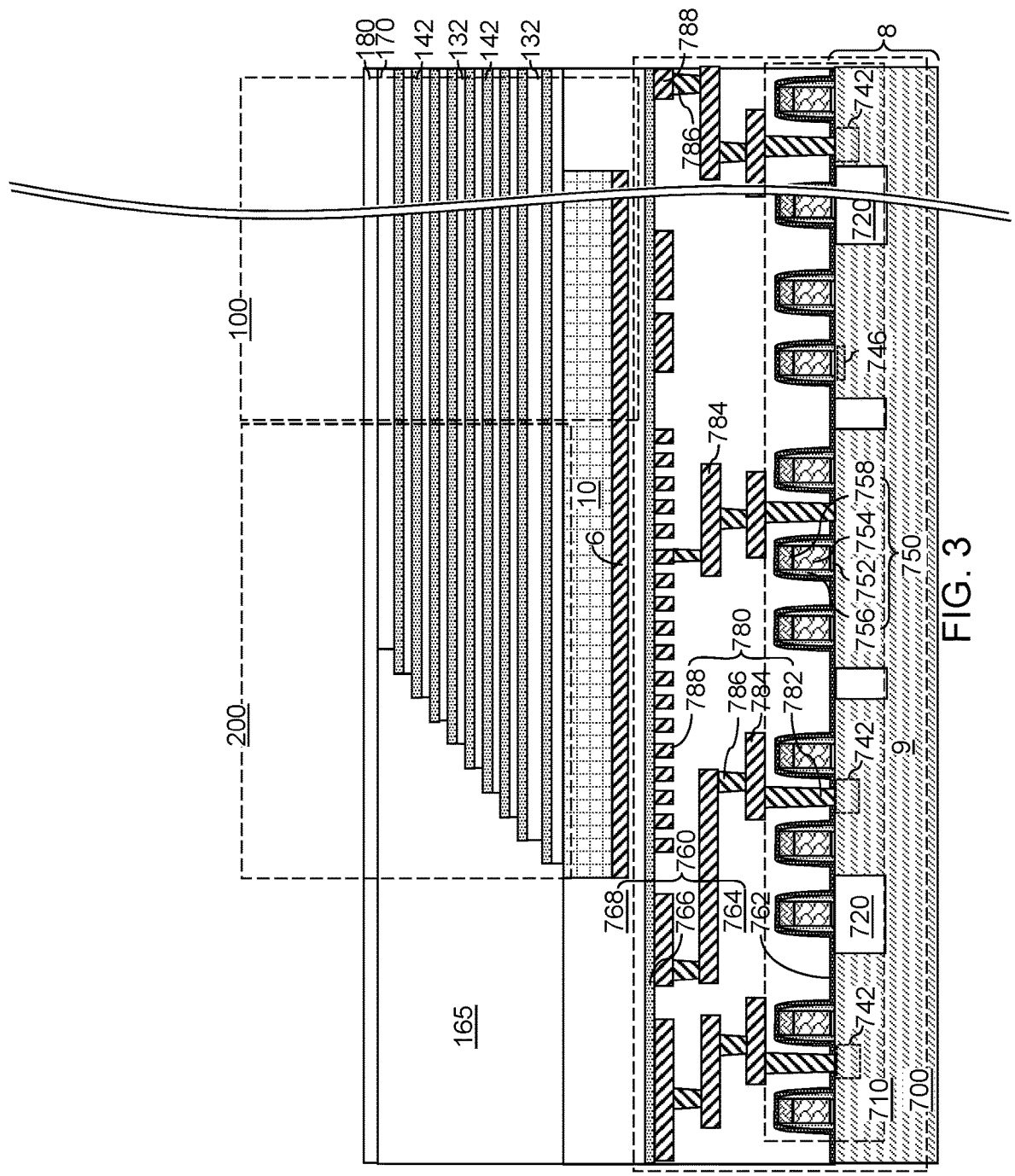
FIG. 3 is a vertical cross-sectional view of the exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
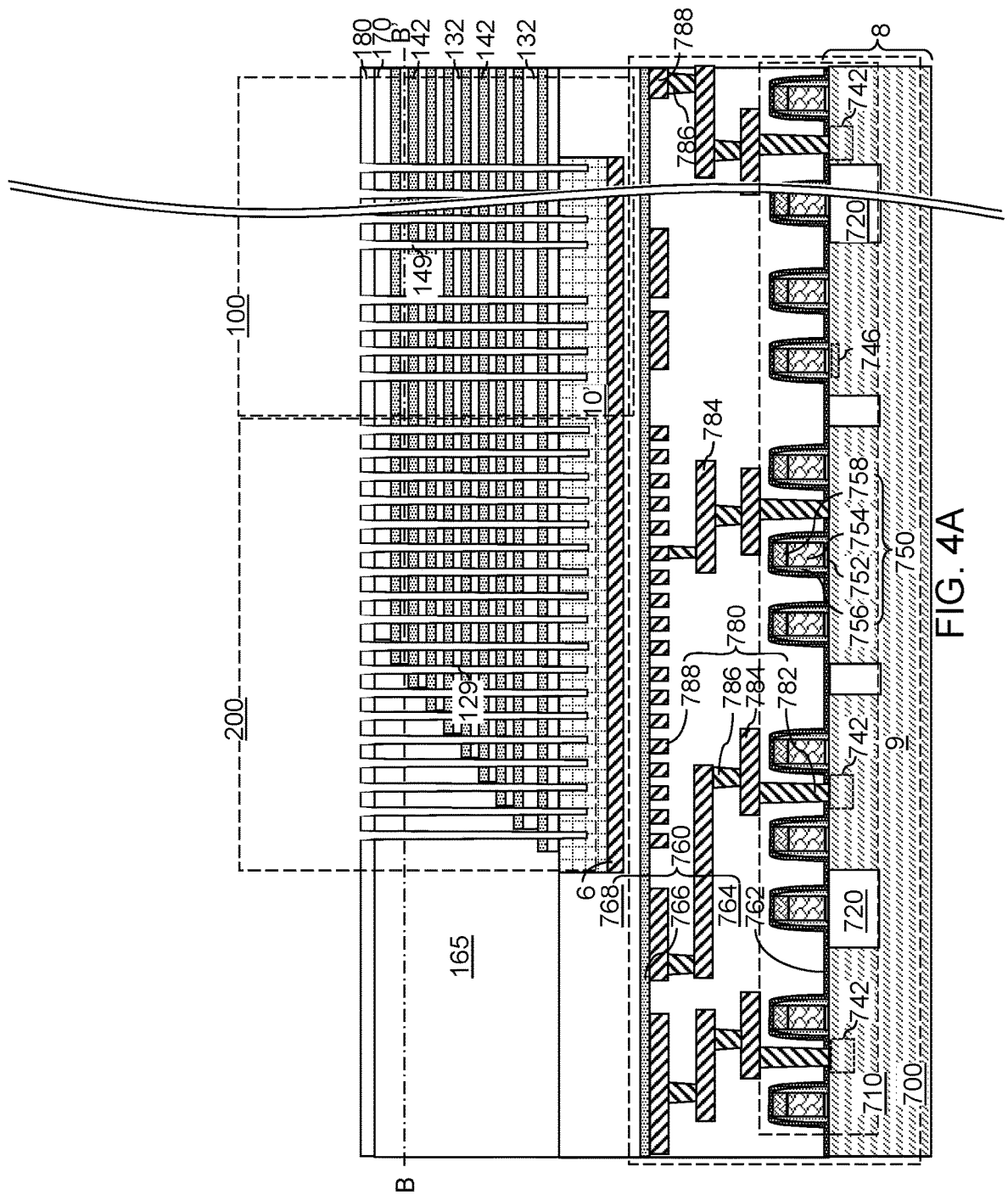
FIG. 4A is a vertical cross-sectional view of the exemplary structure after formation of first-tier memory openings and first-tier support openings according to an embodiment of the present disclosure.
Figure 4B:
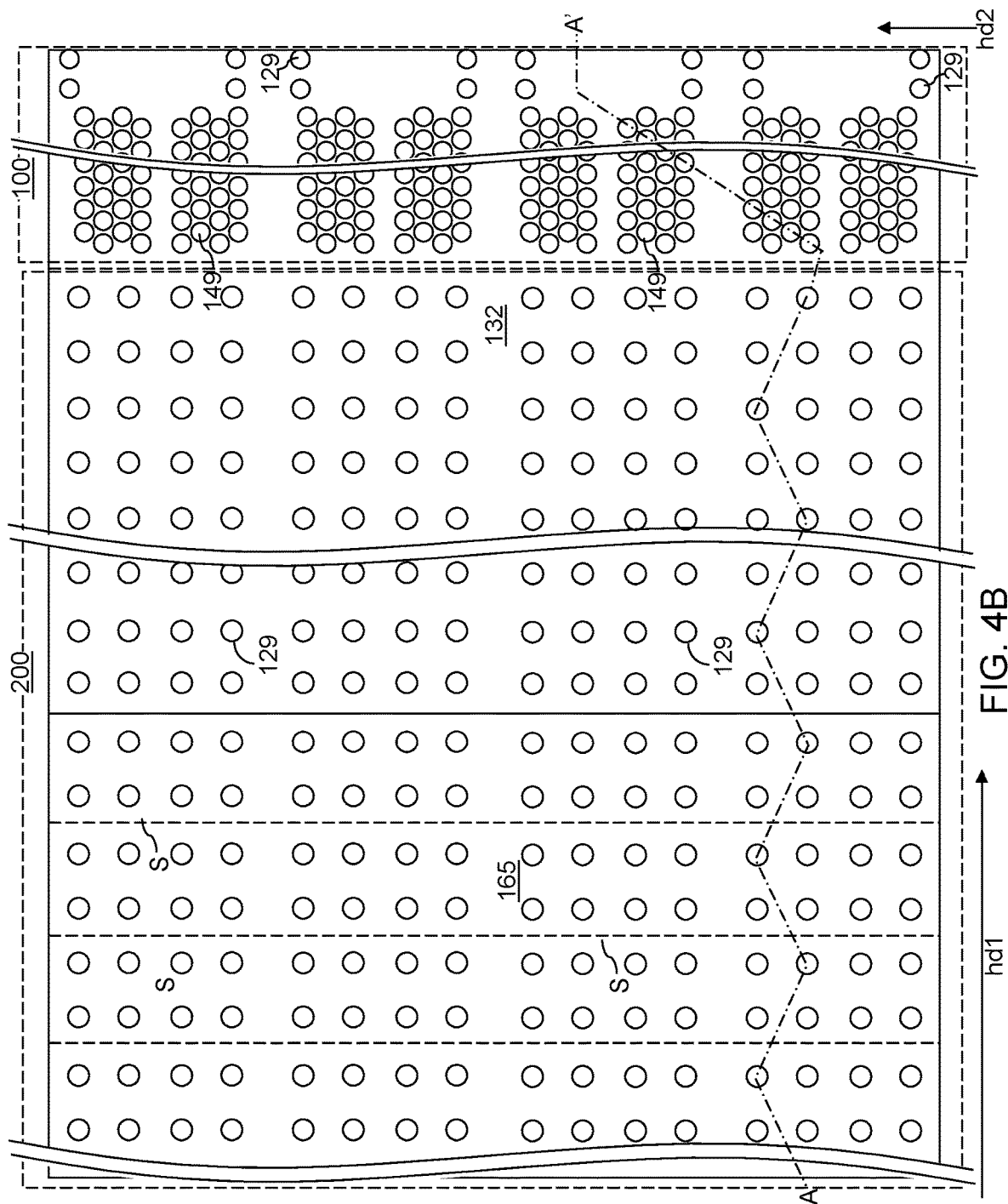
FIG. 4B is a horizontal cross-sectional view of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the in-process source-level material layers 10'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 10' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first-tier alternating stack (132, 142) are illustrated as dotted lines in FIG. 4B. The first-tier memory openings 149 may be openings that are formed in the memory array region 100 through each layer within the first-tier alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 may be openings that are formed in the staircase region 200 and are subsequently used to form staircase-region contact via structures that interconnect a respective pair of an underlying lower-level metal interconnect structure 780 (such as a landing-pad-level metal line structure 788) and an electrically conductive layer (which may be formed by replacement of a sacrificial material layer within the electrically conductive layer). A subset of the first-tier support openings 129 that is formed through the first retro-stepped dielectric material portion 165 may be formed through a respective horizontal surface of the first stepped surfaces. Further, each of the first-tier support openings 129 may be formed directly above (i.e., above, and with an areal overlap with) a respective one of the lower-level metal interconnect structure 780.

A subset of the first-tier support openings 129 may be formed in sections of the memory array region 100 that are not filled with the first-tier memory openings 149. The sections of the memory array region 100 that are not filled with the first-tier memory openings 149 may be distributed over multiple areas within the memory array region 100. Discrete areas free of first-tier memory openings 149 and first-tier support openings 129 are provided in the memory array region 100.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 10'. For example, the terminal portion of the anisotropic etch process may include a step that etches the dielectric material(s) of the at least one second dielectric layer 768 selective to a semiconductor material within a component layer in the in-process source-level material layers 10'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 10'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
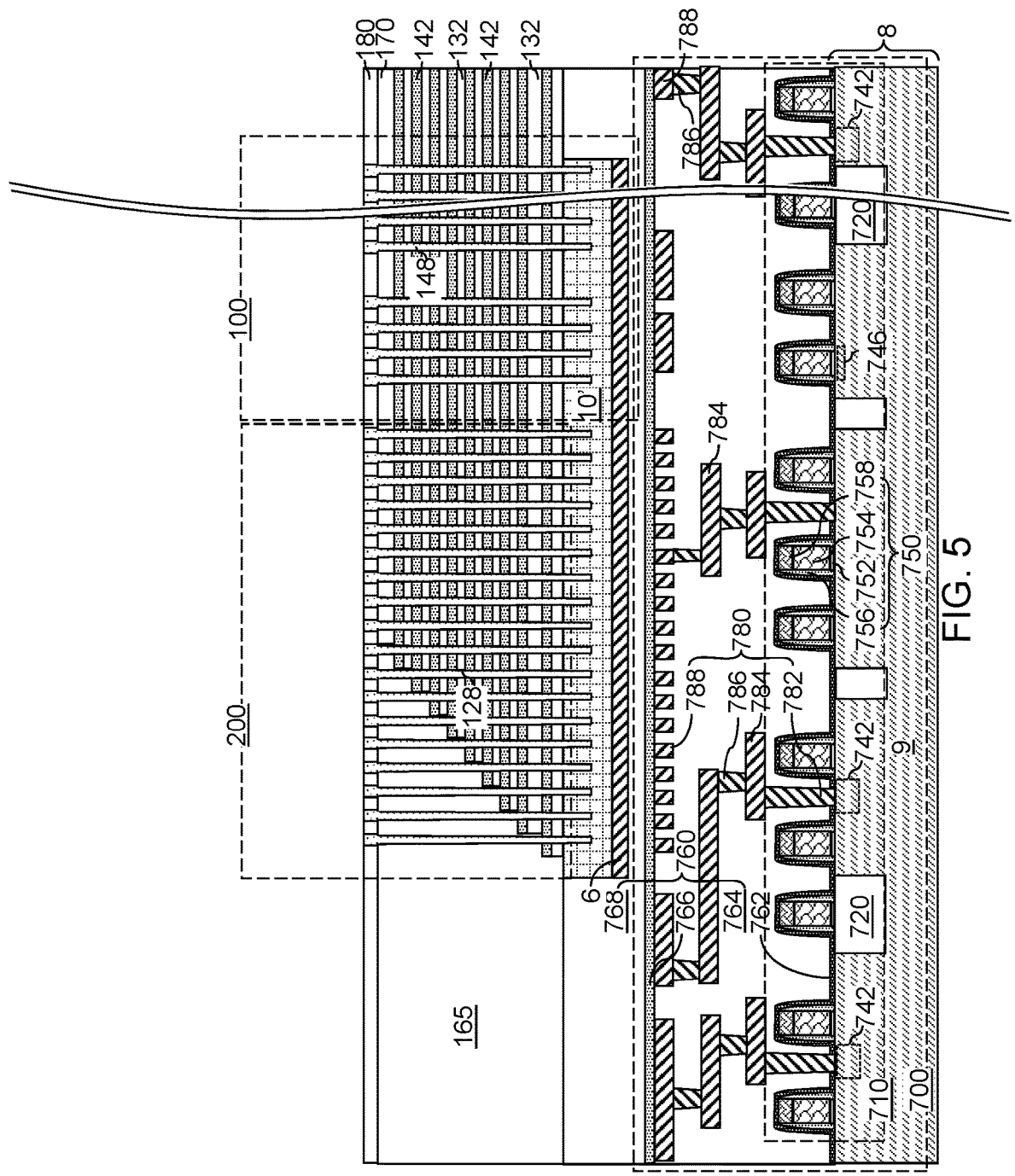
FIG. 5 is a vertical cross-sectional view of the exemplary structure after formation of various sacrificial fill structures according to an embodiment of the present disclosure.

Referring to FIG. 5, sacrificial first-tier opening fill portions (148, 128) may be formed in the various first-tier openings (149, 129). For example, a sacrificial first-tier fill material may be deposited concurrently in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first-tier alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material may comprise sacrificial first-tier opening fill portions (148, 128). Specifically, each remaining portion of the sacrificial material in a first-tier memory opening 149 may constitute a sacrificial first-tier memory opening fill portion 148. Each remaining portion of the sacrificial material in a first-tier support opening 129 may constitute a sacrificial first-tier support opening fill portion 128. The various sacrificial first-tier opening fill portions (148, 128) may be concurrently formed, i.e., during a same set of processes including the deposition process that deposits the sacrificial first-tier fill material and the planarization process that removes the first-tier deposition process from above the first-tier alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
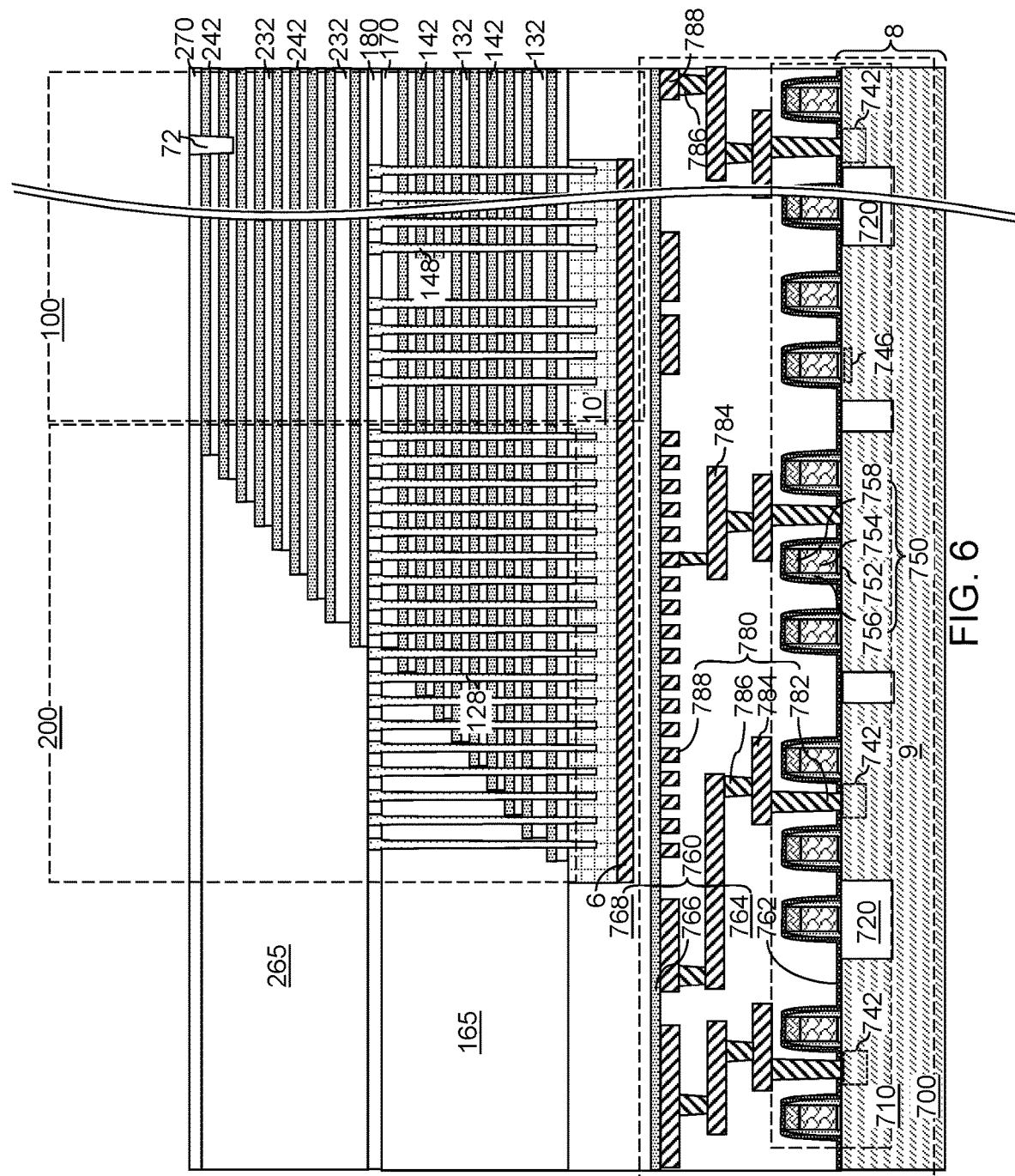
FIG. 6 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second-tier alternating stack (232, 242) of material layers may be subsequently formed on the top surface of the first-tier alternating stack (132, 142). The second-tier alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second-tier alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second-tier alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second-tier alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 10', and at least one dielectric material portion (such as the retro-stepped dielectric material portion (165, 265)) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers may be subsequently formed. The drain-select-level isolation structures 72 may include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second-tier alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 7A:
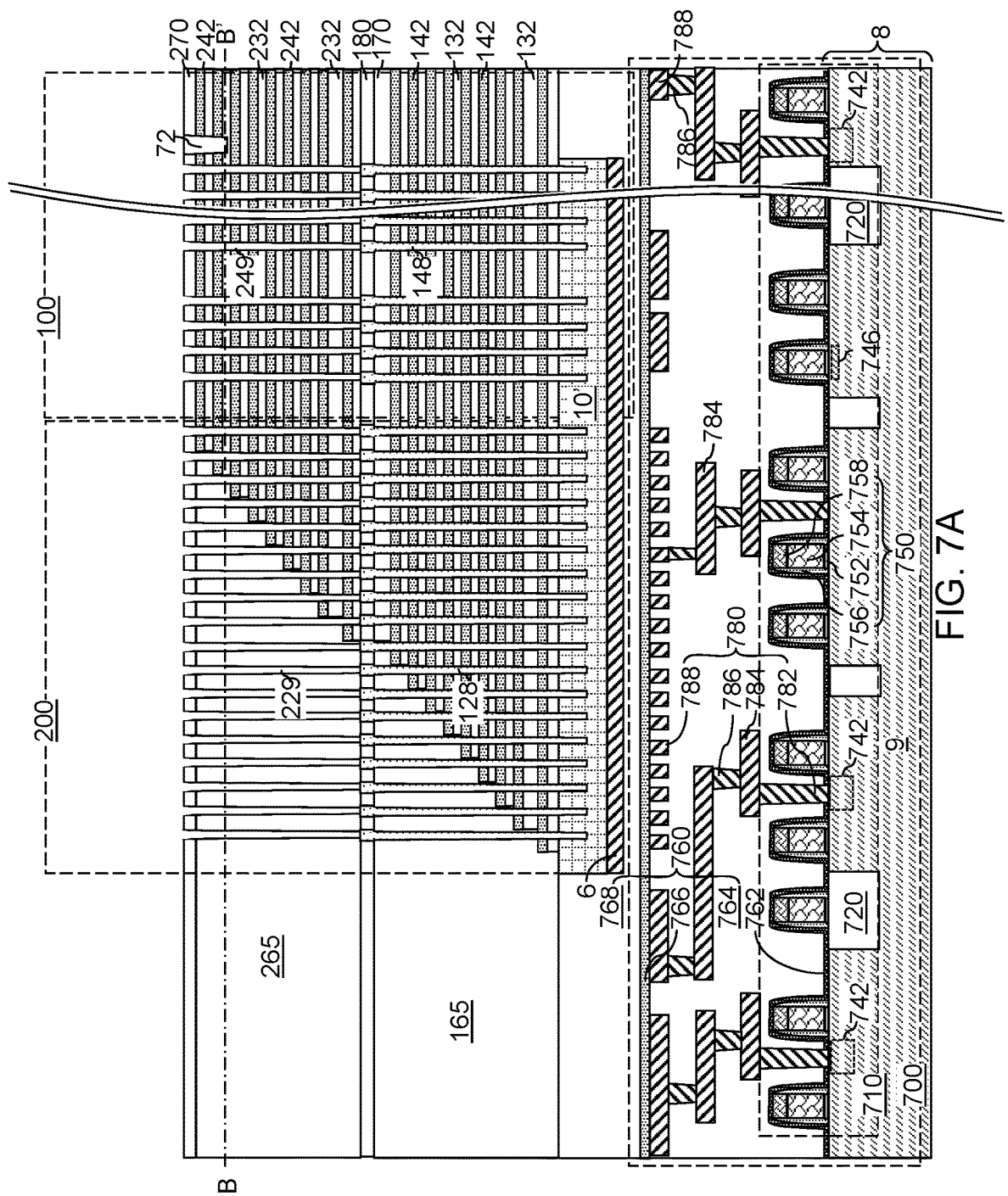
FIG. 7A is a vertical cross-sectional view of the exemplary structure after formation of second-tier memory openings and second-tier support openings according to an embodiment of the present disclosure.
Figure 7B:
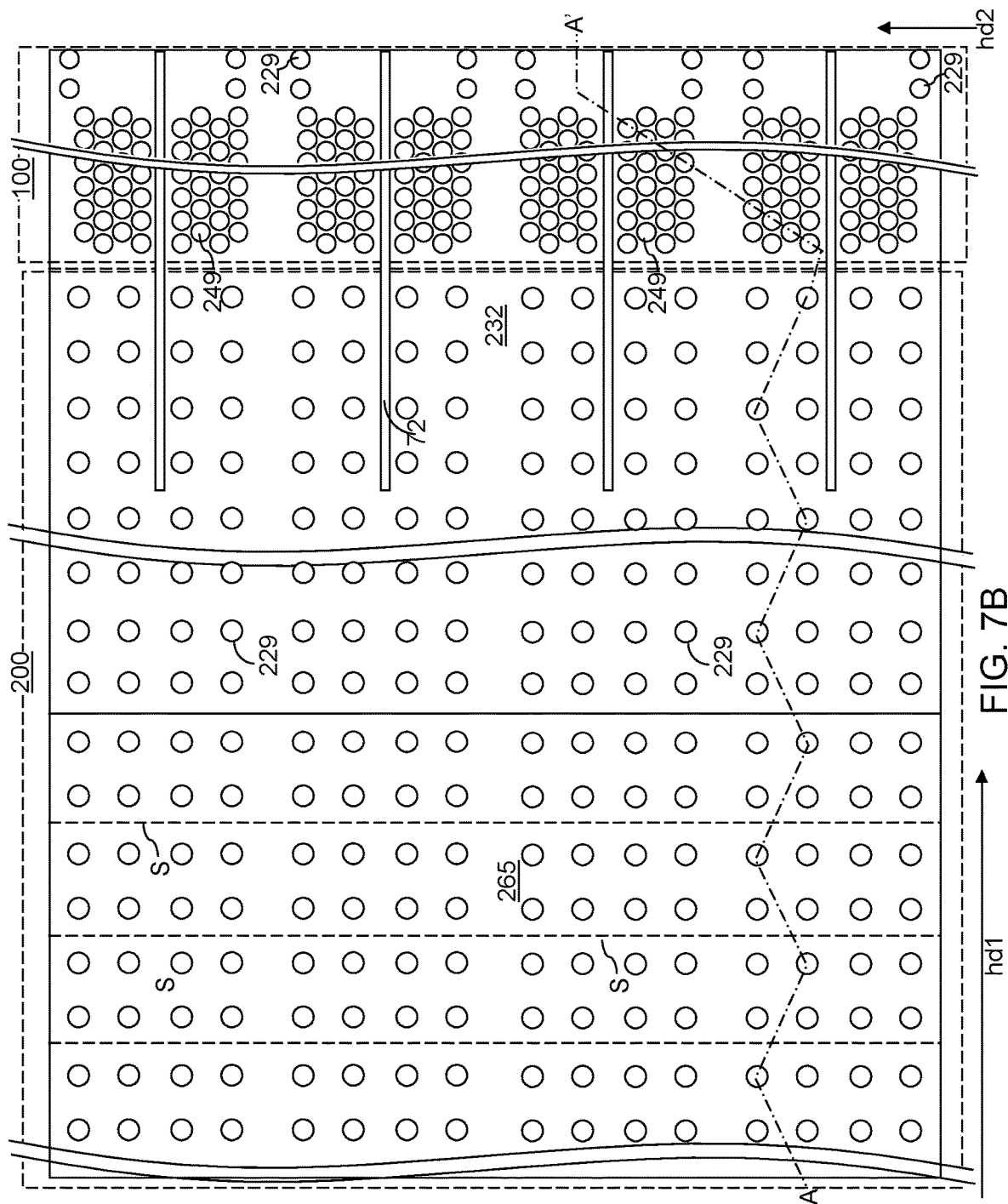
FIG. 7B is a horizontal cross-sectional of the exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 may be formed directly on a top surface of a respective one of the sacrificial first-tier memory opening fill portions 148. The second-tier support openings 229 may be formed directly on a top surface of a respective one of the sacrificial first-tier support opening fill portions 128. Further, each of the second-tier support openings 229 may be formed through a horizontal surface within the second stepped surfaces, which include the interfacial surfaces between the second-tier alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
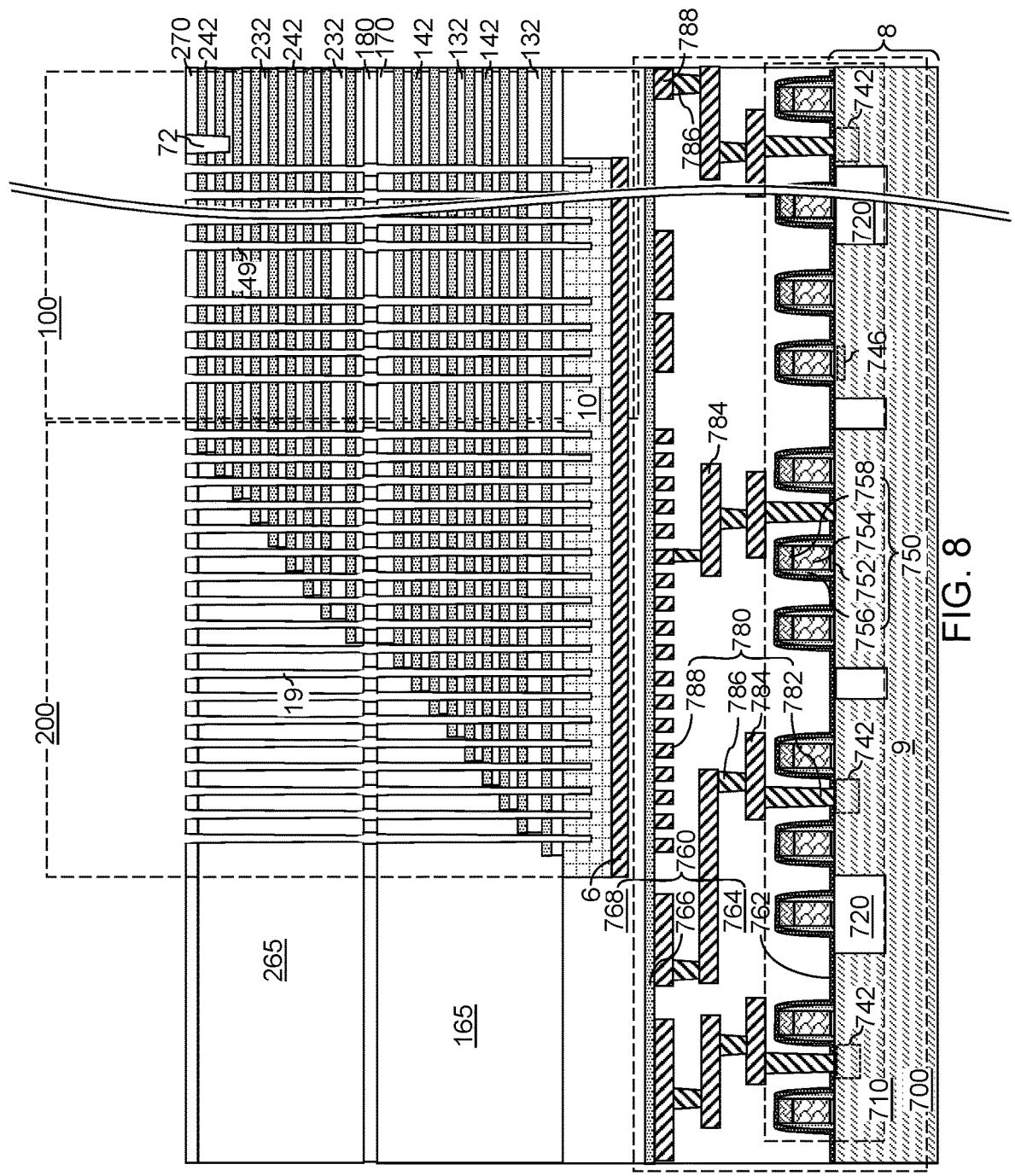
FIG. 8 is a vertical cross-sectional view of the exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, may be formed in each combination of a second-tier memory openings 249 and a volume from which a sacrificial first-tier memory opening fill portion 148 is removed. A support opening 19, which is also referred to as an inter-tier support opening 19, may be formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Figure 9B:
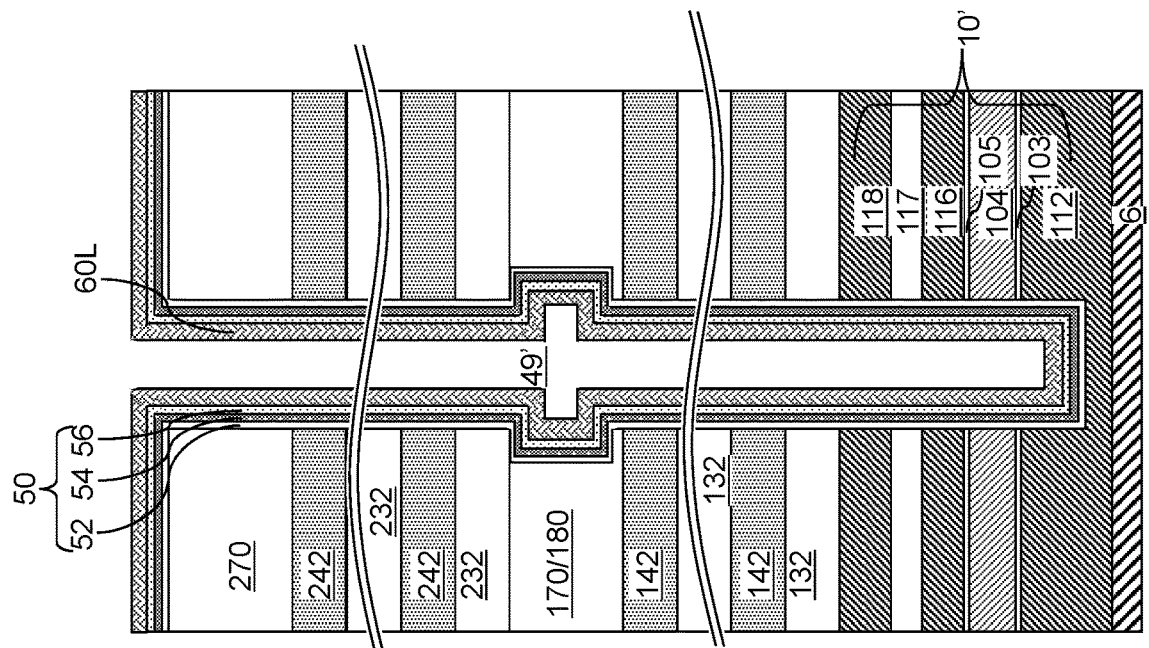
Figure 9A:
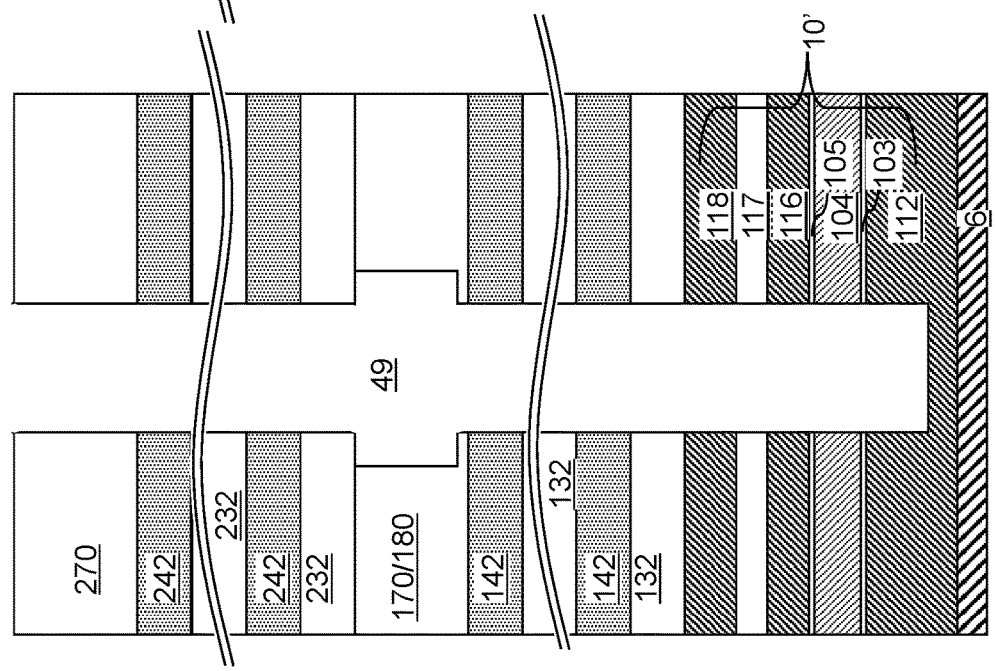

Referring to FIG. 9A, a memory opening 49 in the exemplary device structure of FIG. 8 is illustrated. The memory opening 49 extends through the first-tier structure and the second-tier structure.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively, or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L may include a doped semiconductor material such as at least one elemental semiconductor material, at least one III-V compound semiconductor material, at least one II-VI compound semiconductor material, at least one organic semiconductor material, or other semiconductor materials known in the art. The conductivity type of dopants in the semiconductor channel material layer 60L is herein referred to as a first conductivity type, which may be p-type or n-type. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material may be deposited in cavities overlying the dielectric cores 62. The doped semiconductor material has a doping of the opposite conductivity type of the doping of the semiconductor channel material layer 60L. In one embodiment, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material—constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 may be surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 is be present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 may constitute a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 may constitute a memory opening fill structure 58. Each drain region 63 in a memory opening fill structure 58 is electrically connected to an upper end of a respective one of the vertical semiconductor channels 60. The in-process source-level material layers 10', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10:
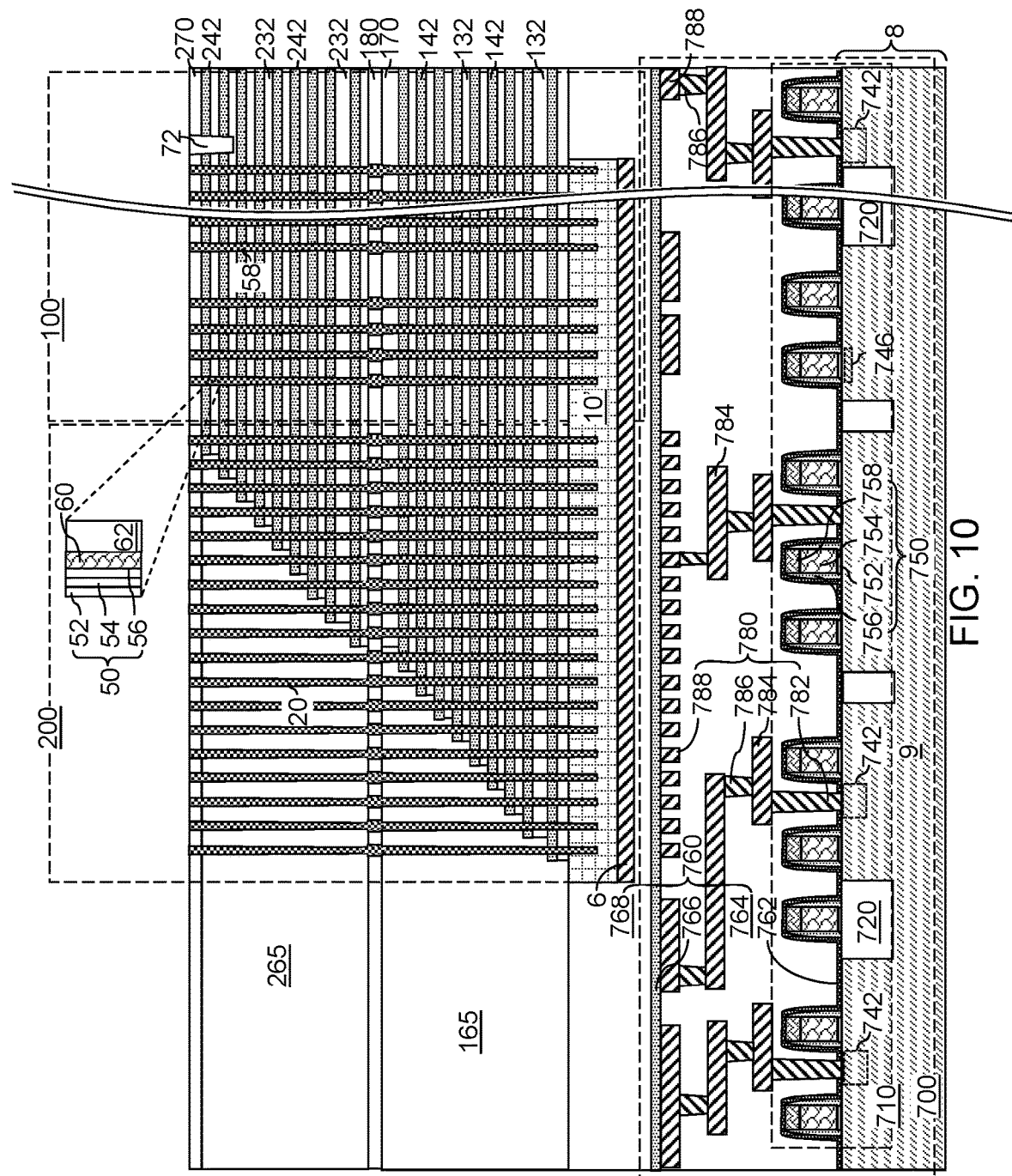
FIG. 10 is a vertical cross-sectional view of the exemplary structure after formation of memory opening fill structures and support pillar structures according to an embodiment of the present disclosure.
Figure 11A:
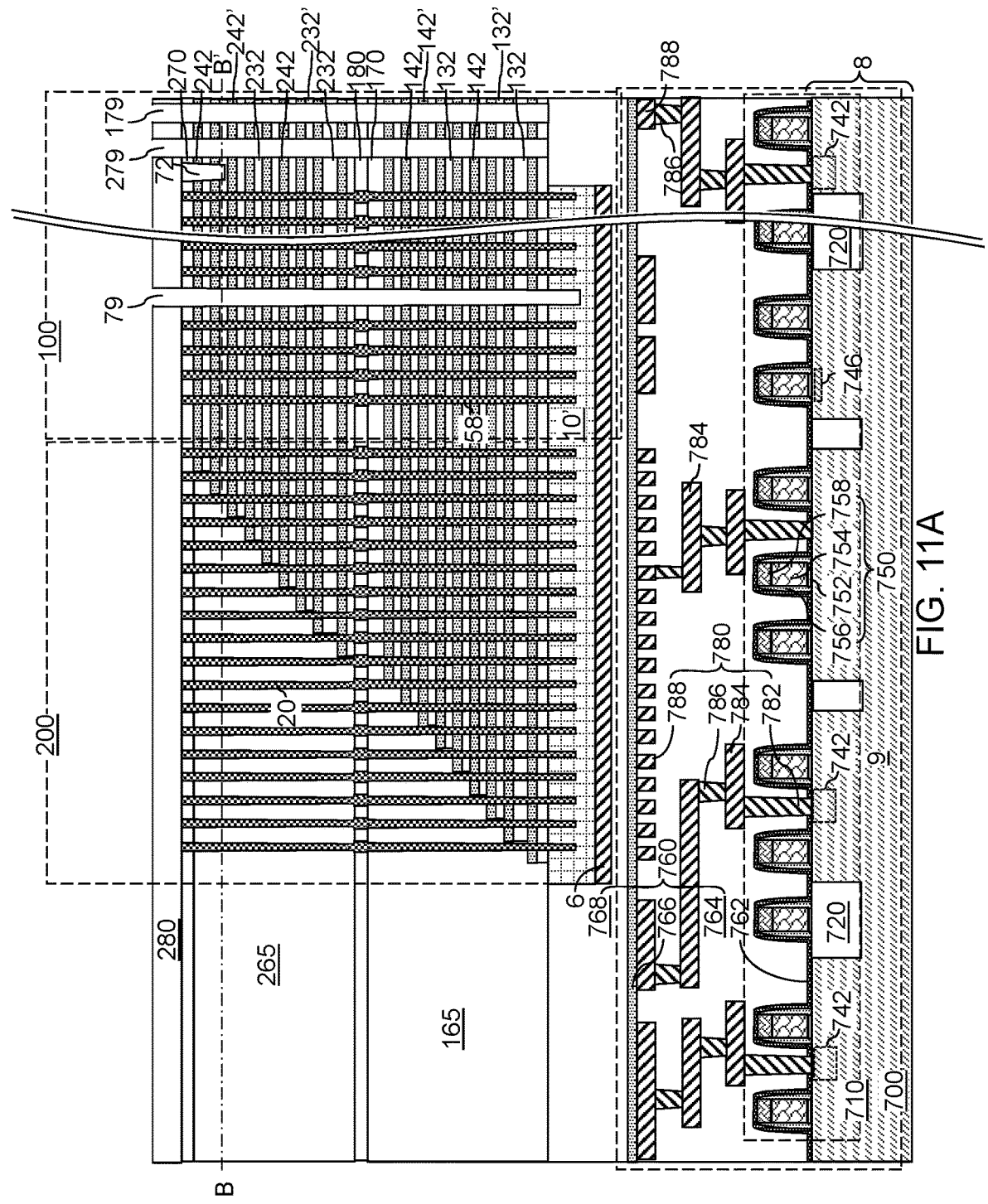
FIG. 11A is a vertical cross-sectional view of the exemplary structure after formation of backside trenches and sets of nested trenches according to an embodiment of the present disclosure.
Figure 11B:
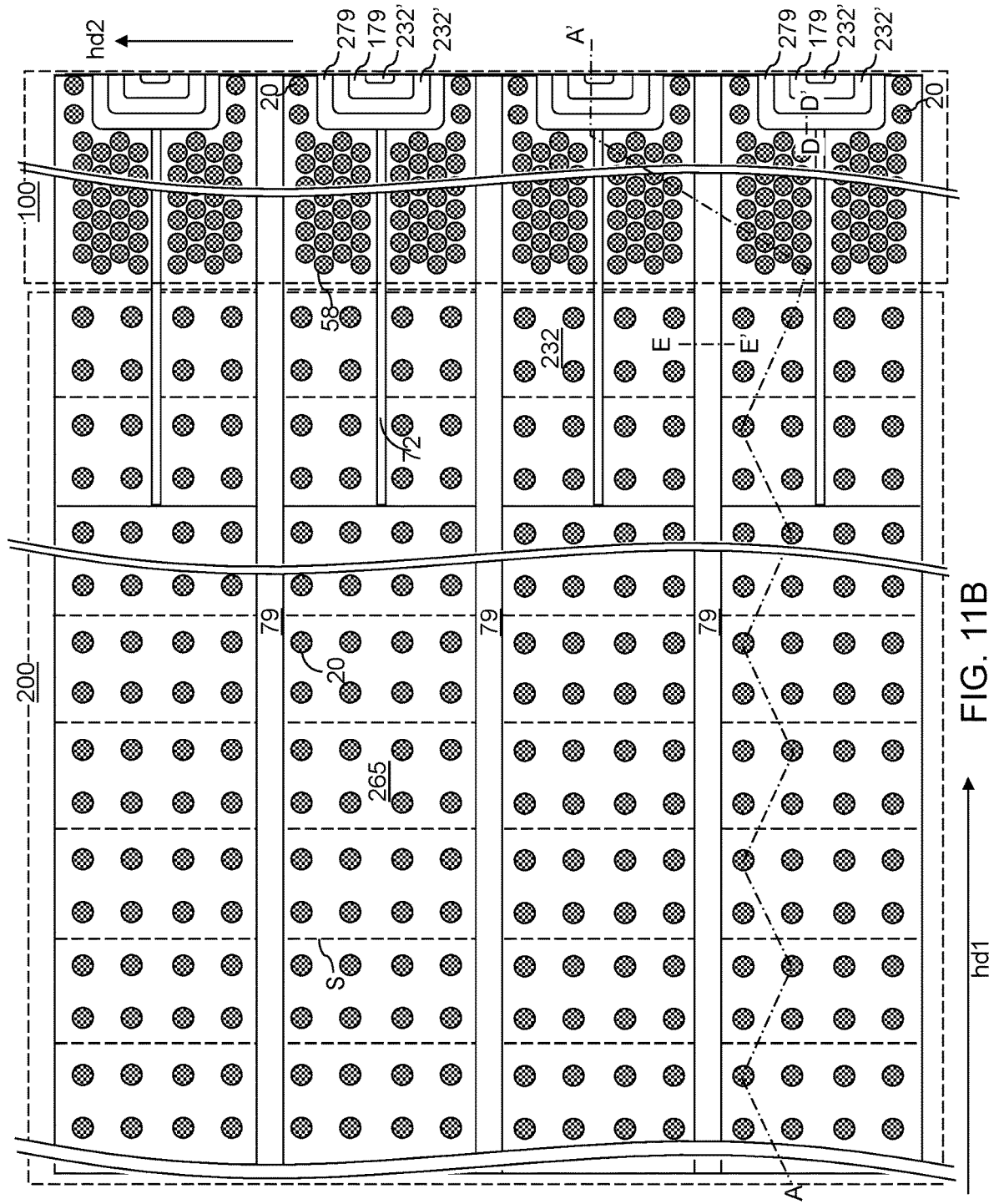
FIG. 11B is a horizontal cross-sectional of the exemplary structure along the horizontal plane B-B' of FIG. 11A. The hinged vertical plane A-A' corresponds to the plane of the vertical cross-sectional view of FIG. 11A.
Figure 11C:
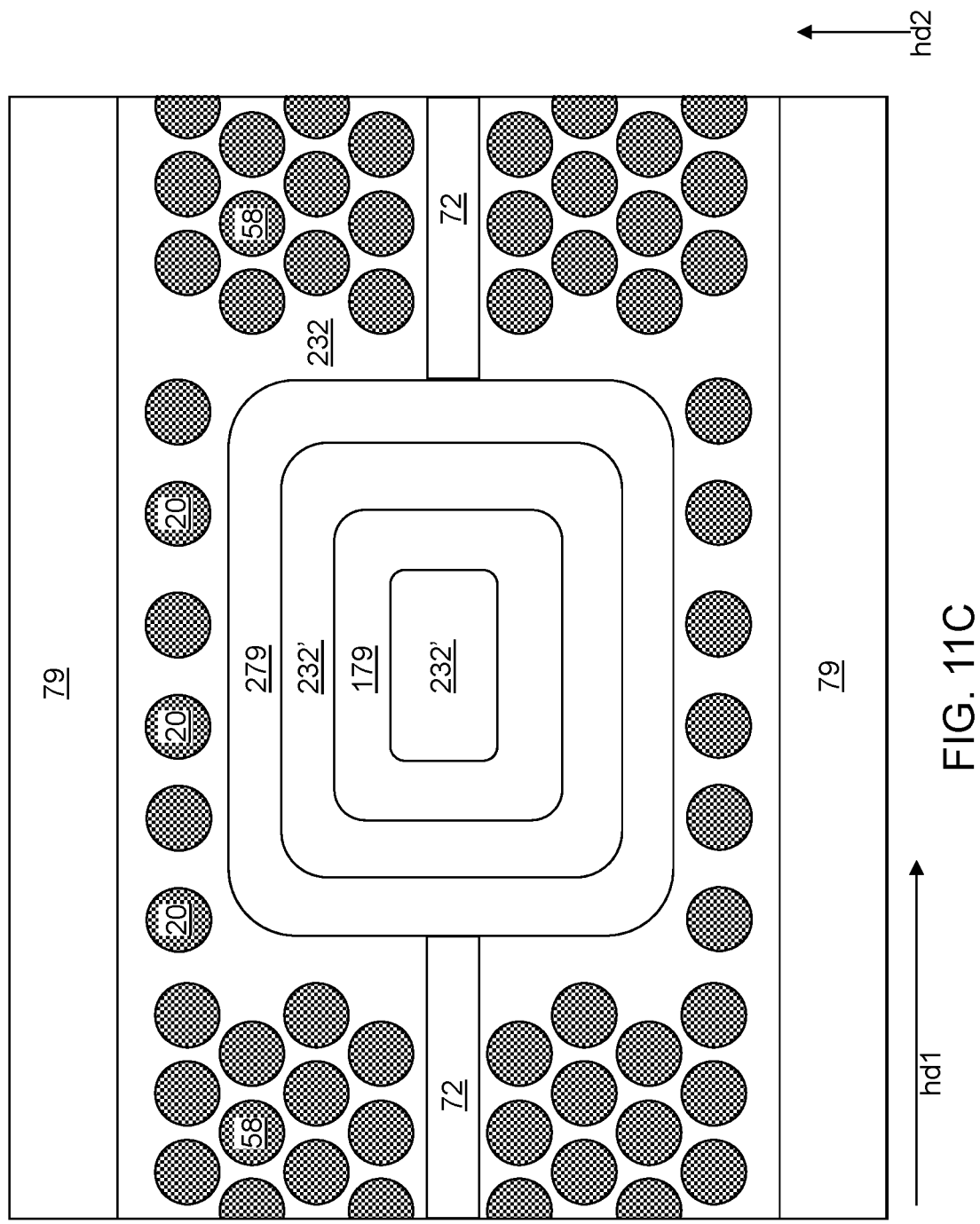
FIG. 11C is a magnified view of a region within the view of FIG. 11B that includes a pair of backside trenches, a moat trench, and contact openings.

Referring to FIG. 10, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58. Each of the alternating stacks {(132, 142), (232, 242)} comprises a terrace region (i.e., the staircase region 200) in which each sacrificial material layer (142, 242) other than a topmost sacrificial material layer (142, 242) within the alternating stack {(132, 142) and/or (232, 242)} laterally extends farther than any overlying sacrificial material layer (142, 242) within the alternating stack {(132, 142) and/or (232, 242)}. The terrace region includes stepped surfaces of the alternating stack that continuously extend from a bottommost layer within the alternating stack {(132,

142) or (232, 242)} to a topmost layer within the alternating stack {(132, 142) or (232, 242)}. Support pillar structures 20 extend through the stepped surfaces and through a retro-stepped dielectric material portion (165 or 265) that overlies the stepped surfaces.

Referring to FIGS. 11A-11E, a first contact level dielectric layer 280 may be formed over the second-tier structure (232, 242, 270, 265, 72). The first contact level dielectric layer 280 includes a dielectric material such as silicon oxide, and may be formed by a conformal or non-conformal deposition process. For example, the first contact level dielectric layer 280 may include undoped silicate glass and may have a thickness in a range from 100 nm to 600 nm, although lesser and greater thicknesses may also be used.

A photoresist layer (not shown) may be applied over the first contact level dielectric layer 280, and may be lithographically patterned to form various openings in the memory array region 100 and the staircase region 200. The openings in the photoresist layer may include elongated openings that laterally extend along the first horizontal direction hd1 across the memory array region 100 and the staircase region 200 between clusters of memory opening fill structures 58 and support pillar structures 20, and sets of nested openings located between neighboring pairs of elongated openings. As used herein, "nested openings" refer to openings that are laterally surrounded by, or laterally surrounding, each other opening. Each of the nested openings on the photoresist layer may be located within areas of the memory array region 100 that are free of the memory opening fill structures 58.

An anisotropic etch may be performed to transfer the pattern in the photoresist layer through underlying material portions including the alternating stacks {(132, 142), (232, 242)}, the retro-stepped dielectric material portions (165, 265), an upper portion of the in-process source-level material layers 10', and the at least one second dielectric layer 768. Backside trenches 79 may be formed underneath the elongated openings in the photoresist layer through the first contact level dielectric layer 280, the second-tier structure (232, 242, 270, 265, 72), and the first-tier structure (132, 142, 170, 165), and into the in-process source-level material layers 10'. Portions of the first contact level dielectric layer 280, the second-tier structure (232, 242, 270, 265, 72), the first-tier structure (132, 142, 170, 165), and the in-process source-level material layers 10' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79. A top surface of a source-level sacrificial layer 104 may be physically exposed at the bottom of each backside trench 79.

The anisotropic etch may form sets of nested trenches (179, 279) by transferring the pattern of the sets of nested openings in the photoresist layer to underlying material portions. As used herein, "nested trenches" refer to trenches that are laterally surrounded by, or laterally surrounding, each other trench. Thus, each trench within a set of nested trenches (179, 279) may be laterally surrounded by, or laterally surrounds, each other trench in the set of nested trenches. The sets of nested trenches (179, 279) extend through the first contact level dielectric layer 280, the second-tier structure (232, 242, 270, 265, 72), and the first-tier structure (132, 142, 170, 165) and into upper regions of at least one second dielectric layer 768 located within openings in the in-process source-level material layers 10'.

Each set of nested trenches (179, 279) includes an outer trench 279 and at least one inner trench 179 that is laterally surrounded at least by the outer trench 279. Each outer trench 279 may be a moat trench, i.e., a trench having a horizontal cross-sectional shape of a moat (i.e., a laterally enclosing band-shaped area that encircles an enclosed area therein). The at least one inner trench 179 of each set of nested trenches (179, 279) may include a single inner trench 179 or a plurality of inner trenches 179. In embodiments in which the at least one inner trench 179 of each set of nested trenches (179, 279) includes a plurality of inner trenches 179, at least one of the inner trenches 179 may be a moat trench. Every inner trench 179 within each set of nested trenches (179, 279) may be a moat trench, or one inner trench 179 within each set of nested trenches (179, 279) may include a cylindrical trench having a horizontal cross-sectional shape of a two-dimensional shape without an opening therethrough. In one embodiment, each set of nested trenches (179, 279) may cut through at least drain-select-level isolation structure 72 located between a neighboring pair of backside trenches 79. A sidewall of at least one drain-select-level isolation structure 72 may be physically exposed on an outer sidewall of an outer trench 279.

Each remaining portion of the first insulating layers 132 inside an outer trench 279 is herein referred to as a first insulating plate 132', and each remaining portion of the second insulating layers 232 inside an outer trench 279 is herein referred to as a second insulating plate 232'. Each remaining portion of the first sacrificial material layers 142 within inside an outer trench 279 is herein referred to as a first sacrificial material plate 142', and each remaining portion of the second sacrificial material layers 242 within inside an outer trench 279 is herein referred to as a second sacrificial material plate 242'. At least one vertically alternating sequence of insulating plates (132' and/or 232') and sacrificial material plates (142' and/or 242') is formed within each outer trench 279. Each vertically alternating sequence of insulating plates (132', 232') and sacrificial material plates (142', 242') includes a set of remaining material portions of the first contact level dielectric layer 280, the second-tier structure (232, 242, 270, 265, 72), and the first-tier structure (132, 142, 170, 165).

Each of the insulating plates (132', 232') may be located at a same vertical distance as a respective one of the insulating layers (132, 232) in the alternating stack {(132, 142) and/or (232, 242)} from a top surface of the substrate 8. In one embodiment, the insulating plates (132', 232') and the insulating layers (132, 232) have a same material composition. In one embodiment, the sacrificial material plates (142', 242') comprise silicon nitride, and the insulating plates (132', 232') comprise silicon oxide such as an undoped silicate glass or a doped silicate glass. A drain-select-level isolation structure 72 may be formed within an upper region of the second-tier alternating stack (232, 242), and may vertically extend through, and laterally divide, at least a topmost one of the second sacrificial material layers 242. A sidewall of the drain-select-level isolation structure 72 may be physically exposed to an outer trench 279.

Generally, the backside trenches 79 and sets of nested trenches (179, 279) may be simultaneously formed through the alternating stack {(132, 142), (232, 242)} around the memory stack structures 55. Each trench within the set of nested trenches (179, 279) may be spaced from any other trench within the set of nested trenches (179, 279) by at least one patterned remaining portion of the alternating stack {(132, 142), (232, 242)} having a respective shape of an enclosing wall. As used herein, an "enclosing wall" refers to a vertically extending structure that encircles, and encloses, a volume therein. As such, each "enclosing wall" has a horizontal cross-sectional shape that is topologically homeomorphic to an annulus and is invariant, or changes only gradually, under translation along a vertical direction. The backside trenches 79 may laterally extends along the first horizontal direction hd1, and may be laterally spaced from each other along the second horizontal direction hd2.

In one embodiment, each set of nested trenches (179, 279) may be formed between a respective neighboring pair of backside trenches 79. As used herein, a "neighboring pair" of elements refers to two elements within any intervening element within a volume between the two elements. In one embodiment, each set of nested trenches (179, 279) may be formed within an area of an opening through the in-process source-level material layers 10'.

In one embodiment, each of backside trenches 79 and each nested trench within the sets of nested trenches (179, 279) may be formed with sidewalls having a bowing profile that provides a width at a height between a topmost layer of the alternating stack {(132, 146), (232, 246)} and a bottommost layer of the alternating stack {(132, 146), (232, 246)} that is greater than a width at a height of the topmost layer of the alternating stack {(132, 146), (232, 246)}, and is greater than a width at a height of the bottommost layer of the alternating stack {(132, 146), (232, 246)}. The bowing profile of the each of backside trenches 79 and each nested trench within the sets of nested trenches (179, 279) is due to the chemistry of the anisotropic etch process that causes gradual widening of regions that are not masked by the patterned photoresist layer. Portions of the alternating stack {(132, 146), (232, 246)} that are proximal to the patterned photoresist layer are masked by the photoresist layer. Portions of the alternating stack {(132, 146), (232, 246)} that are proximal to the bottommost layer of the alternating stack {(132, 146), (232, 246)} are exposed to etch gases only during the terminal portion of the anisotropic etch process. Middle portions of the alternating stack {(132, 146), (232, 246)} are not sufficiently masked by the patterned photoresist layer and may be exposed to the etch gases for a significant duration of time, thereby developing the bowing profiles illustrated in FIGS. 11A and 11B. The ratio of the maximum width of each backside trench 79 to the width of the backside trench 79 at a topmost portion (i.e., at the interface between the first contact-level dielectric material layer 280 and the photoresist layer) may be in a range from 1.05 to 2.0, although lesser and greater ratios may also be used. The patterned photoresist layer may be subsequently removed, for example, by ashing.

Figure 12A:
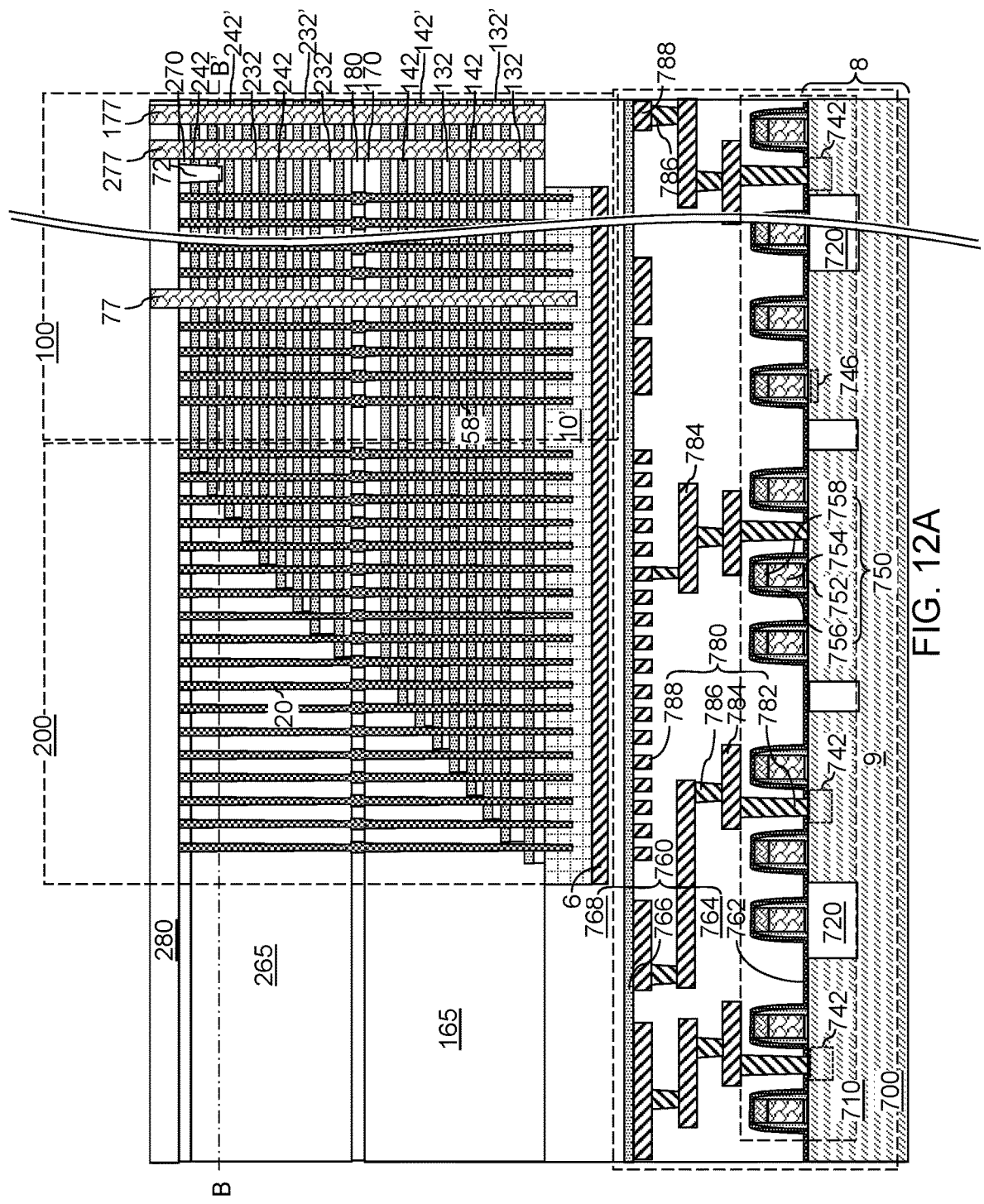
FIG. 12A is a vertical cross-sectional view of the exemplary structure after formation of sacrificial backside trench fill material structures and sacrificial nested trench fill structures according to an embodiment of the present disclosure.
Figure 12B:
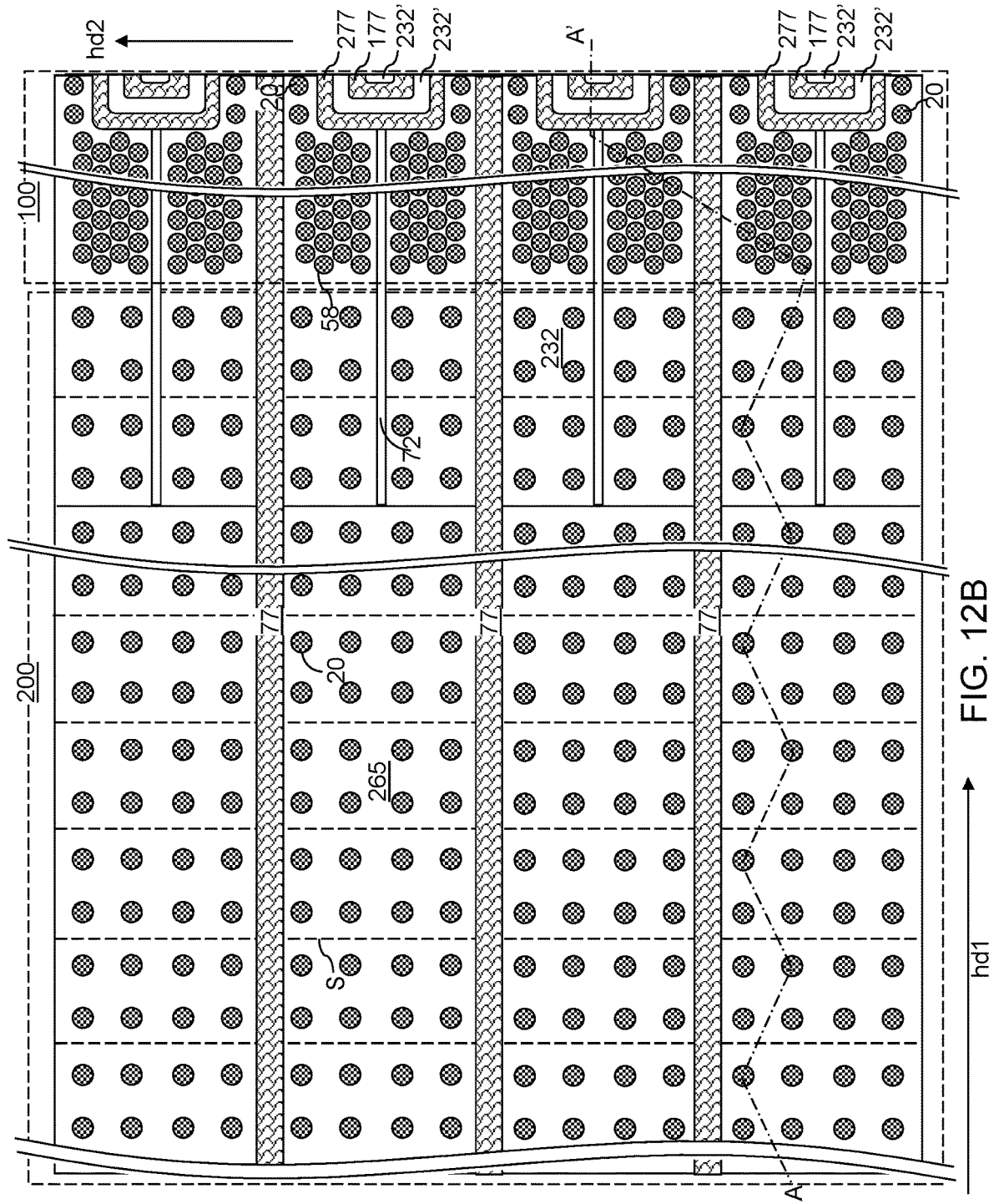
FIG. 12B is a horizontal cross-sectional view of the exemplary structure along the horizontal plane B-B' of FIG. 12A. The hinged vertical plane A-A' corresponds to the plane of the vertical cross-sectional view of FIG. 12A.
Figure 12C:
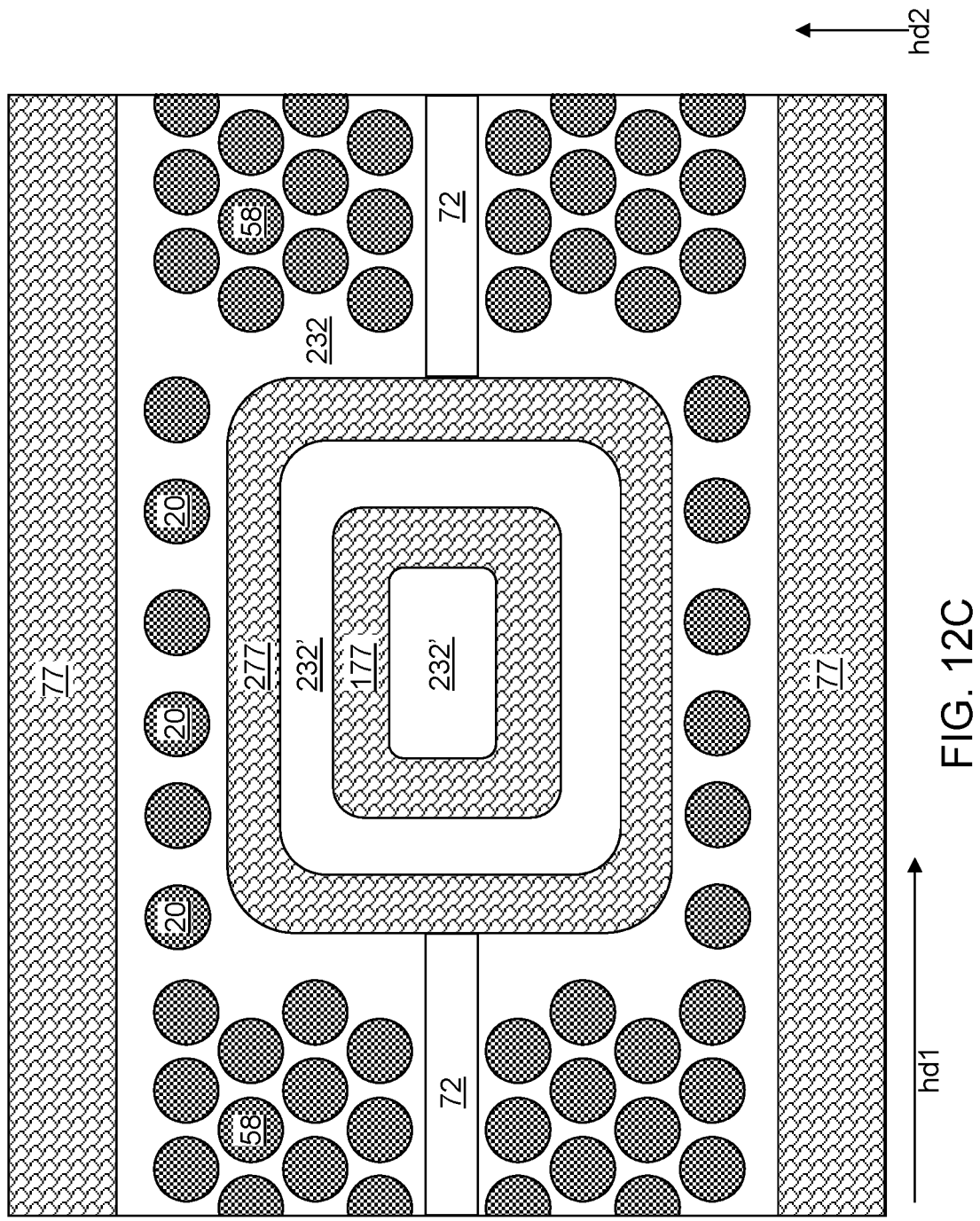
FIG. 12C is a magnified view of a region of the horizontal cross-sectional view of FIG. 12B.

Referring to FIGS. 12A-12C, a sacrificial fill material may be deposited in the backside trenches 79 and the sets of nested trenches (179, 279). The sacrificial fill material includes a material that may be removed selective to the materials of the insulating layers (132, 232), the sacrificial material layers (142, 242), and the first contact level dielectric layer 280. For example, the sacrificial fill material may include amorphous silicon, a silicon-germanium alloy, amorphous carbon, porous or non-porous organosilicate glass, or an organic or non-organic polymer material. In one embodiment, the sacrificial fill material may include amorphous silicon. Excess portions of the sacrificial fill material may be removed from above the horizontal plane including the top surface of the first contact level dielectric layer 280.

Each remaining portion of the sacrificial fill material that fills a backside trench 79 is herein referred to as a sacrificial backside trench fill material structure 77. Each remaining portion of the sacrificial fill material that fills an outer trench 279 is herein referred to as a sacrificial outer trench fill structure 277. Each remaining portion of the sacrificial fill material that fills an inner trench 179 is herein referred to as a sacrificial inner trench fill structure 177. Sets of sacrificial nested trench fill structures (177, 277) may be formed between a respective neighboring pair of sacrificial backside trench fill material structures 77. Each set of sacrificial nested trench fill structures (177, 277) includes a sacrificial outer trench fill structure 277 and at least one sacrificial inner trench fill structure 177. Support pillar structures 20 may be present between a set of sacrificial nested trench fill structures (177, 277) and a neighboring one of the sacrificial backside trench fill material structures 77.

Each set of sacrificial nested trench fill structures (177, 277) may be formed within the volume of a respective set of nested trenches (179, 279) concurrently with formation of sacrificial backside trench fill material structures 77. The sacrificial outer trench fill structures 277, the sacrificial inner trench fill structures 177, and the sacrificial backside trench fill material structures 77 may include a same sacrificial fill material. In one embodiment, the sacrificial material layers (142, 242) comprise silicon nitride, and the sets of sacrificial nested trench fill structures (177, 277) comprise a semiconductor material or a carbon-based material.

Figure 13A:
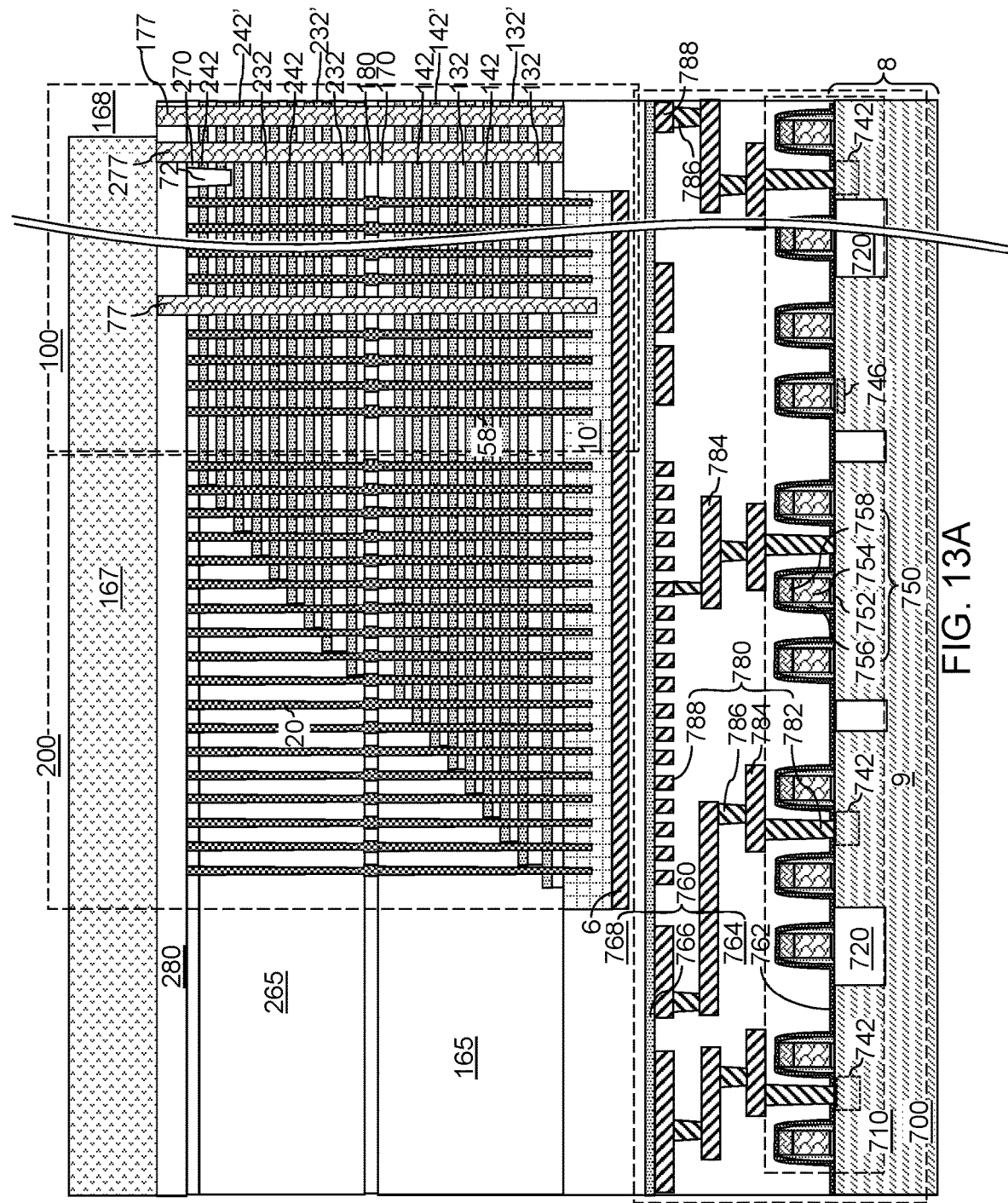
FIG. 13A is a vertical cross-sectional view of the exemplary structure after application and patterning of a photoresist layer to form openings that overlie inner nested trench fill structures according to an embodiment of the present disclosure.
Figure 13B:
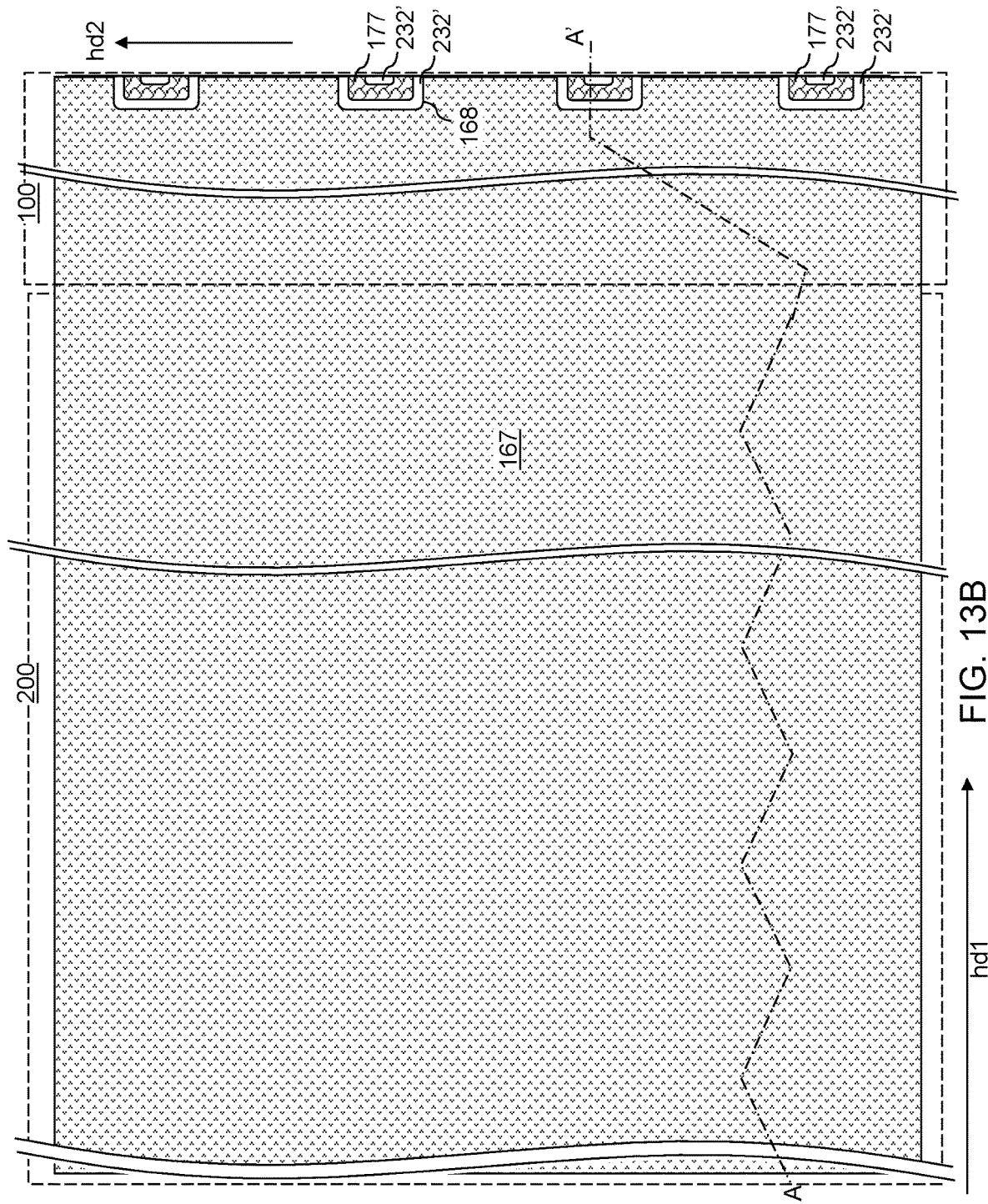
FIG. 13B is a top-down view of the exemplary structure of FIG. 13A.
Figure 13C:
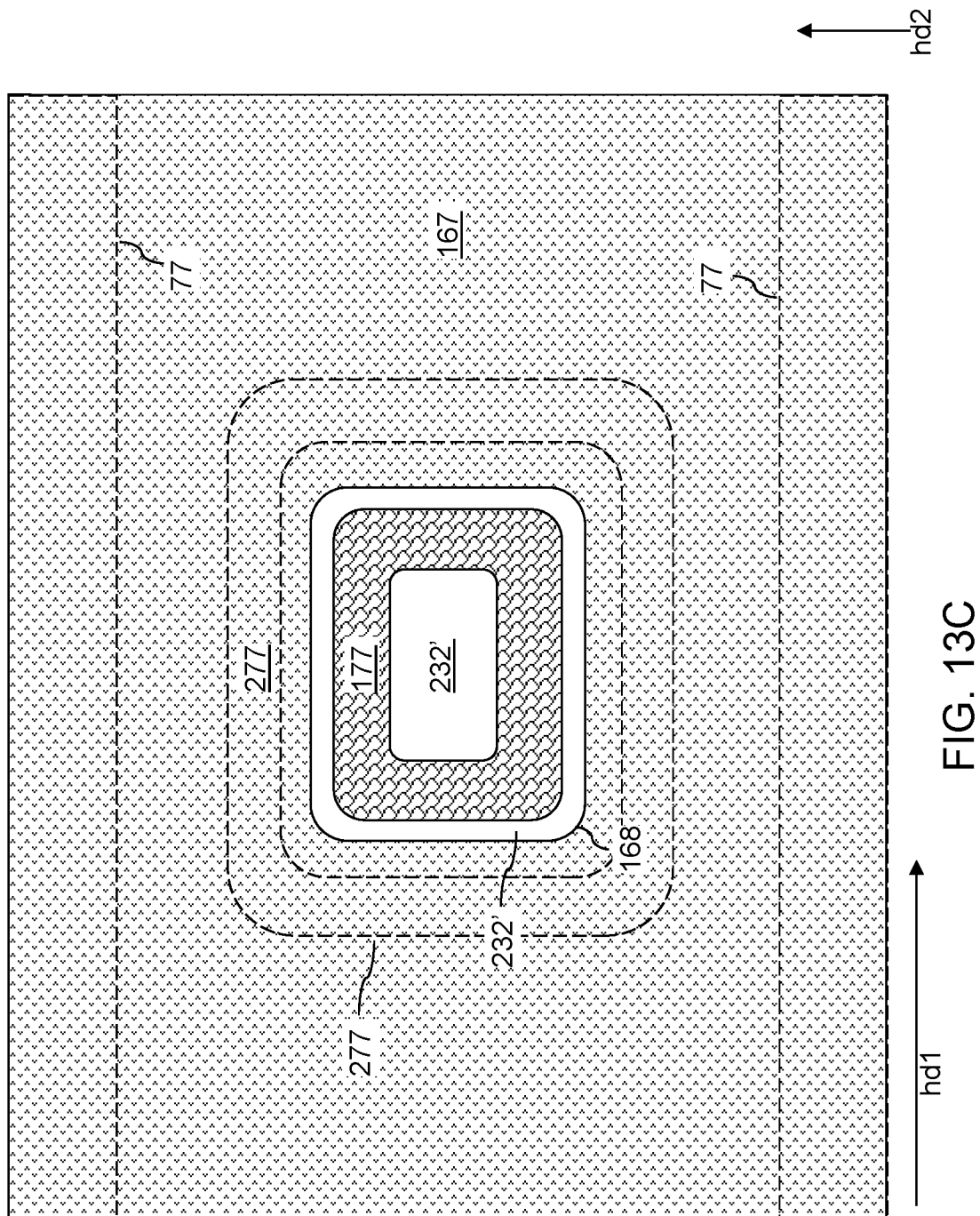
FIG. 13C is a magnified top-down view of a region including a set of nested trench fill structures in the exemplary structure of FIGS. 13A and 13B.

Referring to FIGS. 13A-13C, a patterned etch mask layer 167 may be formed over the first contact level dielectric layer 280. The patterned etch mask layer 167 may be an insulating material layer or a photoresist material layer that is lithographically patterned to form openings 168. For example, the patterned etch mask layer 167 may be hard mask, such as an aluminum oxide layer or silicon oxide layer that is lithographically patterned using an overlying photoresist layer (not shown for clarity). The pattern of the openings 168 may be selected such the entire periphery of each opening 168 overlies a respective one of the vertically alternating sequences of insulating plates (132', 232') and sacrificial material plates (142', 242'). In one embodiment, the entire periphery of each opening in the patterned etch mask layer 167 may be located between an outer periphery of a patterned remaining portion of the first contact-level dielectric material layer 280 contacting an inner sidewall of a respective sacrificial outer trench fill structure 277. The entire top surface of each sacrificial inner trench fill structure 177 may be physically exposed under the openings in the patterned etch mask layer 167. The patterned etch mask layer 167 covers the entire areas of the sacrificial outer trench fill structures 277 and the sacrificial backside trench fill material structures 77.

Thus, a sacrificial inner trench fill structure 177 of each set of sacrificial nested trench fill structures (177, 277) is physically exposed under the openings 168 in the patterned etch mask layer 167. A sacrificial outer trench fill structure 277 of each set of sacrificial nested trench fill structures (177, 277) (which laterally surrounds the at least one sacrificial inner trench fill structure 177 of the set of sacrificial nested trench fill structures (177, 277) is covered by the patterned etch mask layer 167.

Figure 14A:
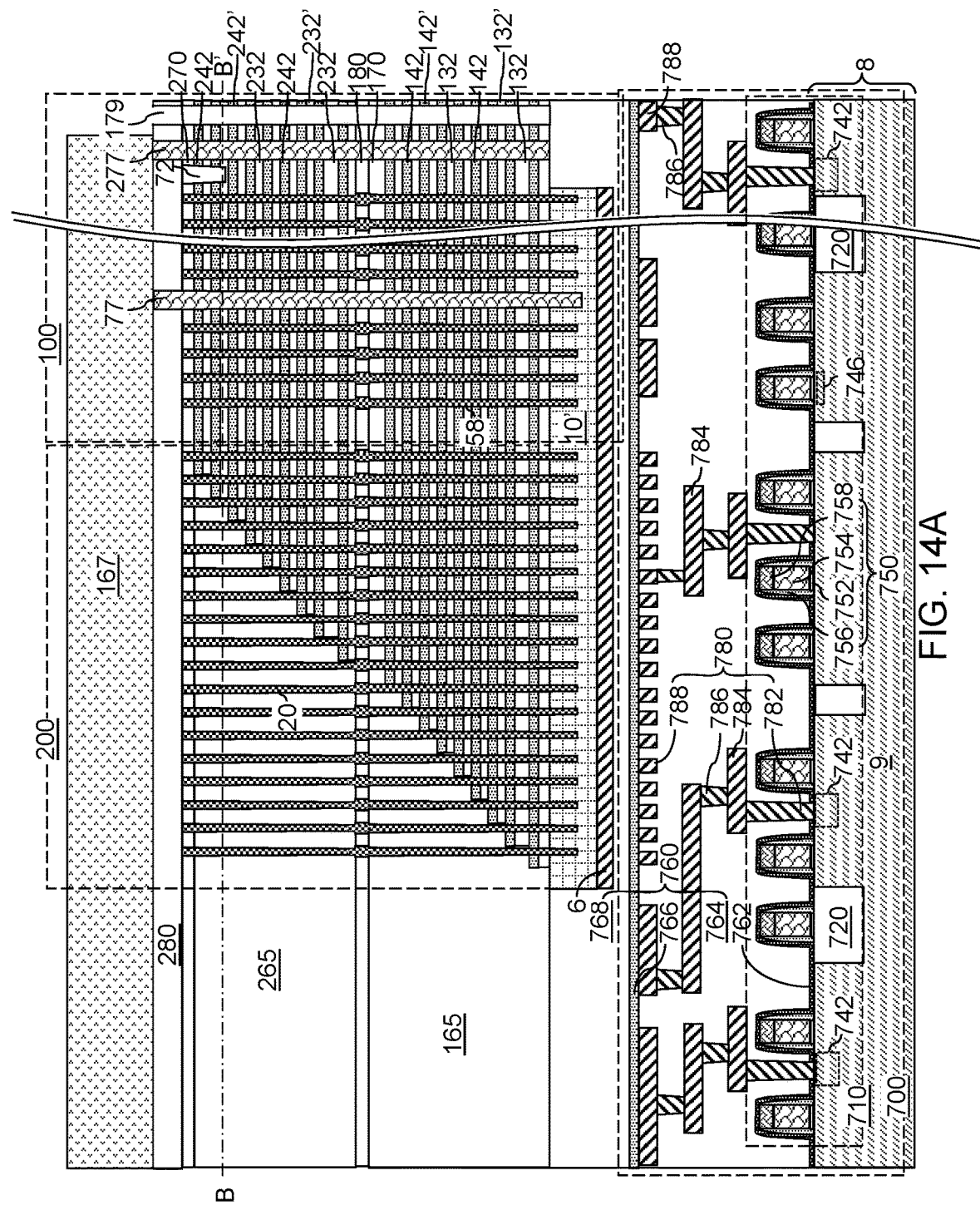
FIG. 14A is a vertical cross-sectional view of the exemplary structure after removal of the inner nested trench fill structures according to an embodiment of the present disclosure.
Figure 14B:
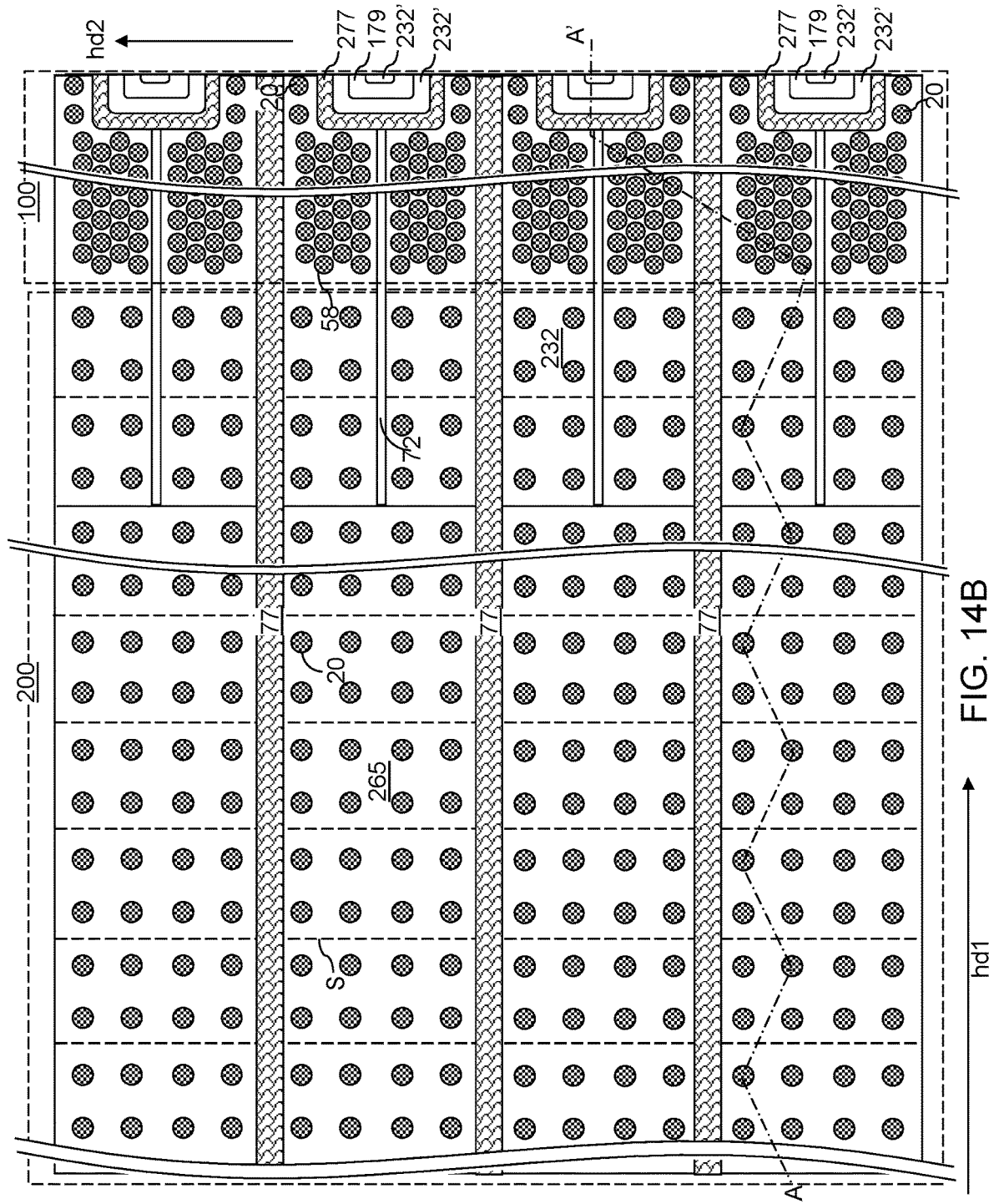
FIG. 14B is a horizontal cross-sectional view of the exemplary structure along the plane B-B' of FIG. 14A.
Figure 14C:
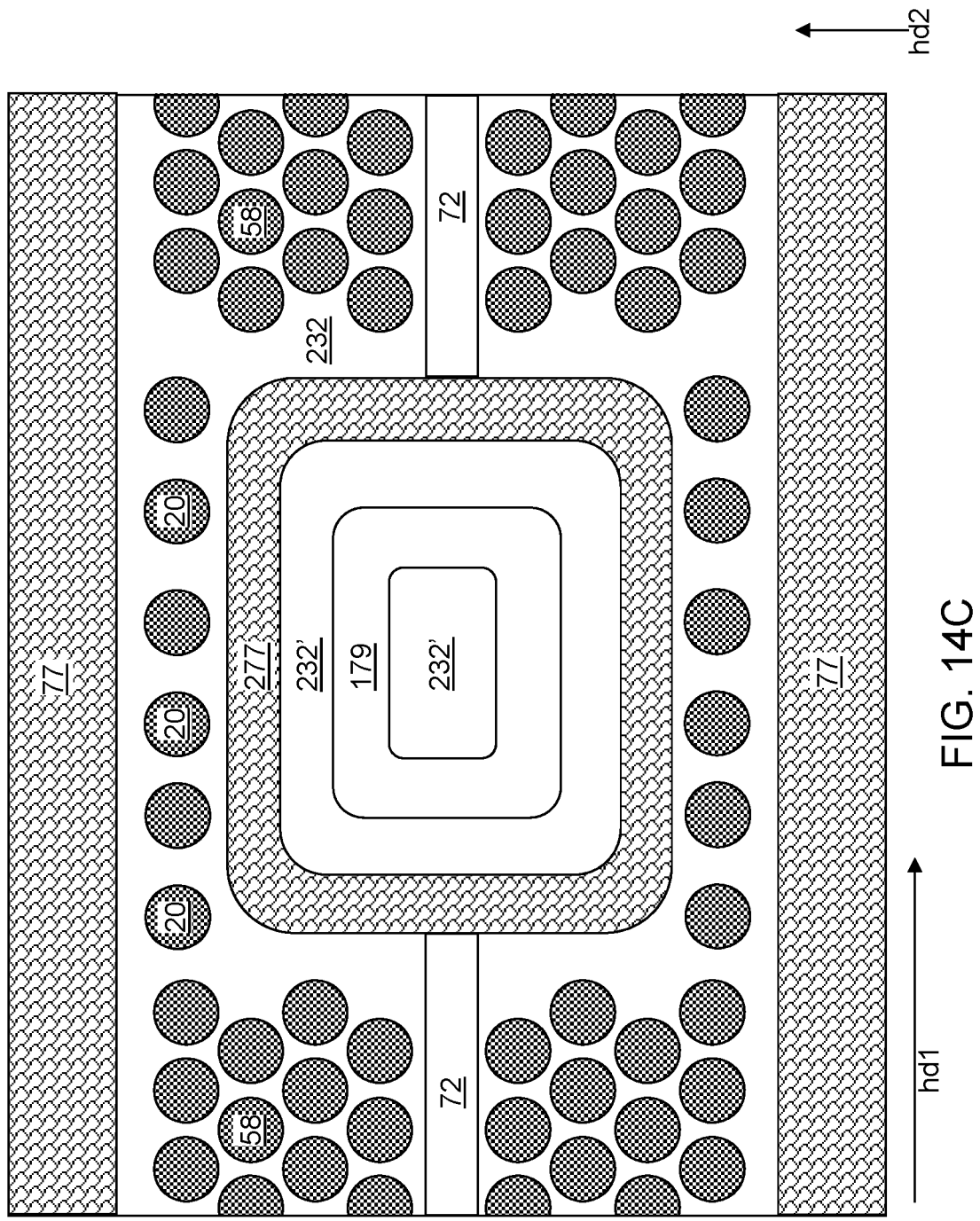
FIG. 14C is a magnified view of a region including a set of nested trenches in the horizontal cross-sectional view of FIG. 14B.
Figure 15A:
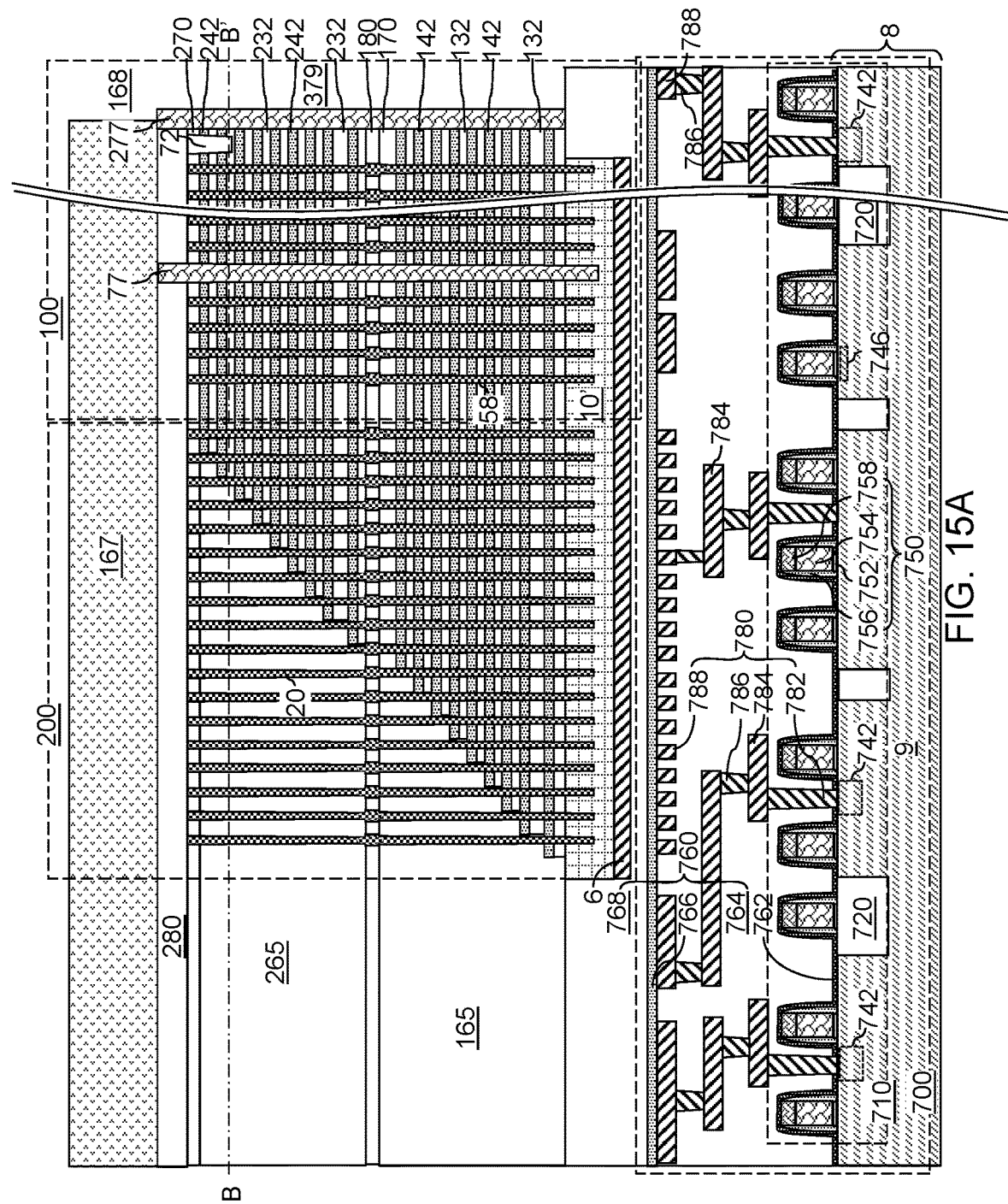
FIG. 15A is a vertical cross-sectional view of the exemplary structure after removal of patterned remaining portions of the alternating stack according to an embodiment of the present disclosure.
Figure 15B:
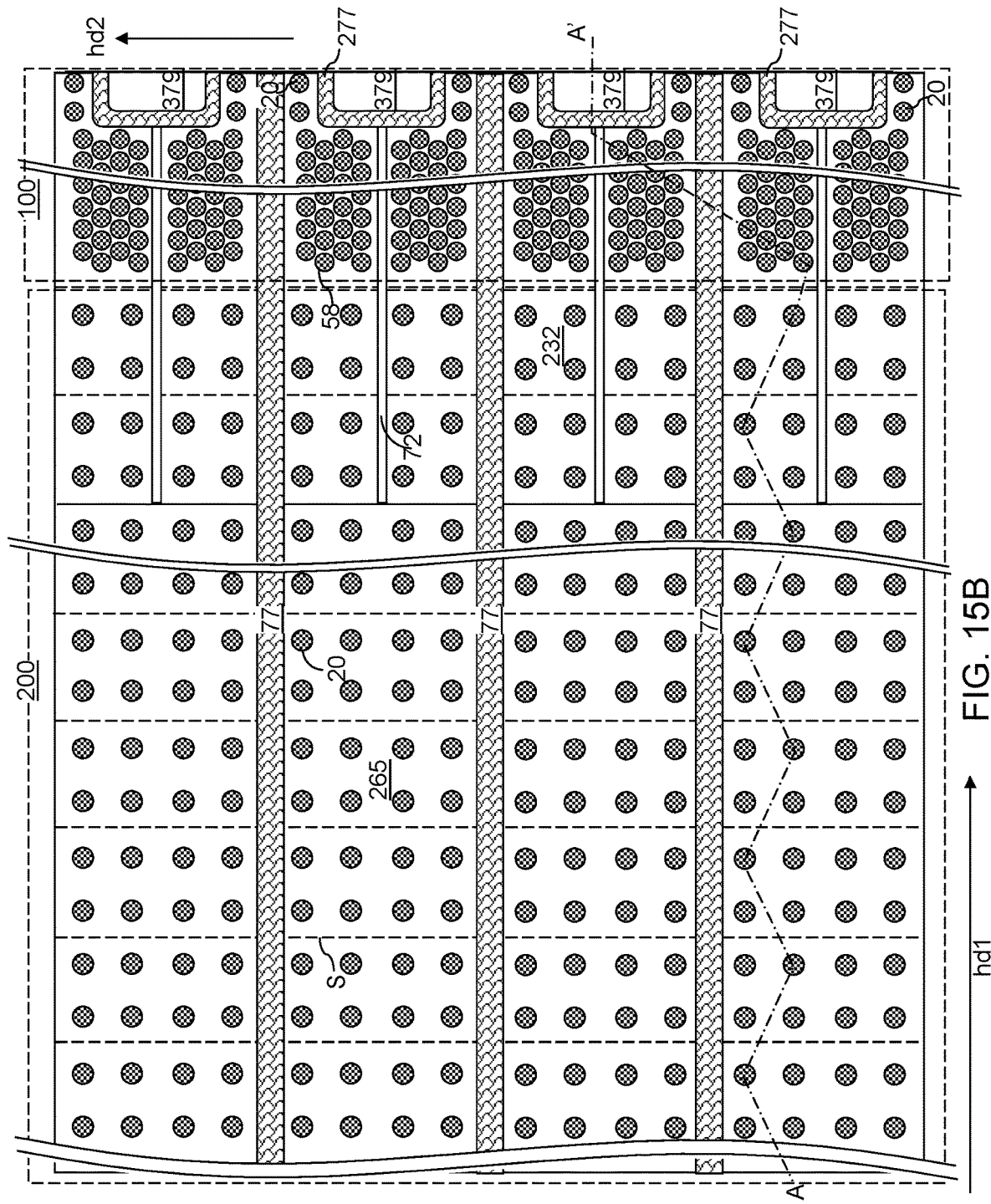
FIG. 15B is a horizontal cross-sectional view of the exemplary structure along the plane B-B' of FIG. 15A.
Figure 15C:
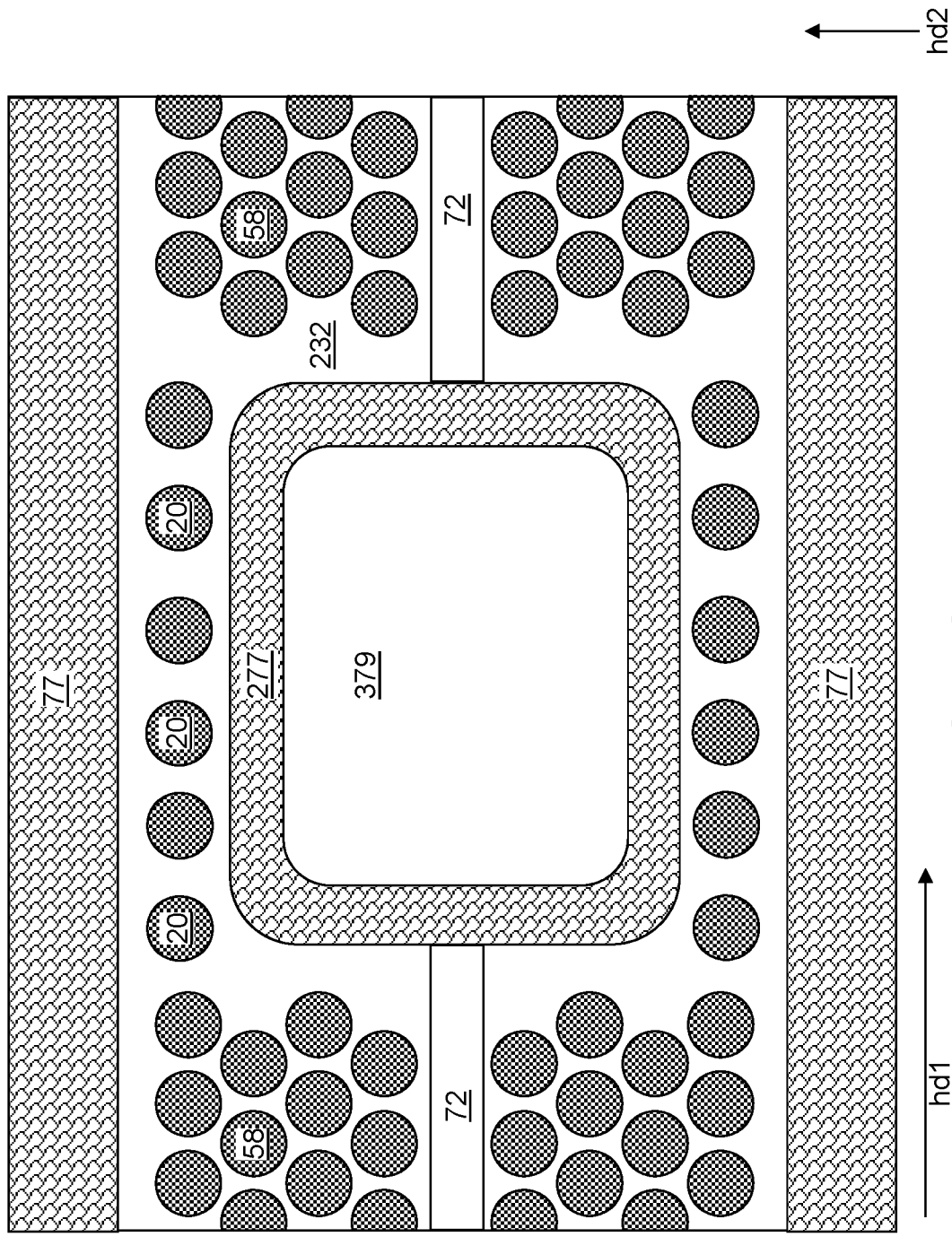
FIG. 15C is a magnified view of a region including a set of nested trenches in the horizontal cross-sectional view of FIG. 15B.
Figure 15D:
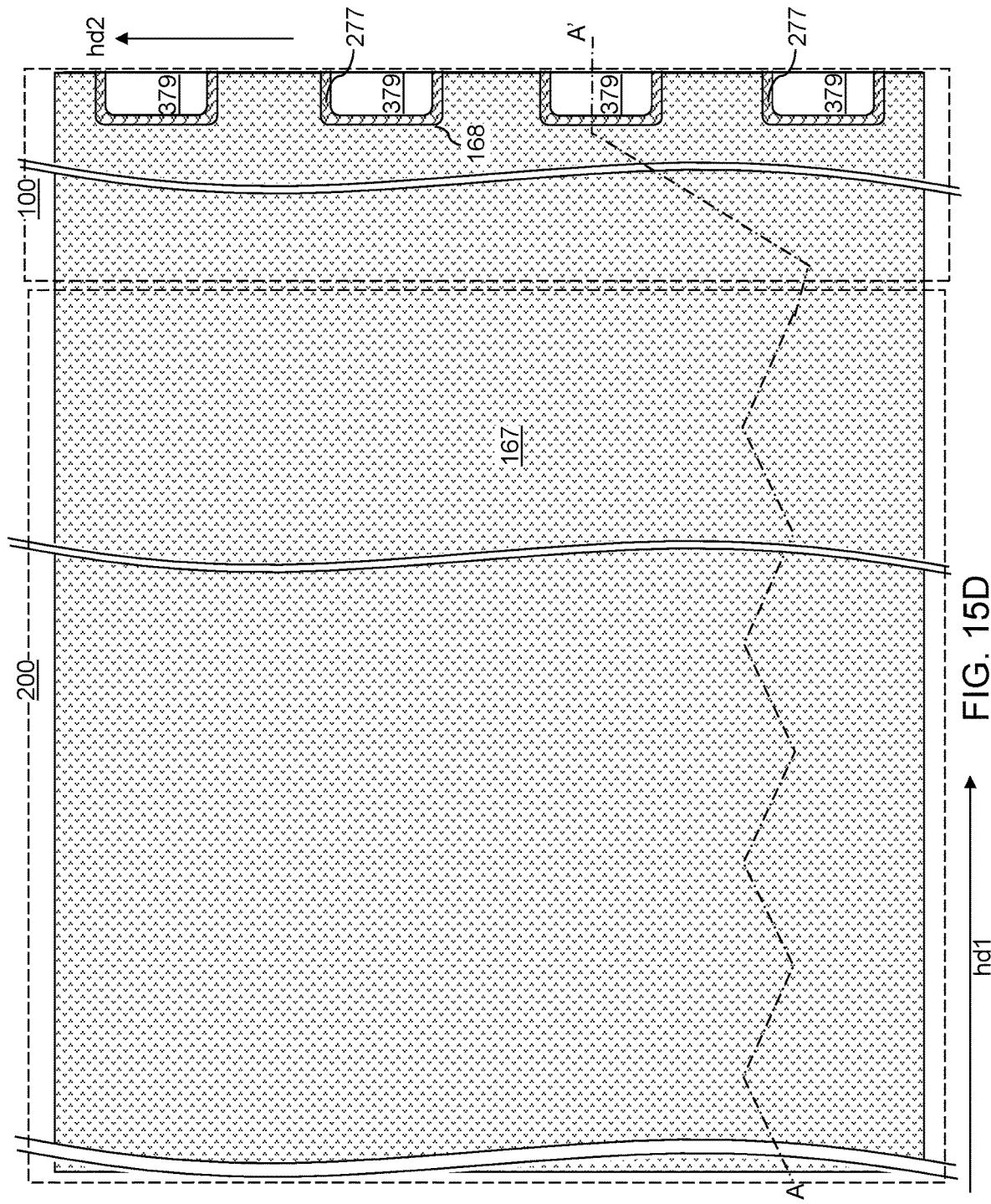
FIG. 15D is a top-down view of the exemplary structure of FIGS. 15A-15C.

Referring to FIGS. 14A-14C, an etch process may be performed to remove the sacrificial inner trench fill structures 177 exposed in the openings 168 selective to the materials of the vertically alternating sequences of insulating plates (132', 232') and sacrificial material plates (142', 242'), the first contact-level dielectric material layer 280, and the at least one second dielectric layer 768. The at least one sacrificial inner trench fill structure 177 of each set of sacrificial nested trench fill structures (177, 277) may be removed selective to the patterned remaining portions of the alternating stack {(132, 142), (232, 242)}, i.e., selective to the vertically alternating sequences of insulating plates (132', 232') and sacrificial material plates (142', 242'). A void may be formed in each volume from which a sacrificial inner trench fill structure 177 is removed through a respective opening 168 in the patterned etch mask layer 167.

Removal of the sacrificial inner trench fill structures 177 of the sets of sacrificial nested trench fill structures (177, 277) may be performed selective to materials of the insulating layers (132, 232) and the sacrificial material layers using an anisotropic etch process or an isotropic etch process. If the sacrificial inner trench fill structures 177 include amorphous silicon, a wet etch process using hot trimethyl-2 hydroxyethyl ammonium hydroxide ("hot TMY") or tetramethyl ammonium hydroxide (TMAH) may be used to remove the sacrificial inner trench fill structures 177. Once the sacrificial inner trench fill structures 177 are removed, the volumes of the inner trenches 179 become voids, i.e., become cavities. Each void of the inner trenches 179 may be laterally bounded by at least one vertically alternating sequences of insulating plates (132', 232') and sacrificial material plates (142', 242').

Referring to FIGS. 15A-15D, patterned remaining portions of the alternating stack {(132, 142), (232, 242)}, i.e., the vertically alternating sequences of insulating plates (132', 232') and sacrificial material plates (142', 242'), that are exposed in the openings 168 in the patterned etch mask layer 167 may be removed using a first isotropic etch process selective to the sacrificial outer trench fill structures 277. At least one isotropic etchant is applied to the vertically alternating sequences of insulating plates (132', 232') and sacrificial material plates (142', 242') through the voids of the inner trenches 179. Each vertically alternating sequence of insulating plates (132', 232') and sacrificial material plates (142', 242') laterally surrounded by a sacrificial outer trench fill structure 277 is physically exposed to at least one inner trench 179. The isotropic etchant(s) and the duration of the first isotropic etch process may be selected such that the entirety of each vertically alternating sequence of insulating plates (132', 232') and sacrificial material plates (142', 242') is removed by the first isotropic etch process. In one embodiment, the insulating plates (132', 232') may include silicon oxide and sacrificial material plates (142', 242') may include silicon nitride. In this case, the first isotropic etch process may use sequential application of phosphoric acid and hydrofluoric acid, or application of a mixture of phosphoric acid and hydrofluoric acid. Access of the at least one isotropic etchant to the backside trenches 79 (which are filled with the sacrificial backside trench fill material structures 77) may be prevented by the patterned etch mask layer 167. If the patterned etch mask layer 167 comprises silicon oxide, then it may comprise a silicon oxide material having a different composition (e.g., boron and/or phosphorus doped silicon oxide versus undoped silicon oxide) or different density (e.g., formed by a different deposition method and/or using a different precursor) than the silicon oxide material of the insulating plates (132', 232'). A pillar-shaped cavity 379 may be formed within each volume that is laterally enclosed by a sacrificial outer trench fill structure 277 and exposed in the respective opening 168 in the patterned etch mask layer 167.

Figure 16A:
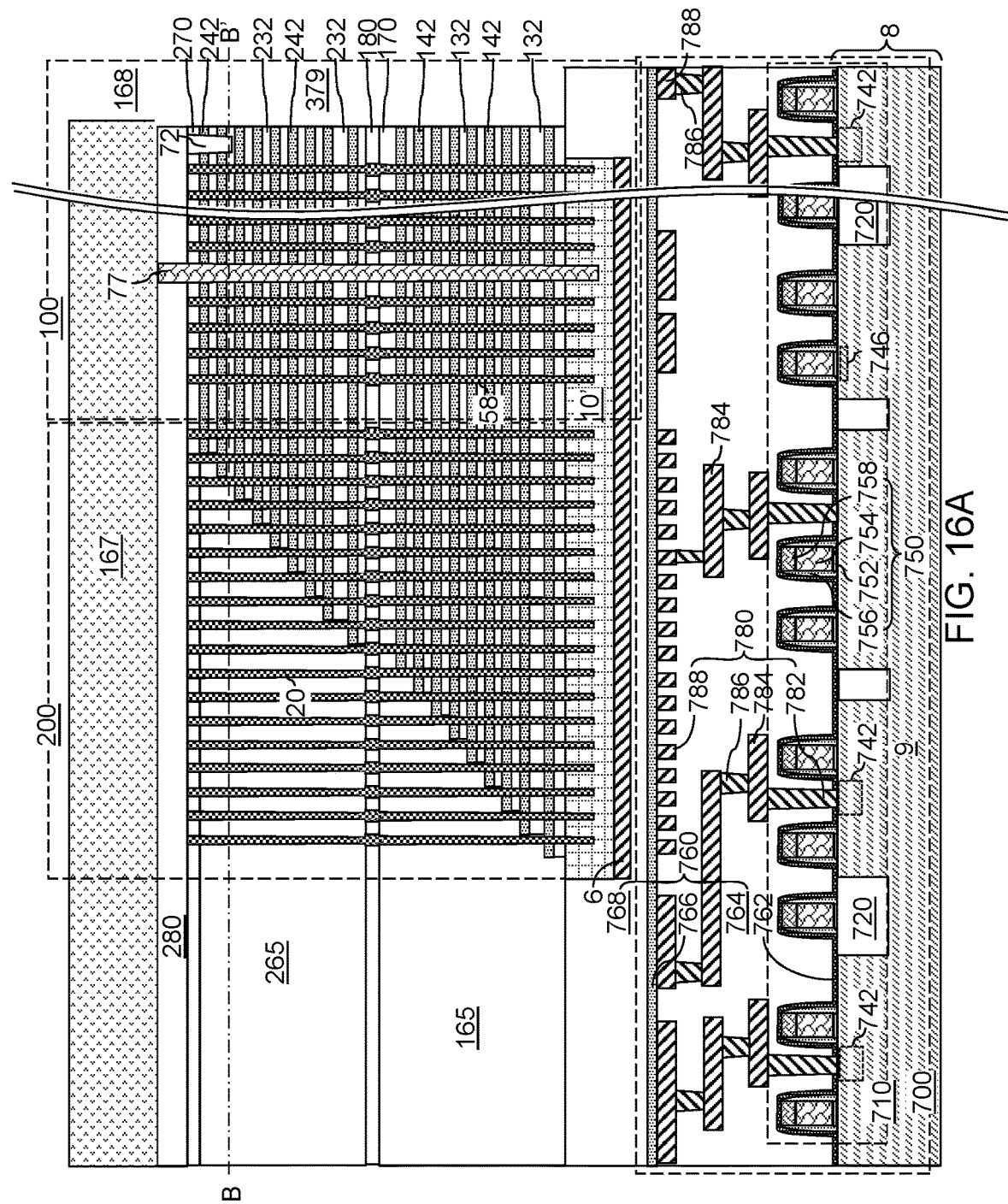
FIG. 16A is a vertical cross-sectional view of the exemplary structure after removal of sacrificial outer trench fill structures according to an embodiment of the present disclosure.
Figure 16B:
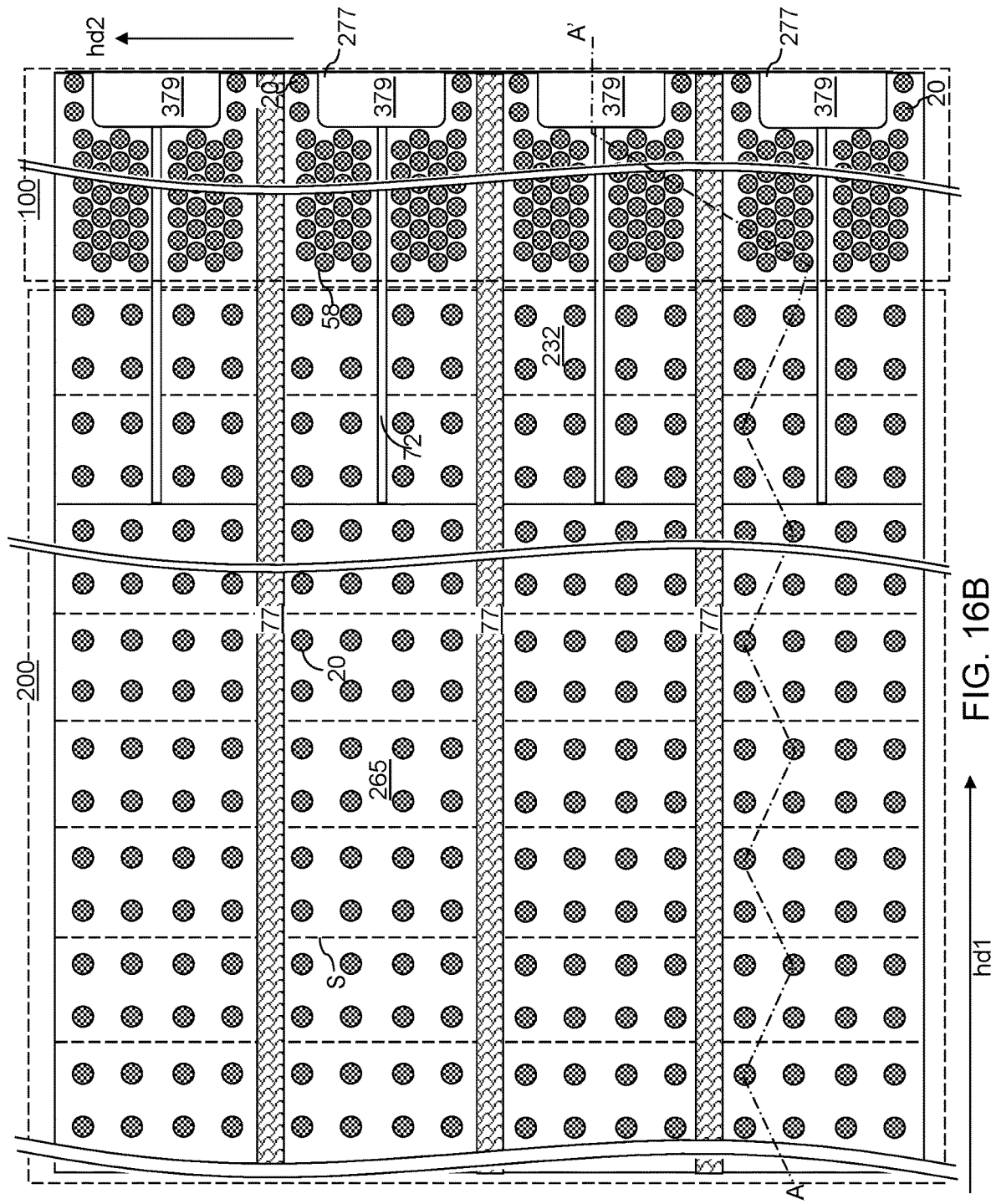
FIG. 16B is a horizontal cross-sectional view of the exemplary structure along the plane B-B' of FIG. 16A.
Figure 16C:
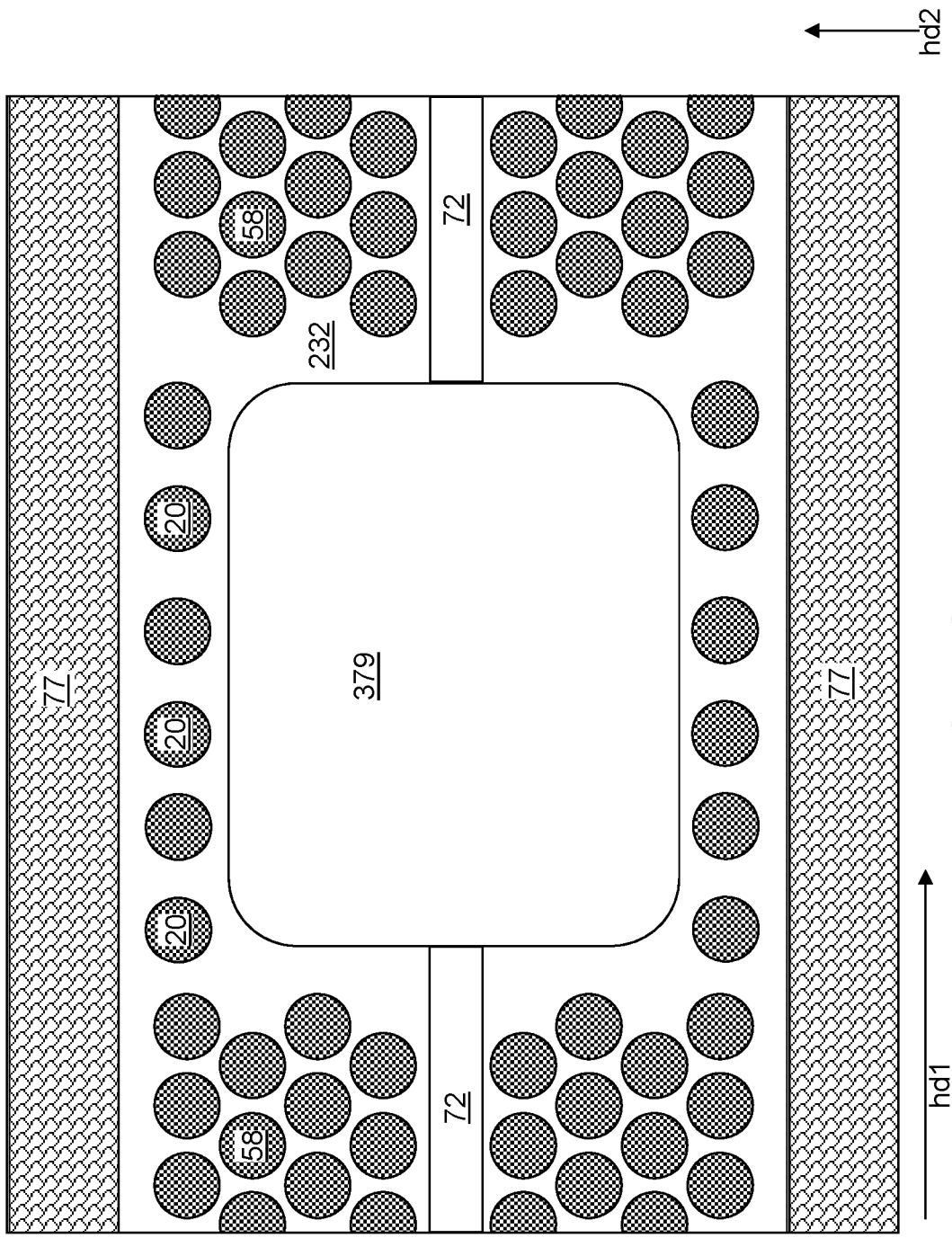
FIG. 16C is a magnified view of a region including a set of nested trenches in the horizontal cross-sectional view of FIG. 15B.

Referring to FIGS. 16A-16C, the sacrificial outer trench fill structures 277 may be removed selective to the alternating stacks {(132, 146), (232, 246)} using a second isotropic or anisotropic etch process. The second etch process removes the material of the sacrificial outer trench fill structures 277 selective to materials of the insulating layers (132, 232) and the sacrificial material layers (142, 242). If the sacrificial outer trench fill structures 277 include amorphous silicon, a wet etch process using hot trimethyl-2 hydroxyethyl ammonium hydroxide ("hot TMY") or tetramethyl ammonium hydroxide (TMAH) may be used to remove the sacrificial outer trench fill structures 277. Once the sacrificial outer trench fill structures 277 are removed, each pillar-shaped cavity 379 expands by the volume from which a neighboring one of the sacrificial outer trench fill structures 277 is removed. Each pillar-shaped cavity 379 may include a void that is located under a respective opening 168 in the patterned etch mask layer 167 and that is laterally bounded by a respective alternating stack {(132, 142), (232, 242)} of insulating layers (132, 232) and sacrificial material layers (142, 242). The patterned etch mask layer 167 may be removed, for example, by ashing if it comprises photoresist, or by selective etching if it comprises an insulating material.

Generally, each set of sacrificial nested trench fill structures (177, 277) may be sequentially removed while sacrificial backside trench fill material structures 77 fill the backside trenches 79 and the patterned etch mask layer covers all alternating stacks {(132, 142), (232, 2342)} of insulating layers (132, 232) and sacrificial material layers (142, 232) and all of the sacrificial backside trench fill material structures 77.

Figure 17A:
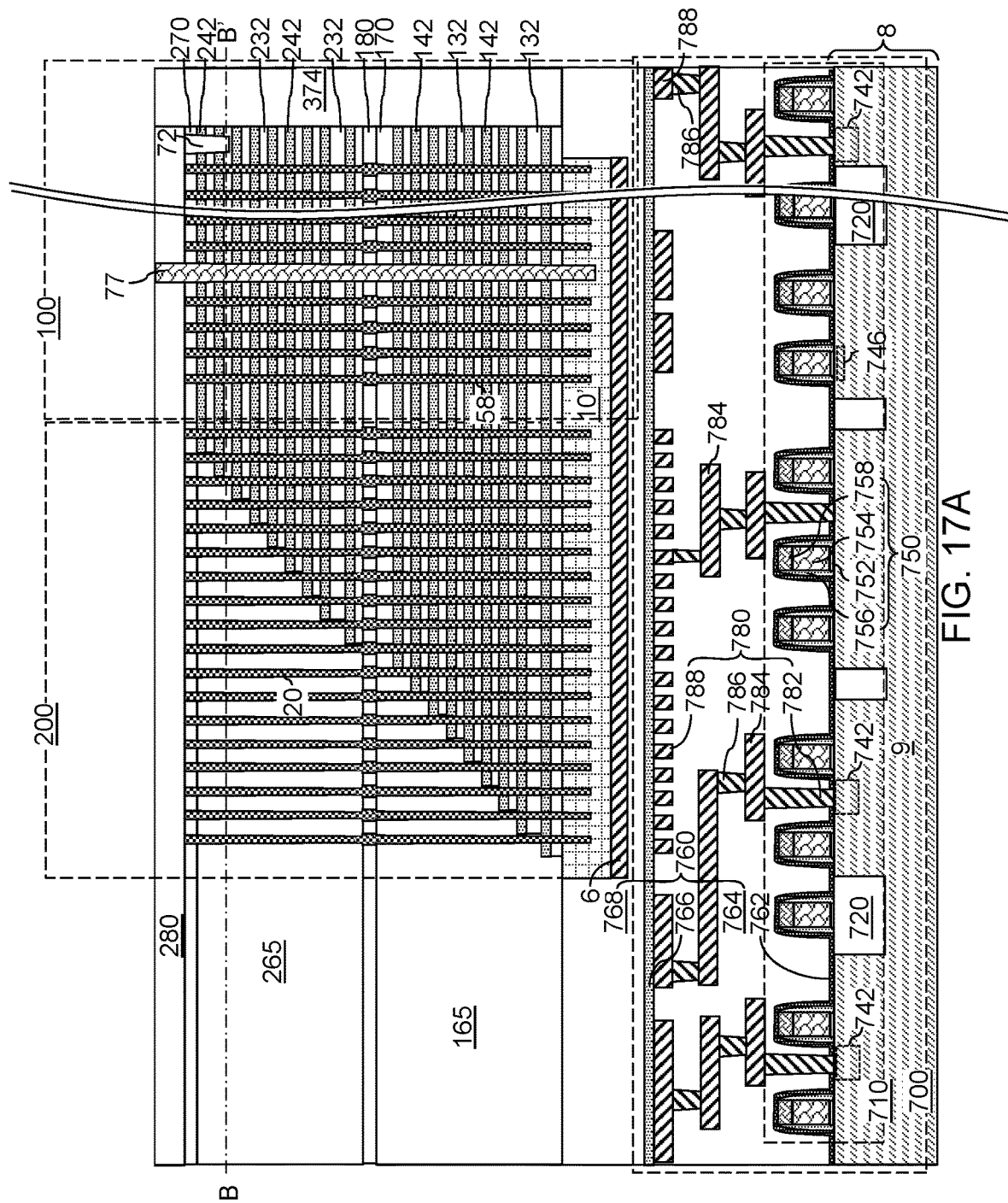
FIG. 17A is a vertical cross-sectional view of the exemplary structure after formation of dielectric pillar structures according to an embodiment of the present disclosure.
Figure 17B:
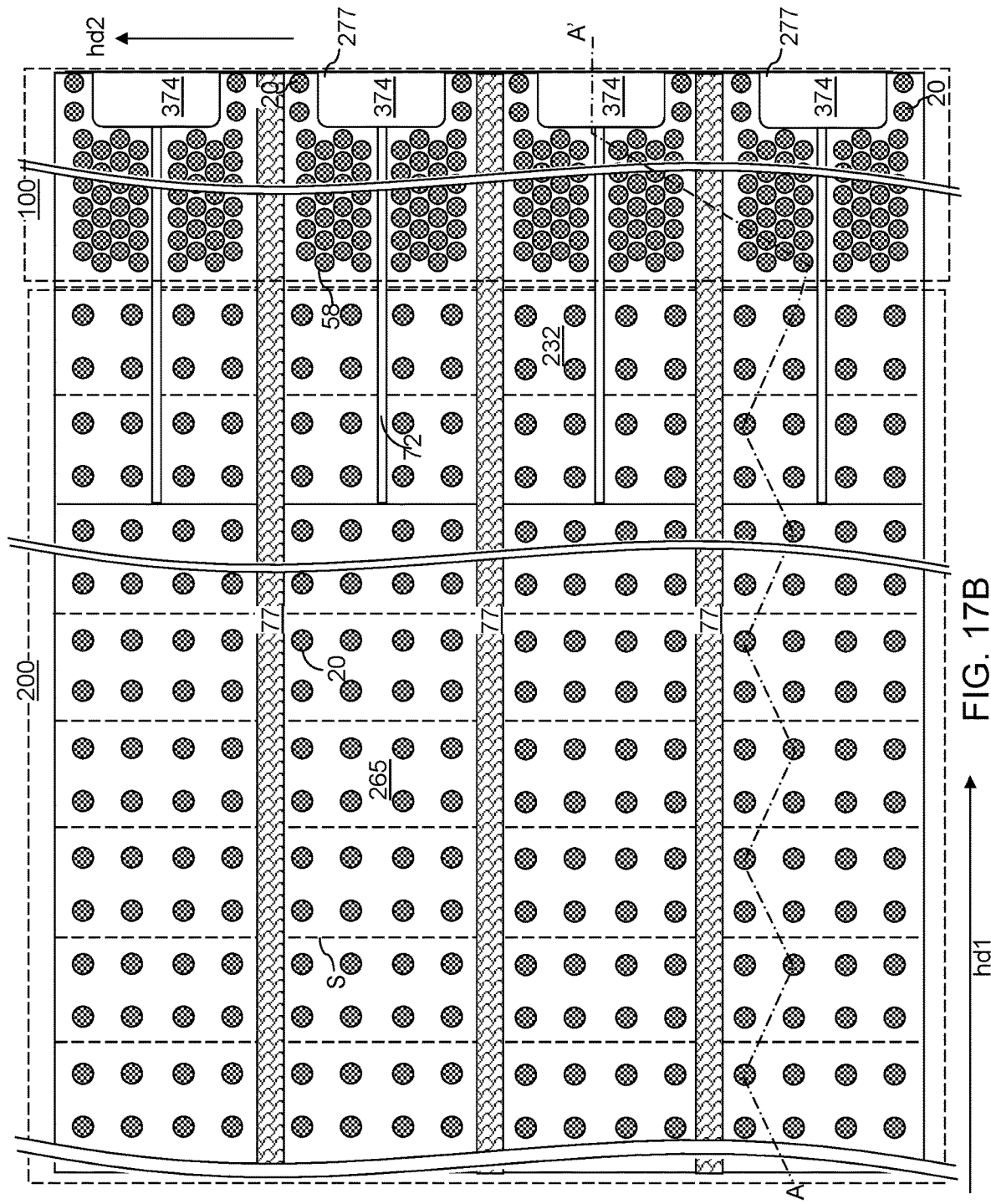
FIG. 17B is a horizontal cross-sectional view of the exemplary structure along the plane B-B' of FIG. 17A.
Figure 17C:
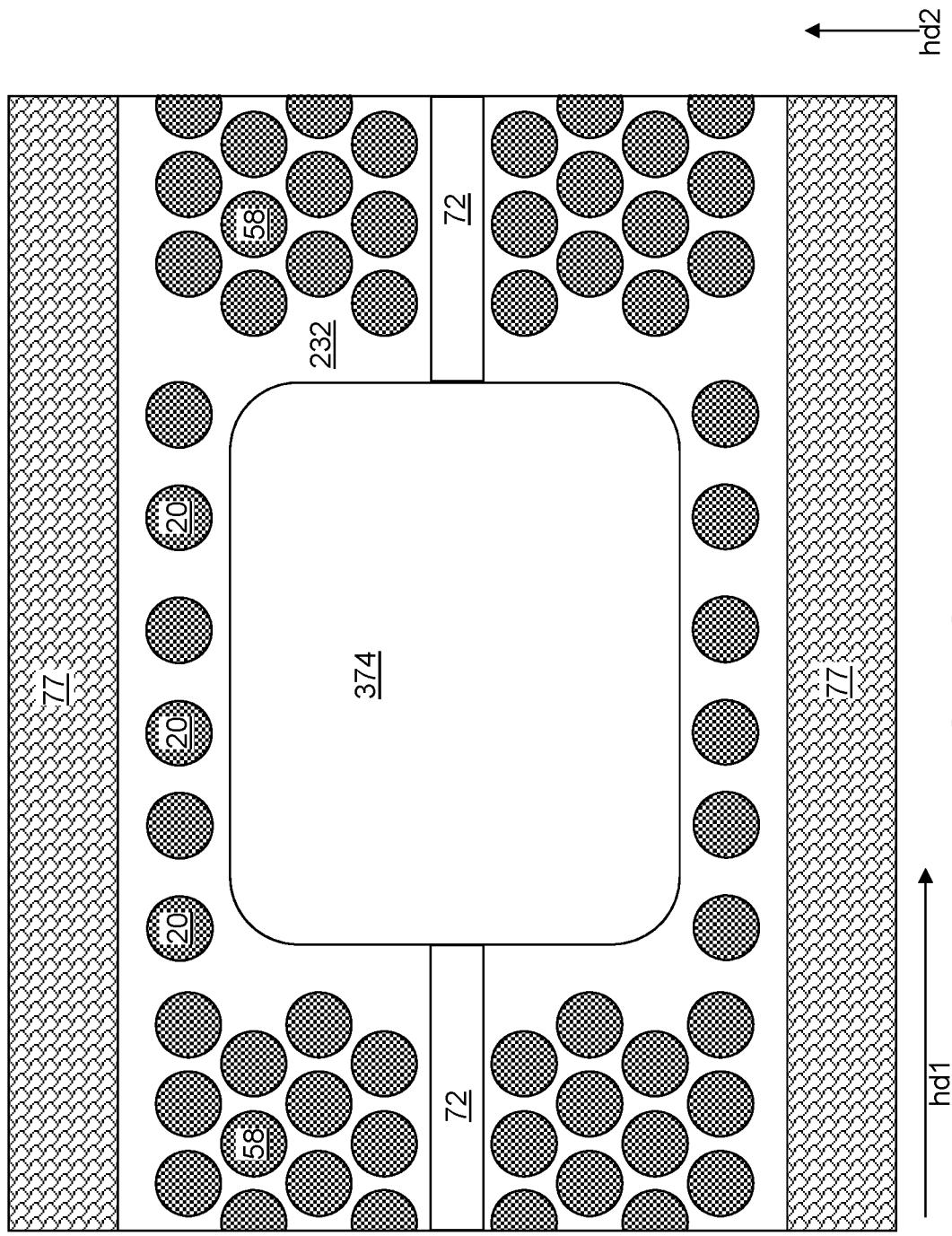
FIG. 17C is a magnified view of a region including a set of nested trenches in the horizontal cross-sectional view of FIG. 17B.

Referring to FIGS. 17A-17C, a dielectric material having a different material composition than the sacrificial material layers (142, 242) may be deposited in the pillar-shaped cavities 379. For example, a silicate glass material (such as undoped silicate glass or a doped silicate glass) and/or a dielectric metal oxide material may be deposited in the pillar-shaped cavities 379. Excess portions of the dielectric material may be removed from above the horizontal plane including the top surface of the first contact level dielectric layer 280 by a planarization process, which may include chemical mechanical planarization (CMP) or a recess etch. Each remaining portion of the deposited dielectric material in the pillar-shaped cavities 379 constitutes a dielectric pillar structure 374. Each dielectric pillar structure 374 may have straight sidewalls that extend from the at least one second dielectric layer 768 within an opening in the in-process source-level material layers 10', and may have a respective horizontal cross-sectional area that is invariant under translation along the vertical direction. Each dielectric pillar structure 374 vertically extends through each insulating layer (132, 232) and each sacrificial material layer (142, 242) within a respective alternating stack {(132, 142), (232, 242)} of insulating layers (132, 232) and sacrificial material layers (142, 242). In one embodiment, a drain-select-level isolation structure 72 formed within an upper region of the alternating stack {(132, 142), (232, 242)} may contact an outer sidewall of the dielectric pillar structure 374.

Figure 18:
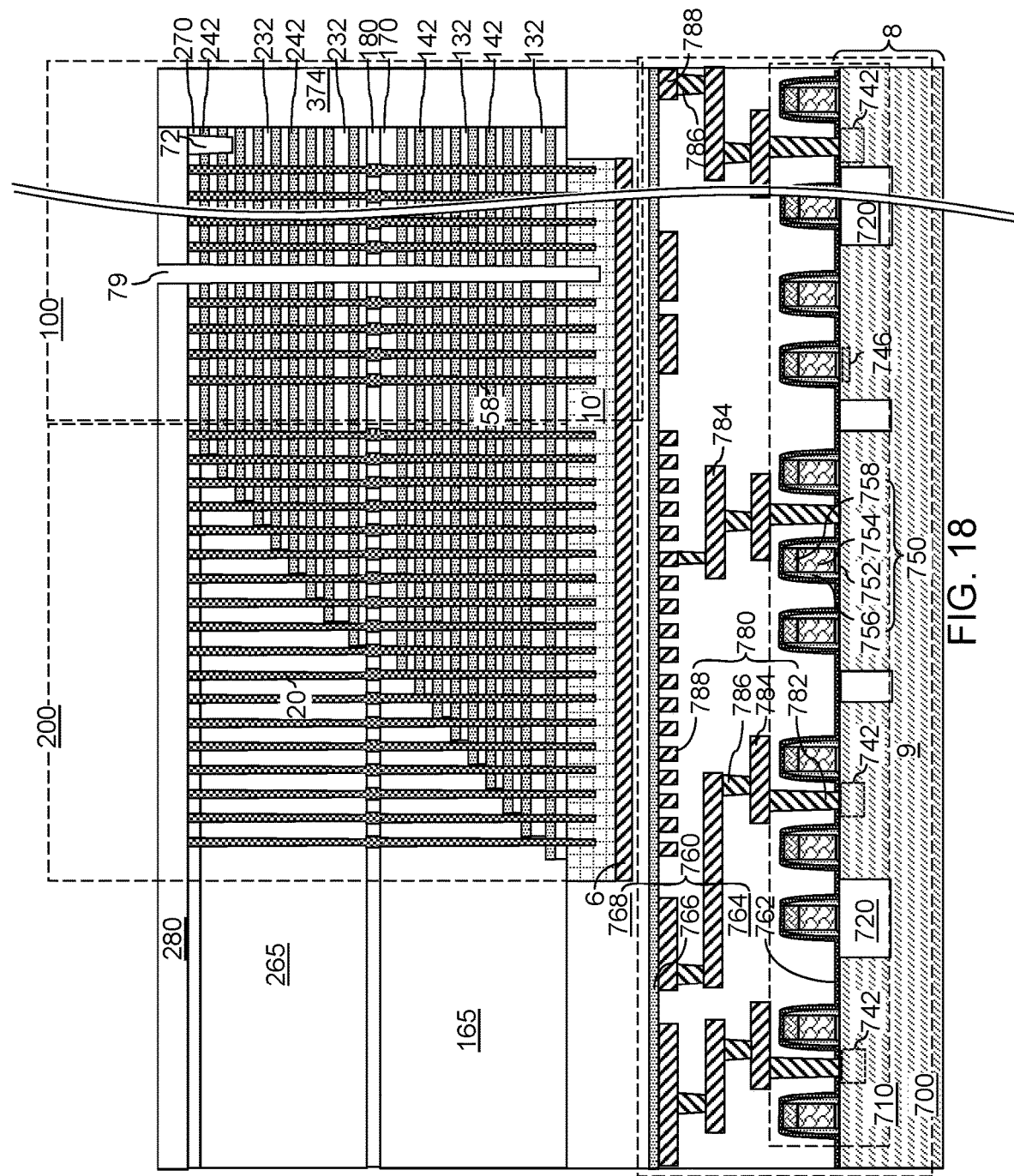
FIG. 18 is a vertical cross-sectional view of the exemplary structure after removal of the sacrificial backside trench fill material structures according to an embodiment of the present disclosure.

Referring to FIG. 18, an etch process may be performed to remove the sacrificial backside trench fill material structures 77 selective to the materials of the first contact-level dielectric material layer 280, the insulating layers (132, 232), the sacrificial material layers (142, 242), and the dielectric pillar structures 374. If the sacrificial backside trench fill material structures 77 include amorphous silicon, a wet etch process using hot trimethyl-2 hydroxyethyl ammonium hydroxide ("hot TMY") or tetramethyl ammonium hydroxide (TMAH) may be used to remove the sacrificial outer trench fill structures 277. Voids are formed in the volumes of the backside trenches 79 upon removal of the sacrificial backside trench fill material structures 77. The etch process may be performed without any patterned mask layer (such as a patterned photoresist layer).

Figure 19A:
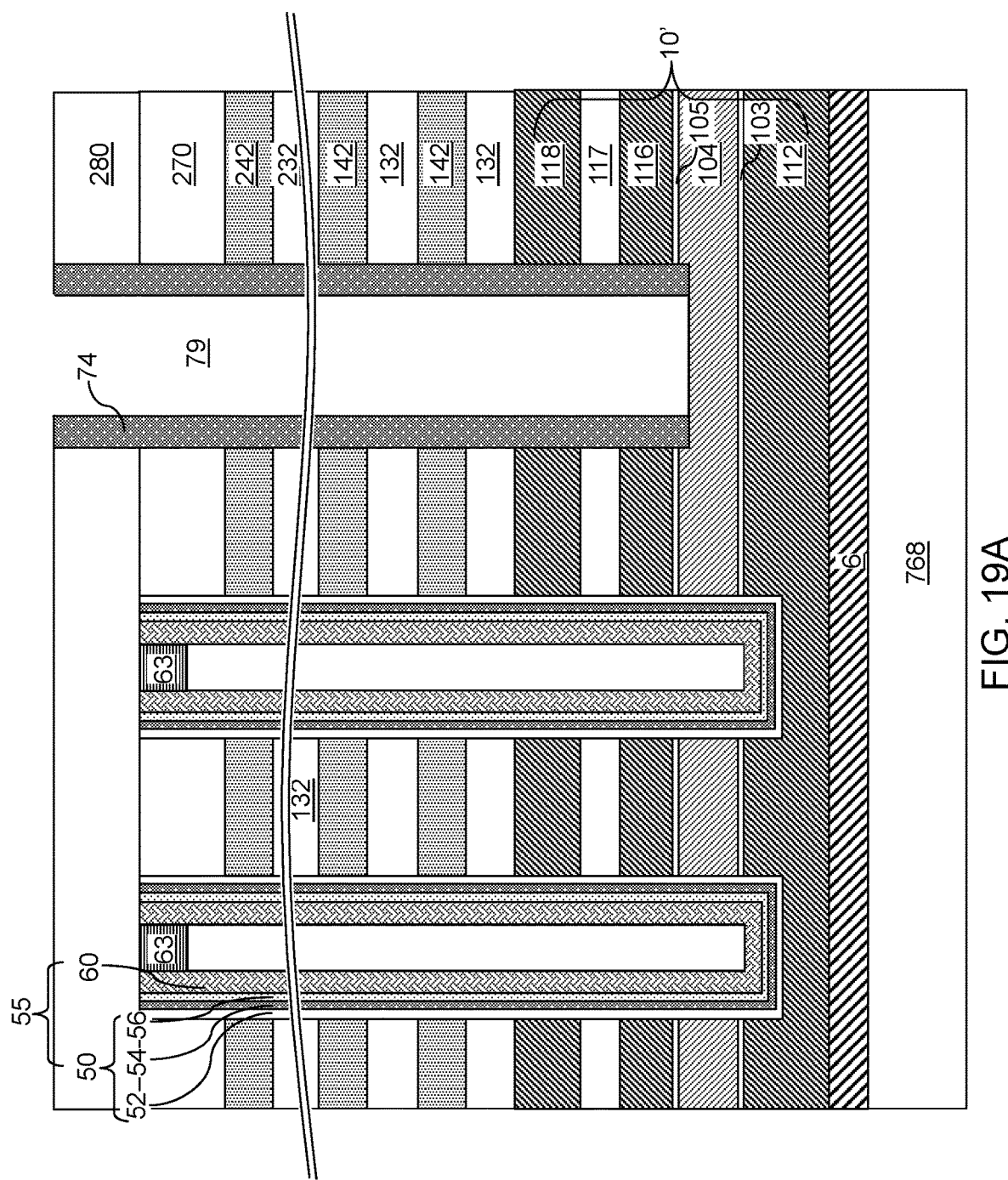
FIGS. 19A-19E illustrate sequential vertical cross-sectional views of memory opening fill structures and a backside trench during replacement of the in-process source-level material layers with source-level material layers according to an embodiment of the present disclosure.

Referring to FIG. 19A, a backside trench spacer 74 may be formed on sidewalls of each backside trench 79. For example, a conformal spacer material layer may be deposited in the backside trenches 79 and over the first contact level dielectric layer 280, and may be anisotropically etched to form the backside trench spacers 74. The backside trench spacers 74 include a material that is different from the material of the source-level sacrificial layer 104. For example, the backside trench spacers 74 may include silicon nitride.

Figure 19B:
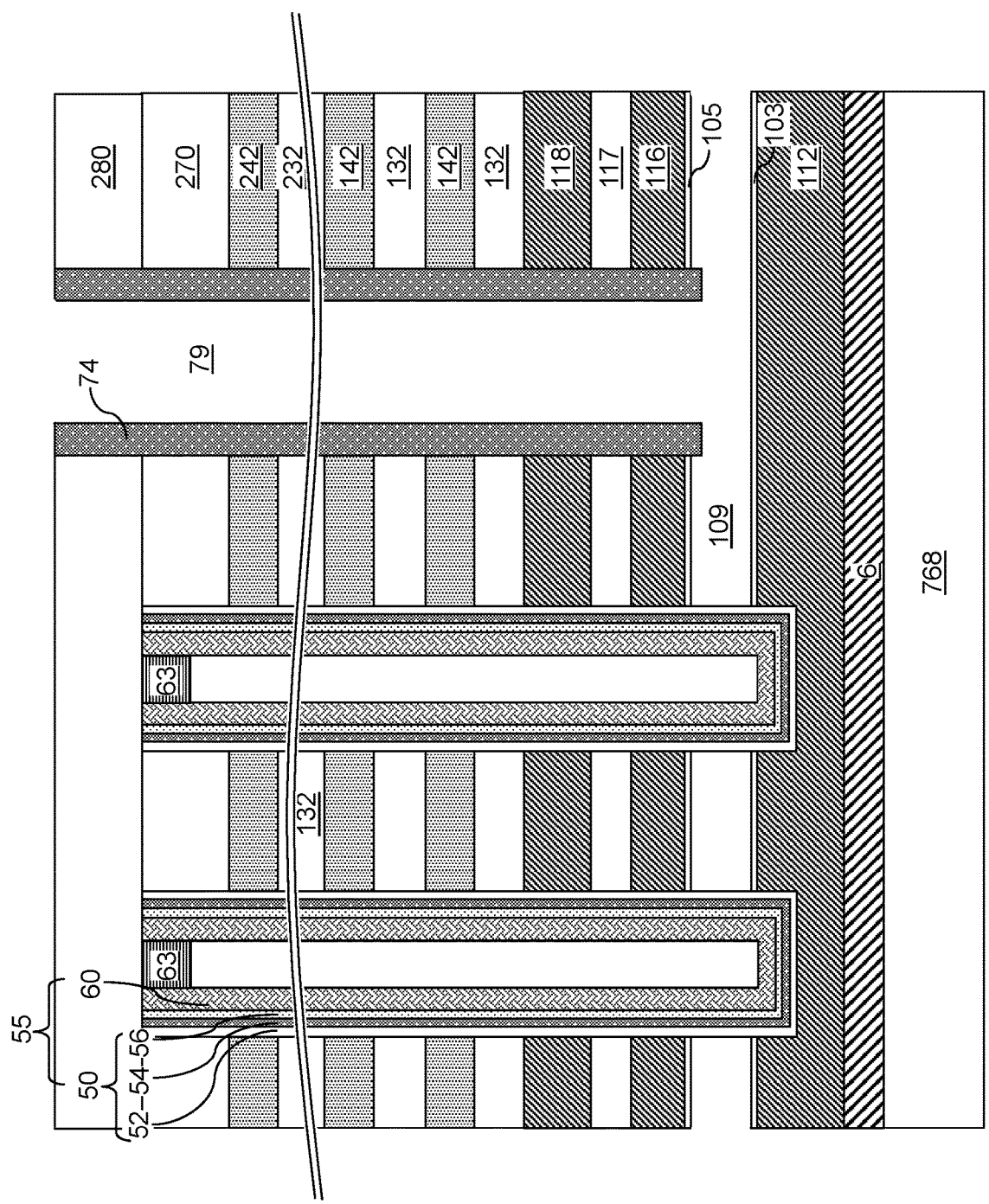

Referring to FIG. 19B, an etchant that etches the material of the source-level sacrificial layer 104 selective to the materials of the first-tier alternating stack (132, 142), the second-tier alternating stack (232, 242), the first and second insulating cap layers (170, 270), the first contact level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 74 and the upper and lower sacrificial liners (105, 103). A source cavity 109 is formed in the volume from which the source-level sacrificial layer 104 is removed.

Wet etch chemicals such as hot TMY and TMAH are selective to the doped semiconductor materials of the upper source-level semiconductor layer 116 and the lower source-level semiconductor layer 112. Thus, use of selective wet etch chemicals such as hot TMY and TMAH for the wet etch process that forms the source cavity 109 may provide a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 74, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and a bottom surface that are physically exposed to the source cavity 109.

Figure 19C:
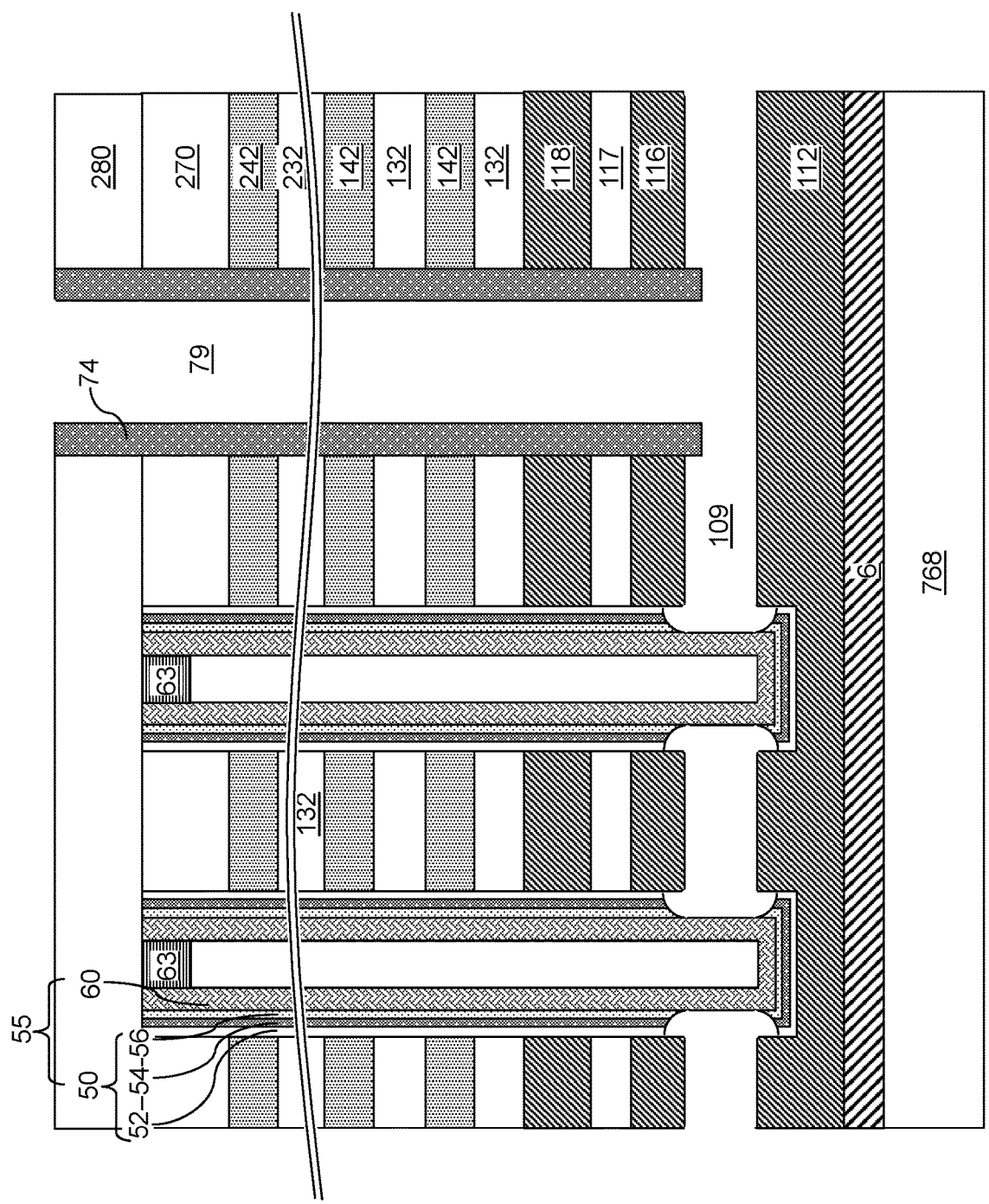

Referring to FIG. 19C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 19D:
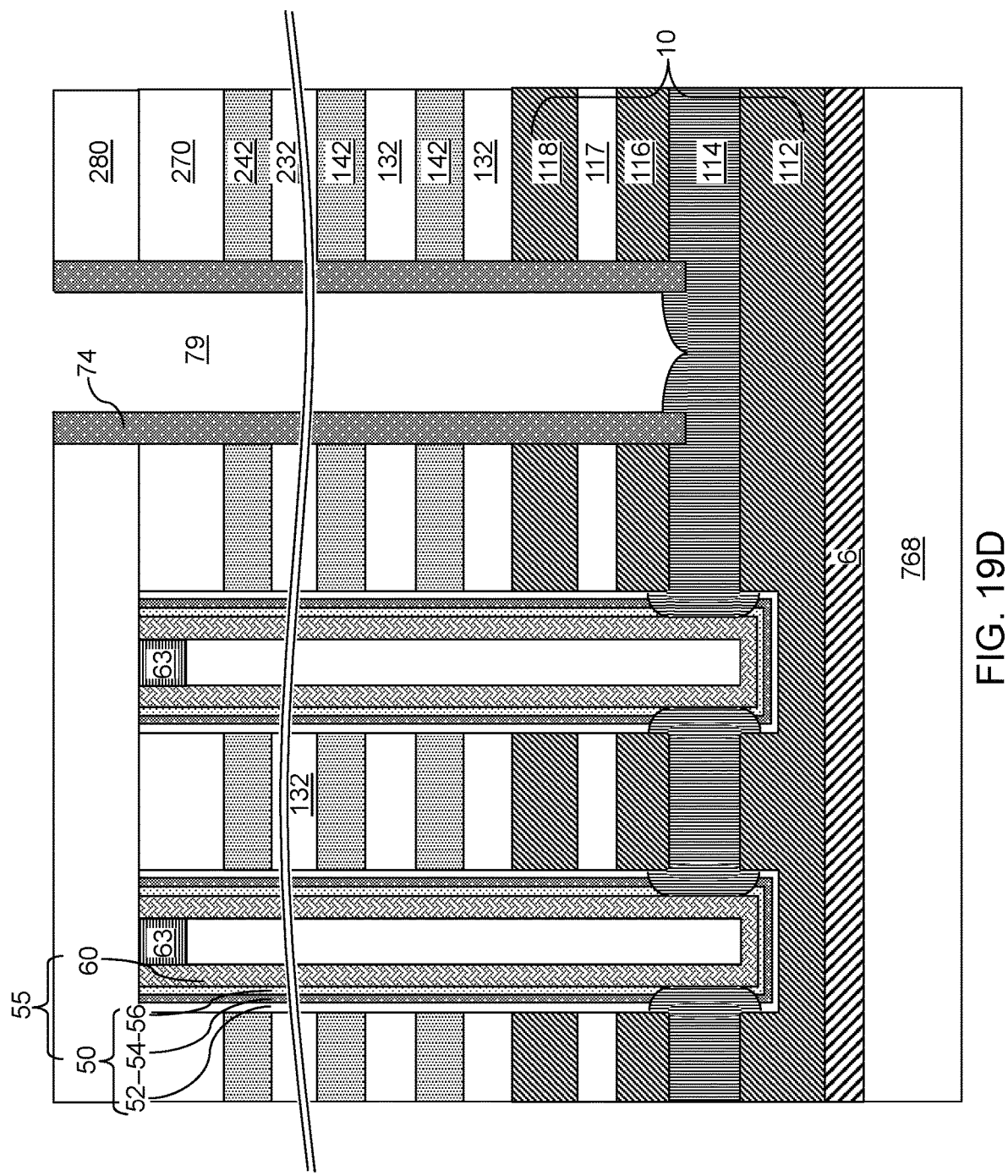

Referring to FIG. 19D, a doped semiconductor material having a doping of the second conductivity type may be deposited on the physically exposed semiconductor surfaces around the source cavity 109. The second conductivity type is the opposite of the first conductivity type, which is the conductivity type of the doping of the vertical semiconductor channels 60. The physically exposed semiconductor surfaces include bottom portions of outer sidewalls of the vertical semiconductor channels 60 and horizontal surfaces of the at least one source-level semiconductor layer (112, 116). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and an n-type dopant precursor gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the n-type dopant precursor gas such as phosphine, arsine, or stibine. In this case, the selective semiconductor deposition process grows an in-situ doped semiconductor material from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0\times10^{20}/cm^3$ to $2.0\times10^{21}/cm^3$, such as from $2.0\times10^{20}/cm^3$ to $8.0\times10^{20}/cm^3$. The source contact layer 114 as initially formed may consist essentially of semiconductor atoms and the dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 74. In one embodiment, the source contact layer 114 may be formed by selectively depositing a doped semiconductor material from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a source region (112, 114, 116). The source region (112, 114, 116) is electrically connected to a first end (such as a bottom end) of each of the vertical semiconductor channels 60. The set of layers including the source region (112, 114, 116), the source-level insulating layer 117, and the source-select-level conductive layer 118 constitutes source-level material layers 10, which replaces the in-process source-level material layers 10'.

Figure 19E:
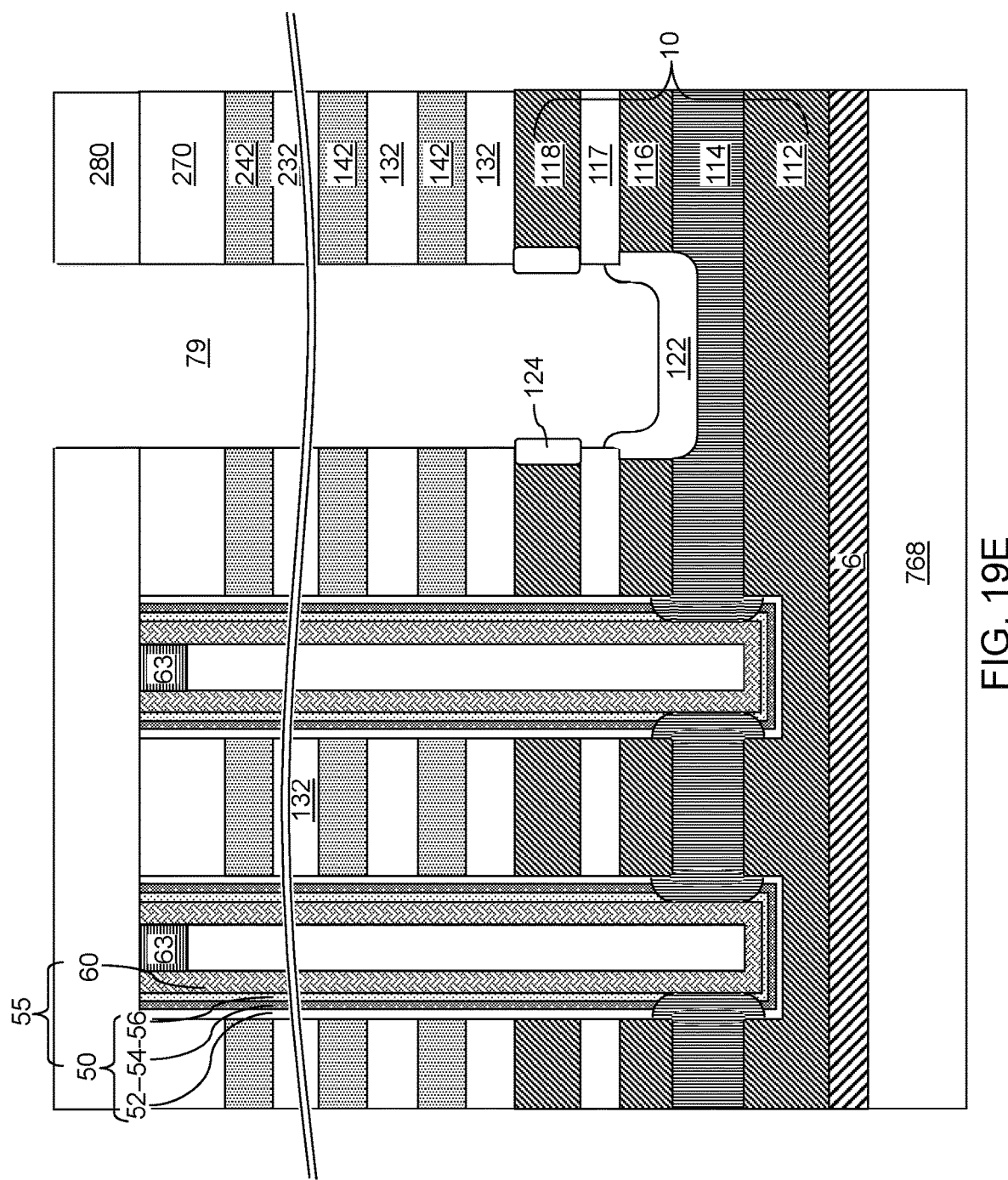
Figure 20:
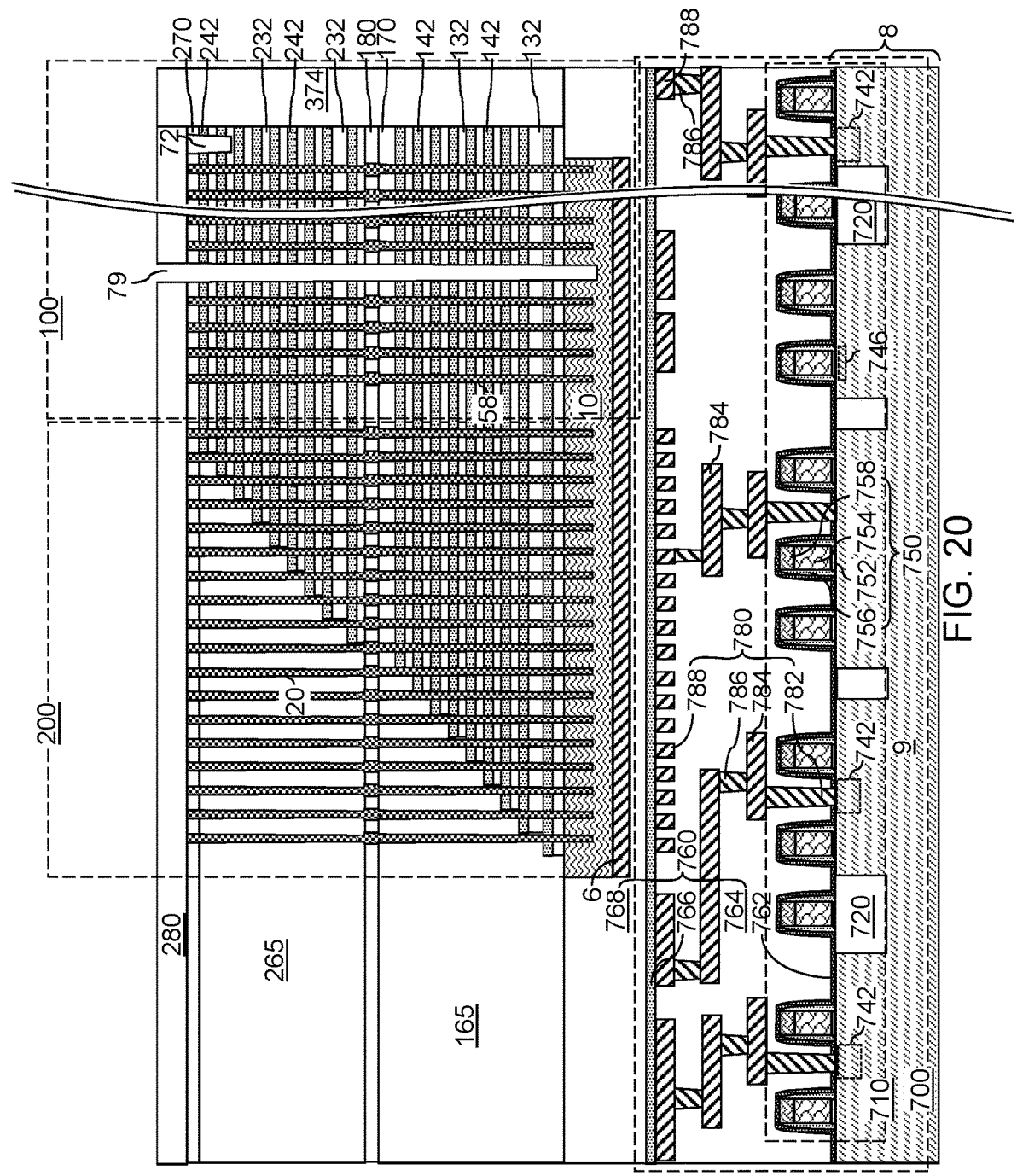
FIG. 20 is a vertical cross-sectional view of the exemplary structure after formation of source-level material layers according to an embodiment of the present disclosure.

Referring to FIGS. 19E and 20, the backside trench spacers 74 may be removed selective to the insulating layers (132, 232), the first and second insulating cap layers (170, 270), the first contact level dielectric layer 280, and the source contact layer 114 using an isotropic etch process. For example, if the backside trench spacers 74 include silicon nitride, a wet etch process using hot phosphoric acid may be performed to remove the backside trench spacers 74. In one embodiment, the isotropic etch process that removes the backside trench spacers 74 may be combined with a subsequent isotropic etch process that etches the sacrificial material layers (142, 242) selective to the insulating layers (132, 232), the first and second insulating cap layers (170, 270), the first contact level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124. The dielectric semiconductor oxide plates 122 and the annular dielectric semiconductor oxide spacers 124 are omitted in FIG. 20 for clarity.

Figure 21:
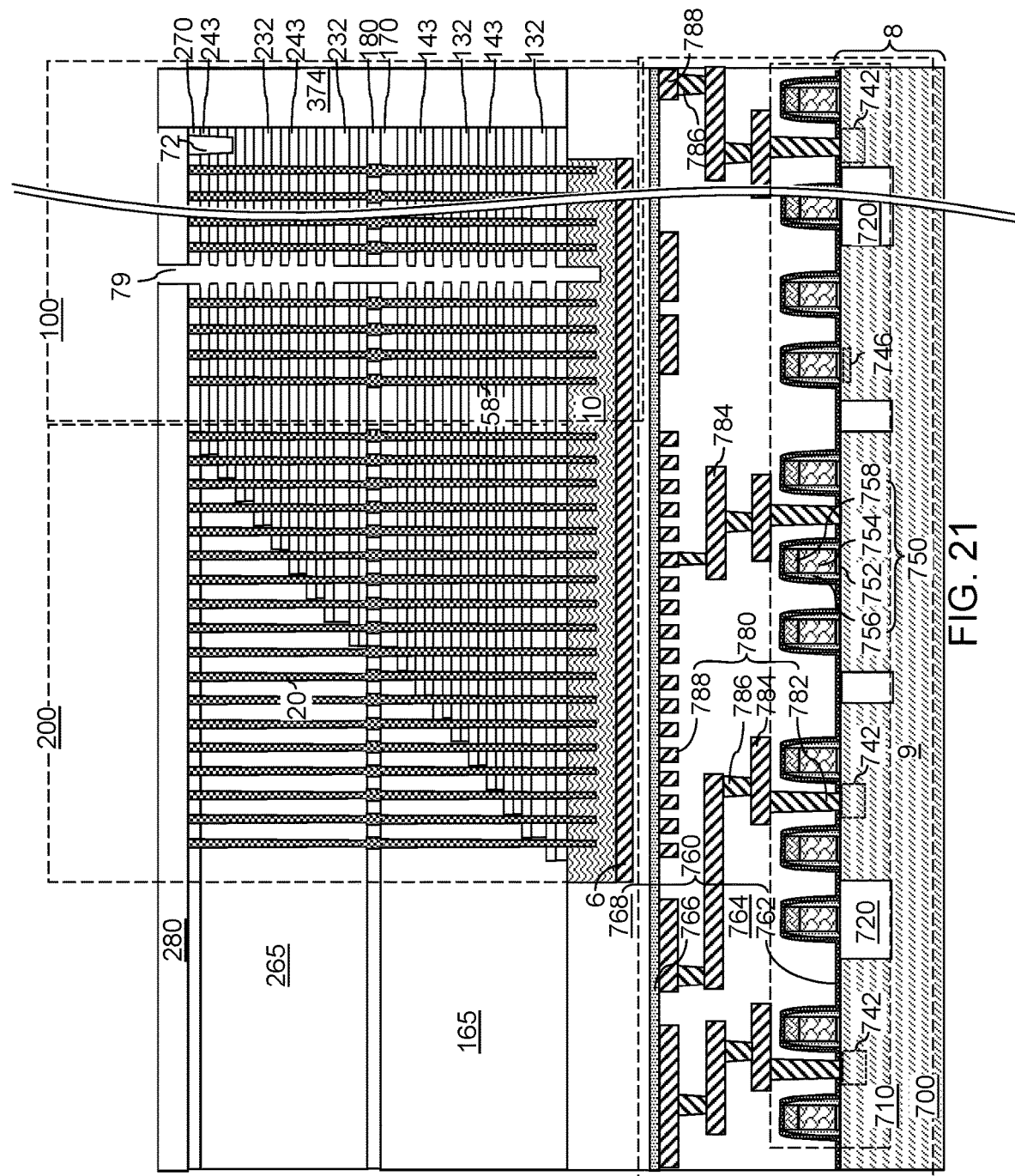
FIG. 21 is a vertical cross-sectional view of the exemplary structure after formation of backside recesses according to an embodiment of the present disclosure.

Referring to FIG. 21, the sacrificial material layers (142, 242) are may be removed selective to the insulating layers (132, 232), the first and second insulating cap layers (170, 270), the first contact level dielectric layer 280, the source contact layer 114, the dielectric semiconductor oxide plates 122, the annular dielectric semiconductor oxide spacers 124, and the dielectric pillar structures 374. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the dielectric pillar structures 374 and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), the dielectric pillar structures 374, and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) may be formed in volumes from which the sacrificial material layers (142, 242) are removed. The backside recesses (143, 243) may include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 22:
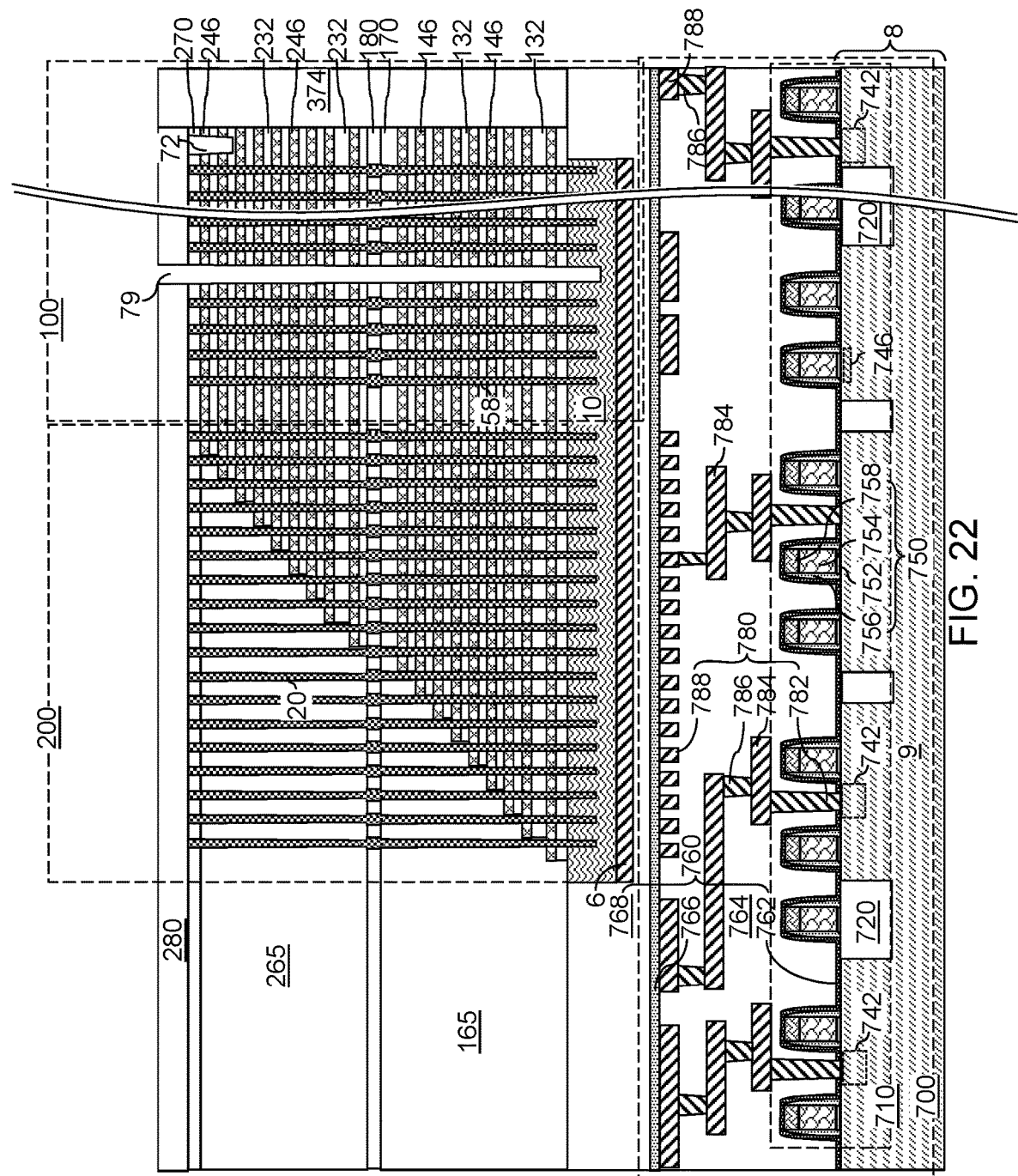
FIG. 22 is a vertical cross-sectional view of the exemplary structure after formation of electrically conductive layers according to an embodiment of the present disclosure.
Figure 23A:
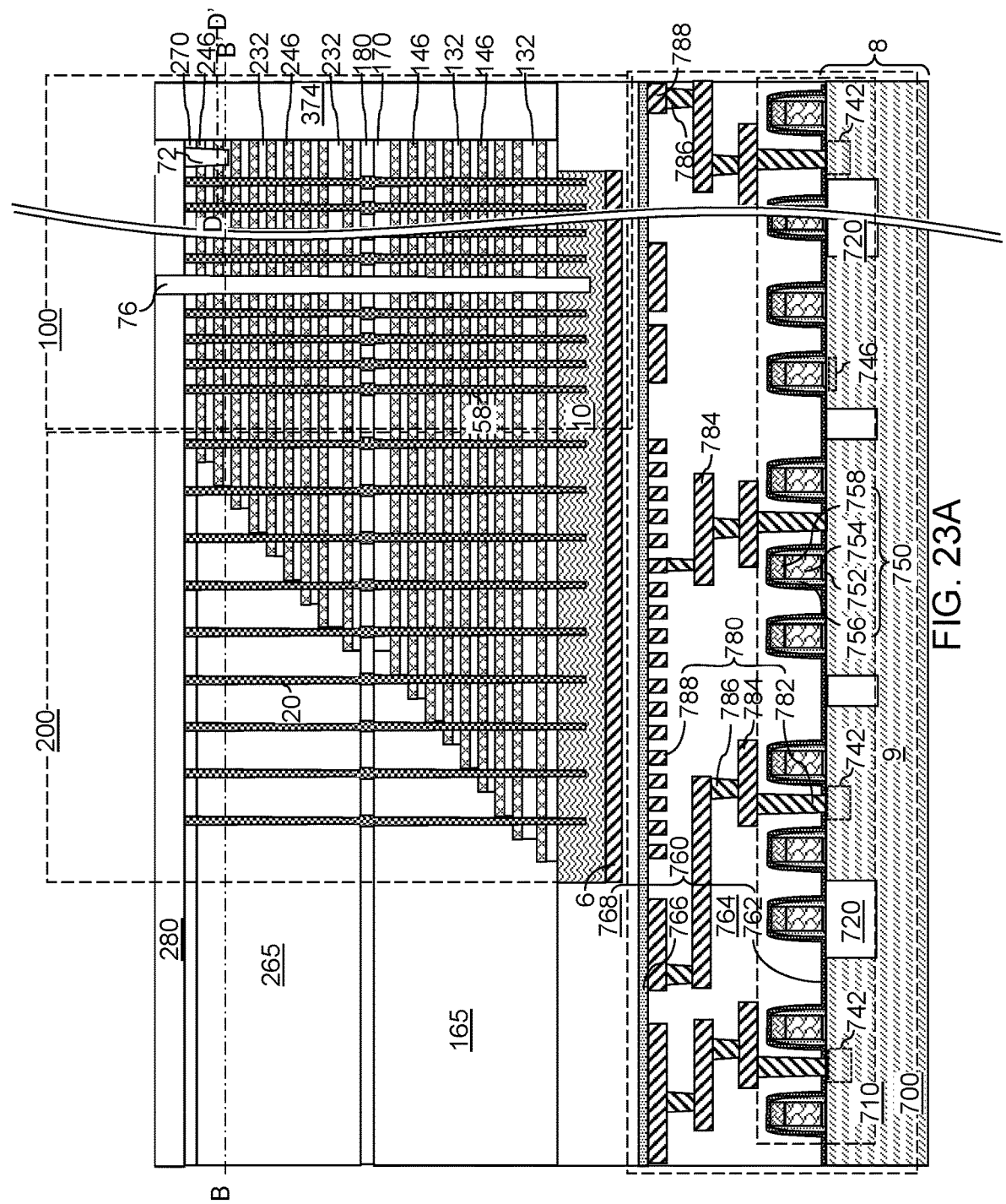
FIG. 23A is a vertical cross-sectional view of the exemplary structure after formation of backside trench fill structures according to an embodiment of the present disclosure.
Figure 23B:
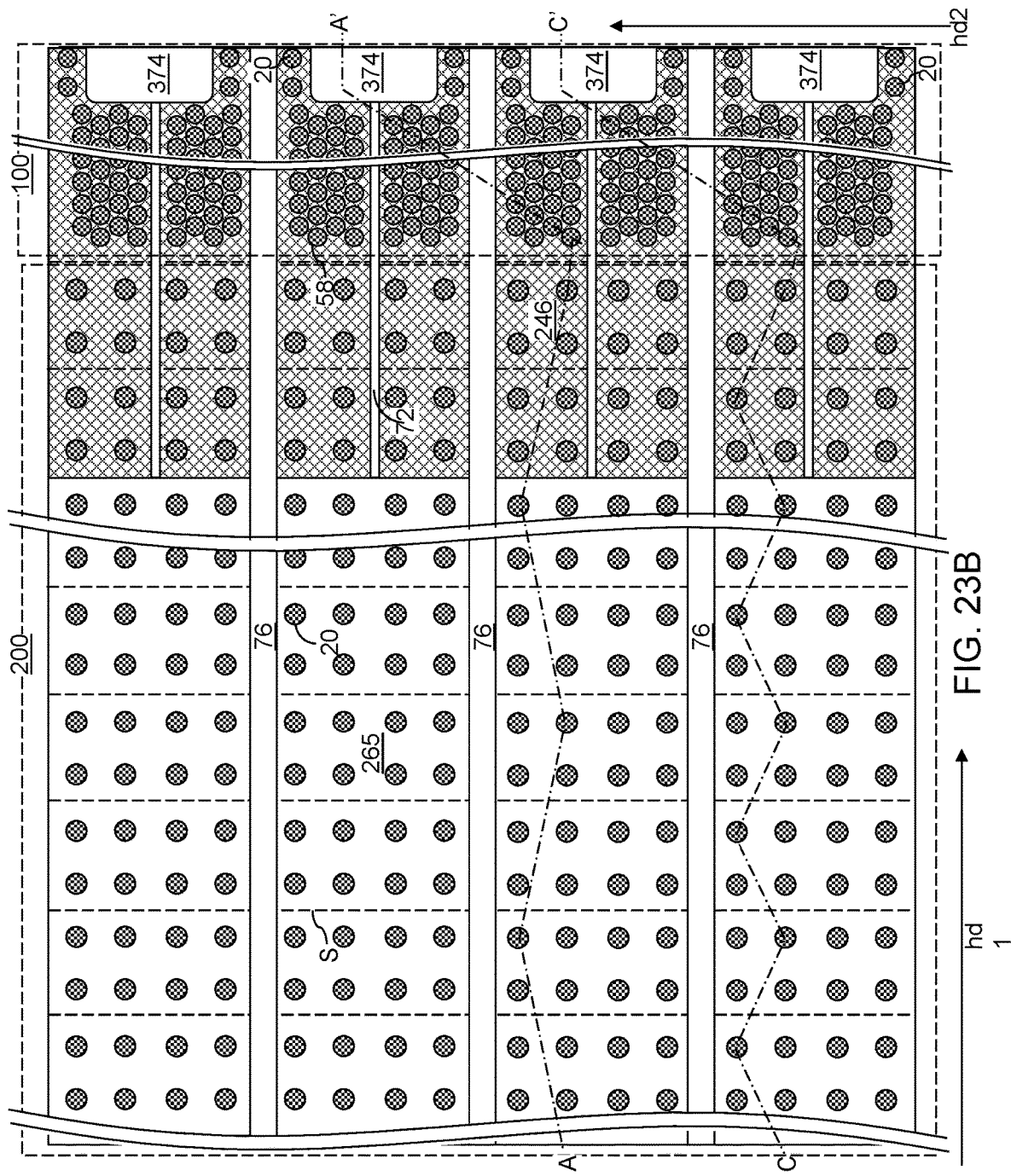
FIG. 23B is a horizontal cross-sectional of the exemplary structure along the horizontal plane B-B' of FIG. 23A. The hinged vertical plane A-A' corresponds to the plane of the vertical cross-sectional view of FIG. 23A.
Figure 23C:
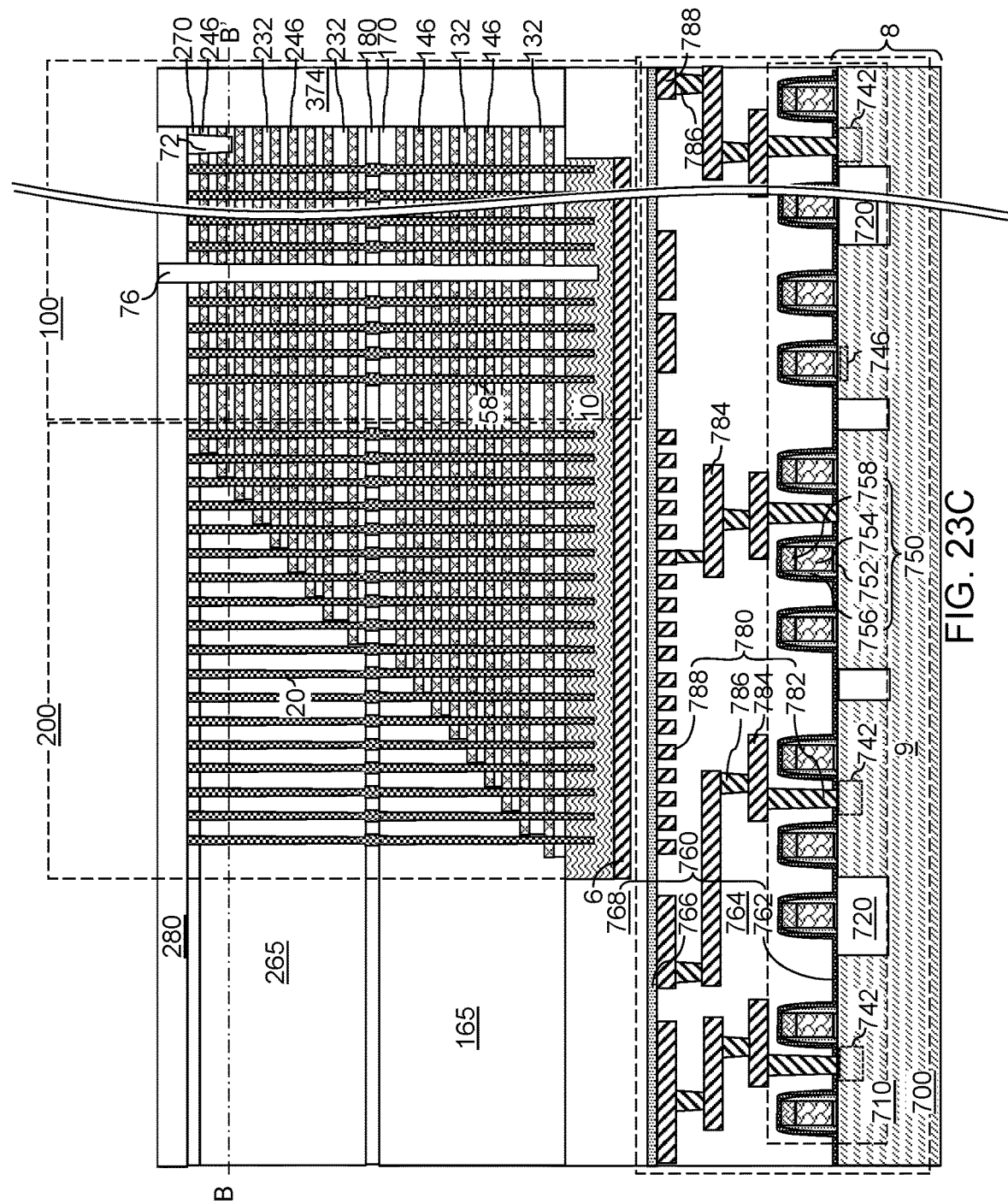
FIG. 23C is a vertical cross-sectional view of the exemplary structure along the vertical plane C-C' of FIG. 23B.
Figure 23D:
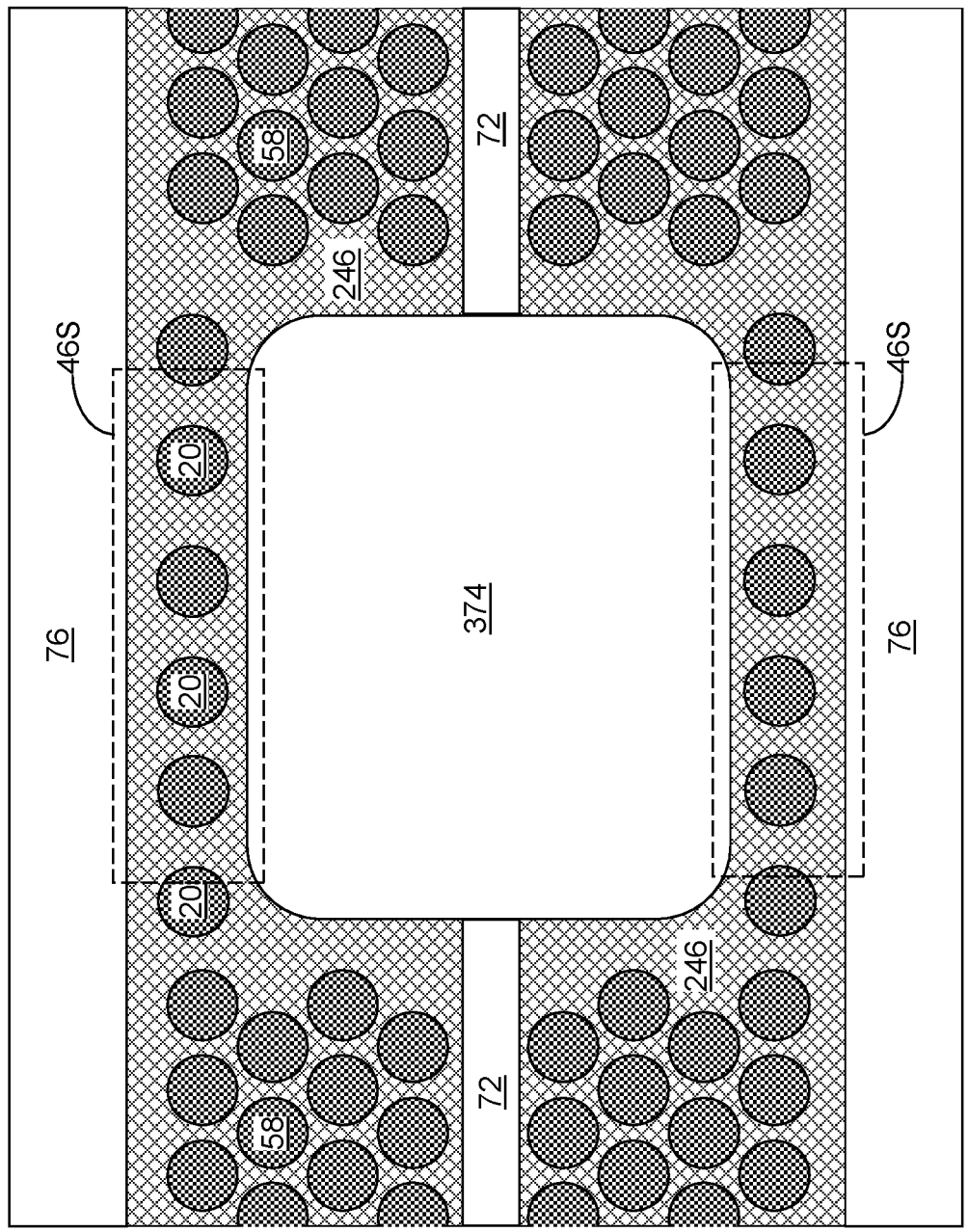
FIG. 23D is a horizontal cross-sectional view of the exemplary structure along the horizontal plane D-D' of FIG. 23A.

Referring to FIG. 22, a backside blocking dielectric layer (not shown) may be optionally deposited in the backside recesses (143, 243) and the backside trenches 79 and over the first contact level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Referring to FIGS. 23A-23D, a dielectric material layer may be conformally deposited in the backside trenches 79. The dielectric material layer may include, for example, silicon oxide. Excess portions of the dielectric material over the first contact level dielectric layer 280 may be removed by a planarization process, which may include chemical mechanical planarization (CMP) and/or a recess etch. Each remaining portion of the dielectric material that fills a backside trench 79 constitutes a backside trench fill structure 76, which may be a dielectric wall structure laterally extending along the first horizontal direction hd1 and vertically extending through each layer within a neighboring pair of alternating stacks {(132, 146), (232, 246)} of insulating layers (132, 232) and electrically conductive layers (146, 246). Each sacrificial backside trench fill material structure 77 may be replaced with a backside trench fill structure 76.

Memory stack structures 55 vertically extend through a respective alternating stack {(132, 146) and/or (232, 246)} of insulating layers (132, 232) and electrically conductive layers (146, 246). Each of the memory stack structures 55 comprises a respective memory film 50 and a respective vertical semiconductor channel 60. A source region (112, 114, 116) is electrically connected to a first end of each of the vertical semiconductor channels 60, and drain regions is electrically connected to a second end of a respective one of the vertical semiconductor channels 60.

Generally, the remaining portions of the sacrificial material layers (142, 242) at the processing steps of FIG. 20 may be replaced with the electrically conductive layers (146, 246). The electrically conductive layers (146, 246) comprise a respective strip portion 46S that laterally extend along the first horizontal direction hd1 between a dielectric pillar structure 374 and a pair of backside trenches 79. The memory stack structures 55 and the electrically conductive layers (146, 246) collectively comprise a two-dimensional array of vertical NAND strings.

Figure 24:
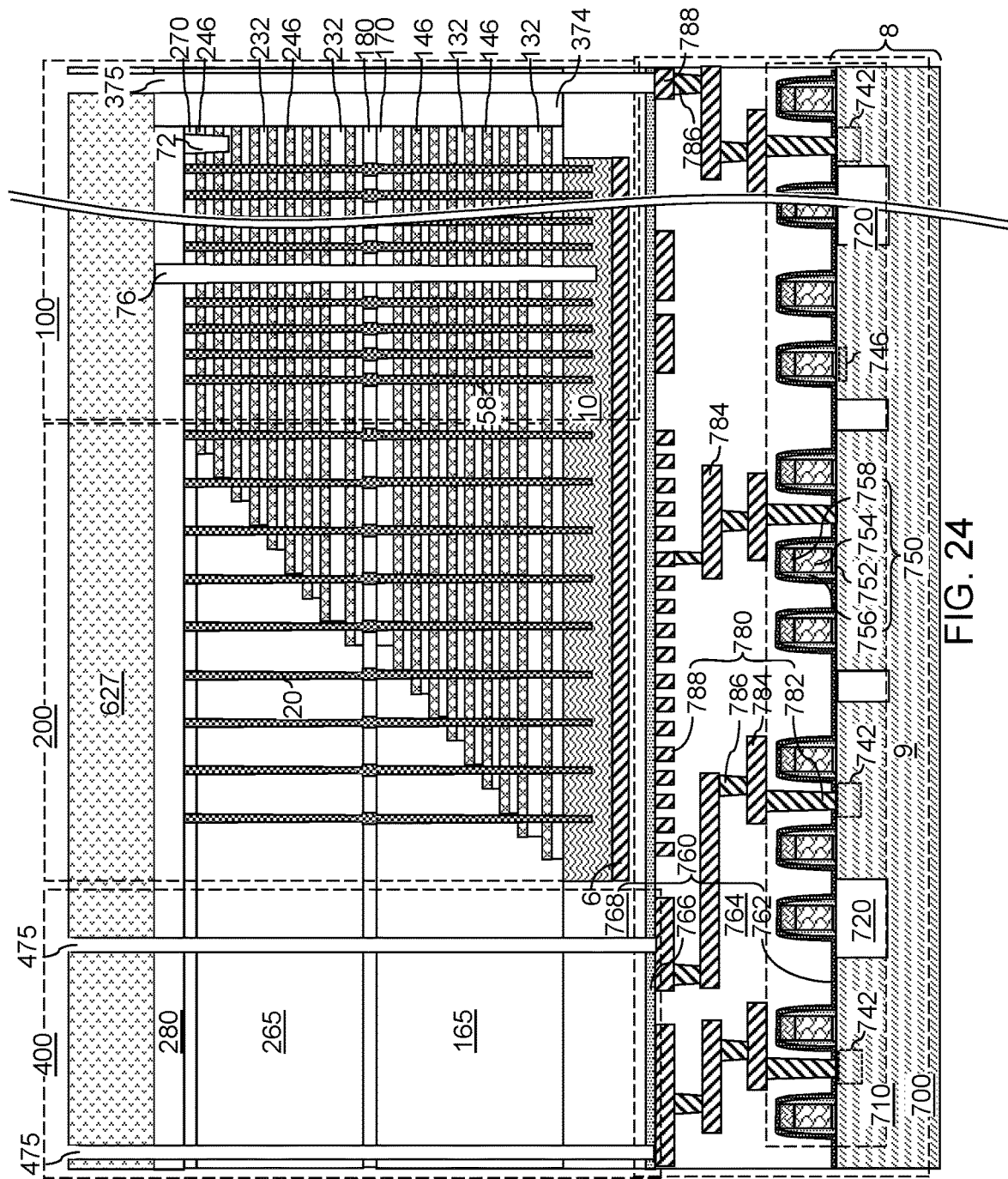
FIG. 24 is a vertical cross-sectional view of the exemplary structure after formation of contact via cavities according to an embodiment of the present disclosure.

Referring to FIG. 24, a photoresist layer 627 may be applied over the first contact level dielectric layer 280, and is lithographically patterned to form openings within areas of the dielectric pillar structures 374 and within the areas of the peripheral device region 400 that overlie openings through the in-process source-level material layers 10 (which contain at least one semiconductor material layer). An anisotropic etch process may be performed to transfer the pattern of the openings in the photoresist layer 627 thorough the dielectric pillar structures 374, through the stack of the first contact-level dielectric material layer 280, the insulating cap layers (170, 270), the retro-stepped dielectric material portions (165, 265), portions of the at least one second dielectric layer 768 within openings through the source-level material layers 10, and through the silicon nitride layer 766 to top surfaces of a subset of the landing-pad-level metal line structures 788. Array-region contact via cavities 375 may be formed through the dielectric pillar structures 374 to a top surface of a respective underlying one of the landing-pad-level metal line structures 788. Peripheral region contact via cavities 475 may be formed through the retro-stepped dielectric material portions (165, 265) to a top surface of a respective underlying one of the landing-pad-level metal line structures 788. The photoresist layer 627 may be subsequently removed, for example, by ashing.

Figure 25:
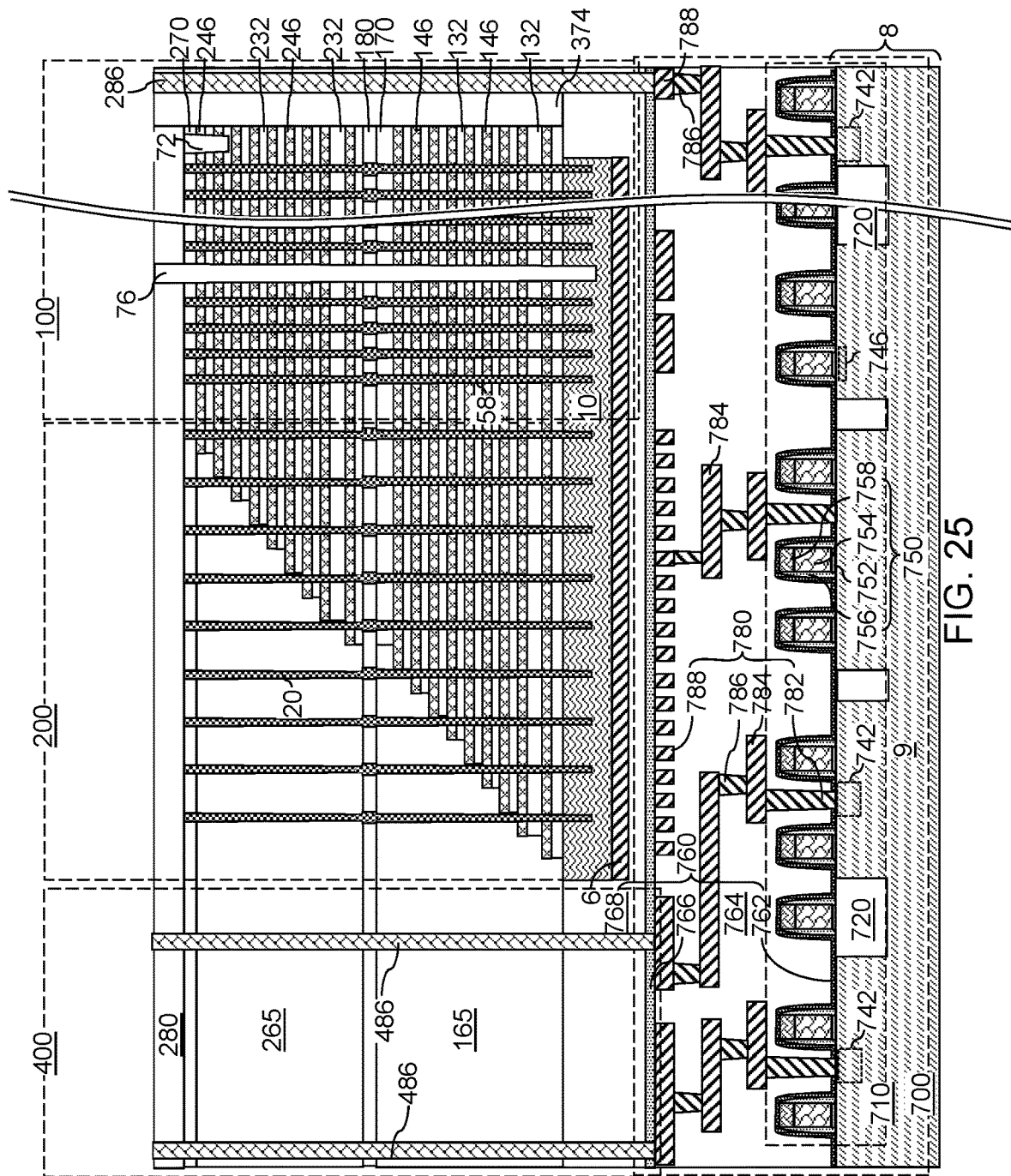
FIG. 25 is a vertical cross-sectional view of the exemplary structure after formation of first through-memory-level conductive via structure according to an embodiment of the present disclosure.
Figure 26A:
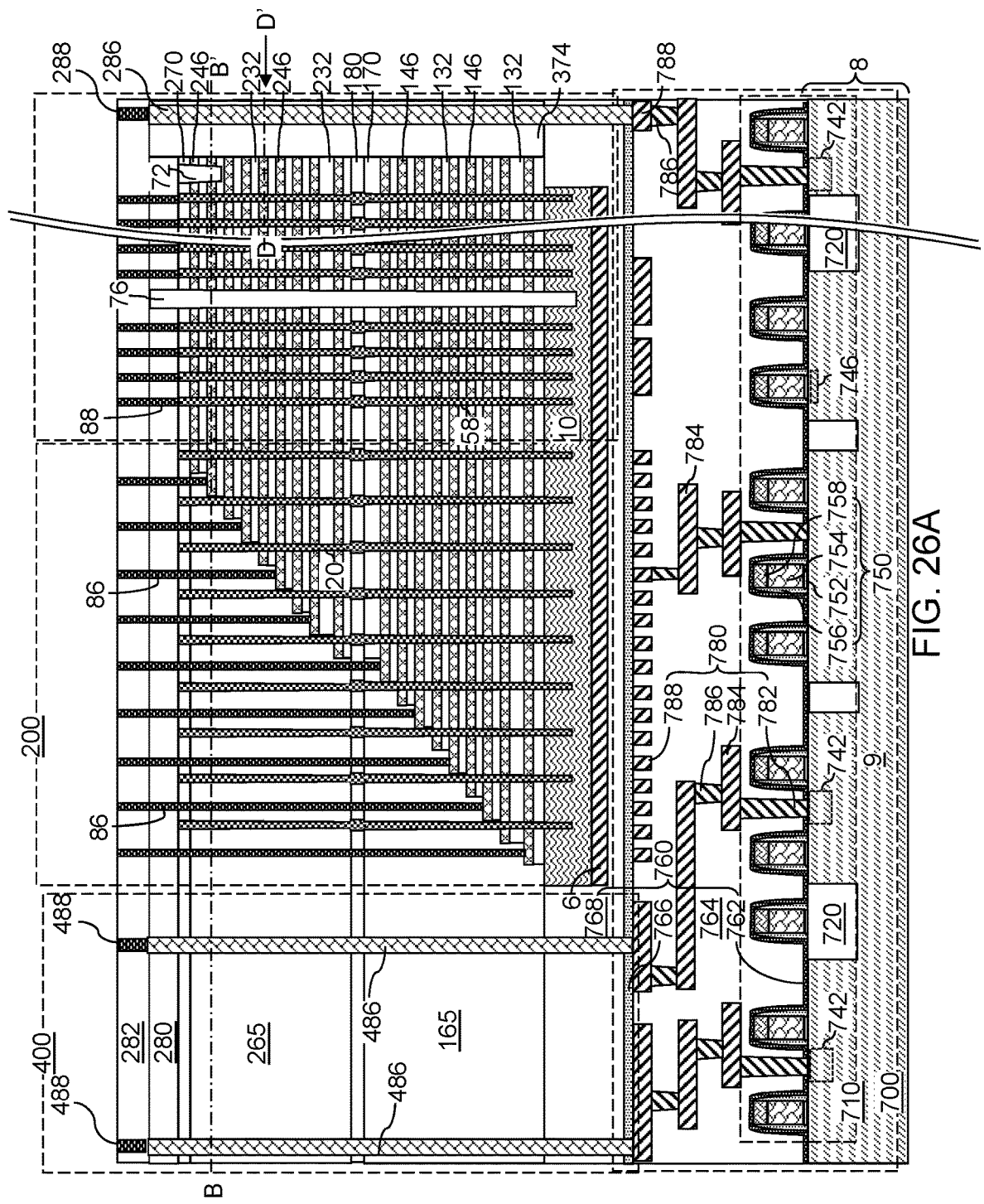
FIG. 26A is a vertical cross-sectional view of the exemplary structure after formation of a second contact level dielectric layer and various additional contact via structures according to an embodiment of the present disclosure.
Figure 26B:
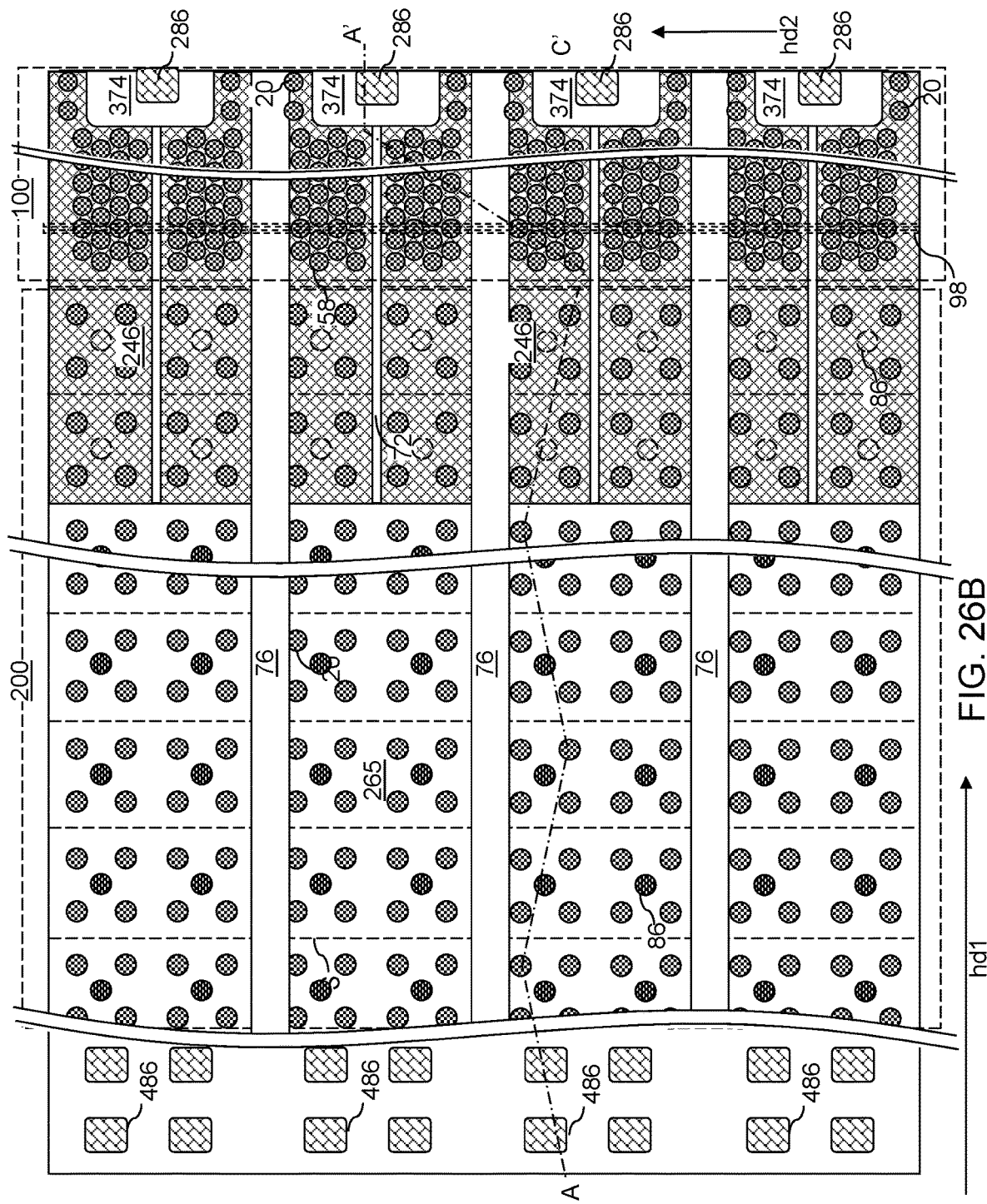
FIG. 26B is a horizontal cross-sectional view of the exemplary structure along the vertical plane B-B' of FIG. 26A. The hinged vertical plane A-A' corresponds to the plane of the vertical cross-sectional view of FIG. 26A.
Figure 26C:
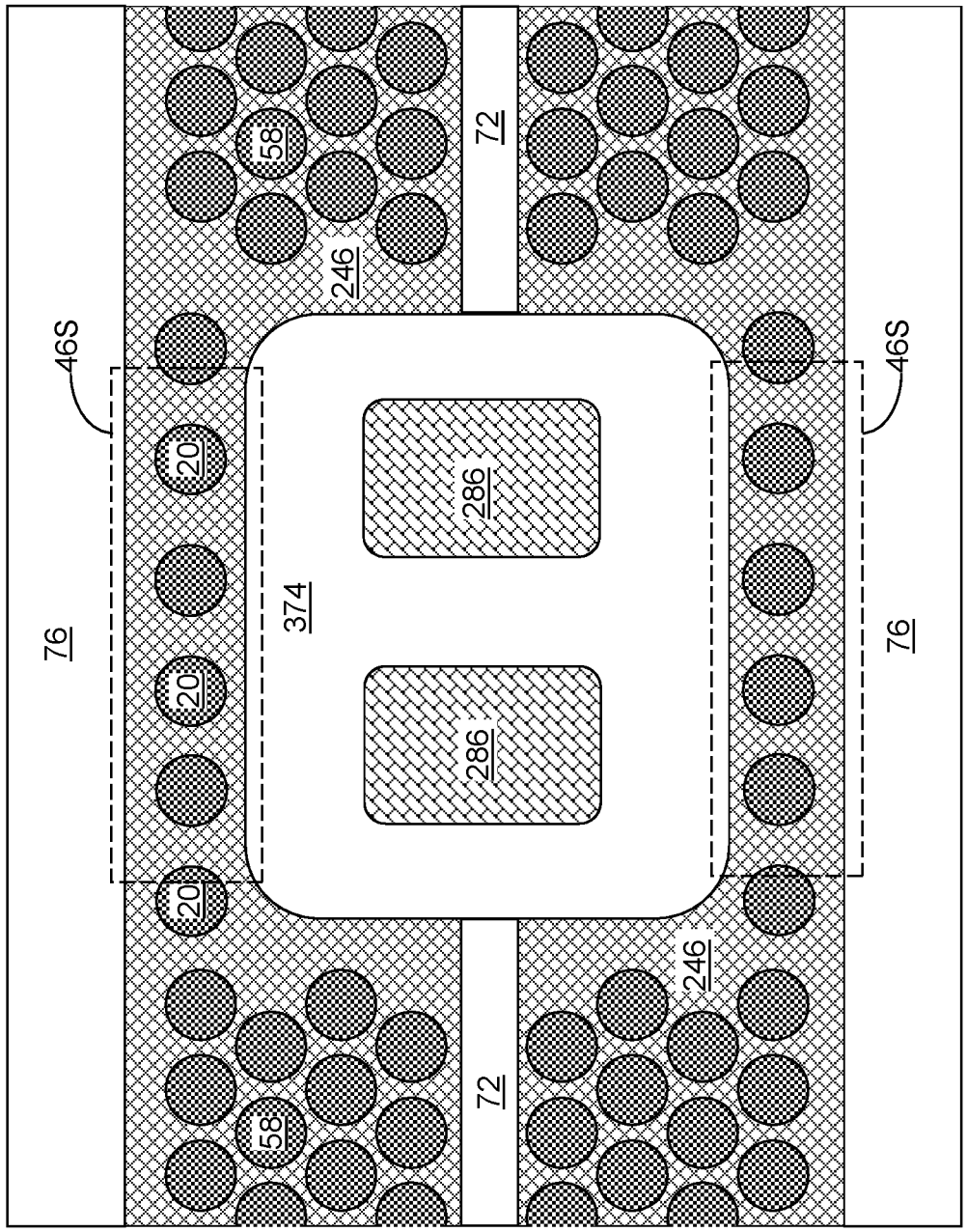
FIG. 26C is a magnified view of a region of the horizontal cross-sectional view of FIG. 24B.
Figure 26D:
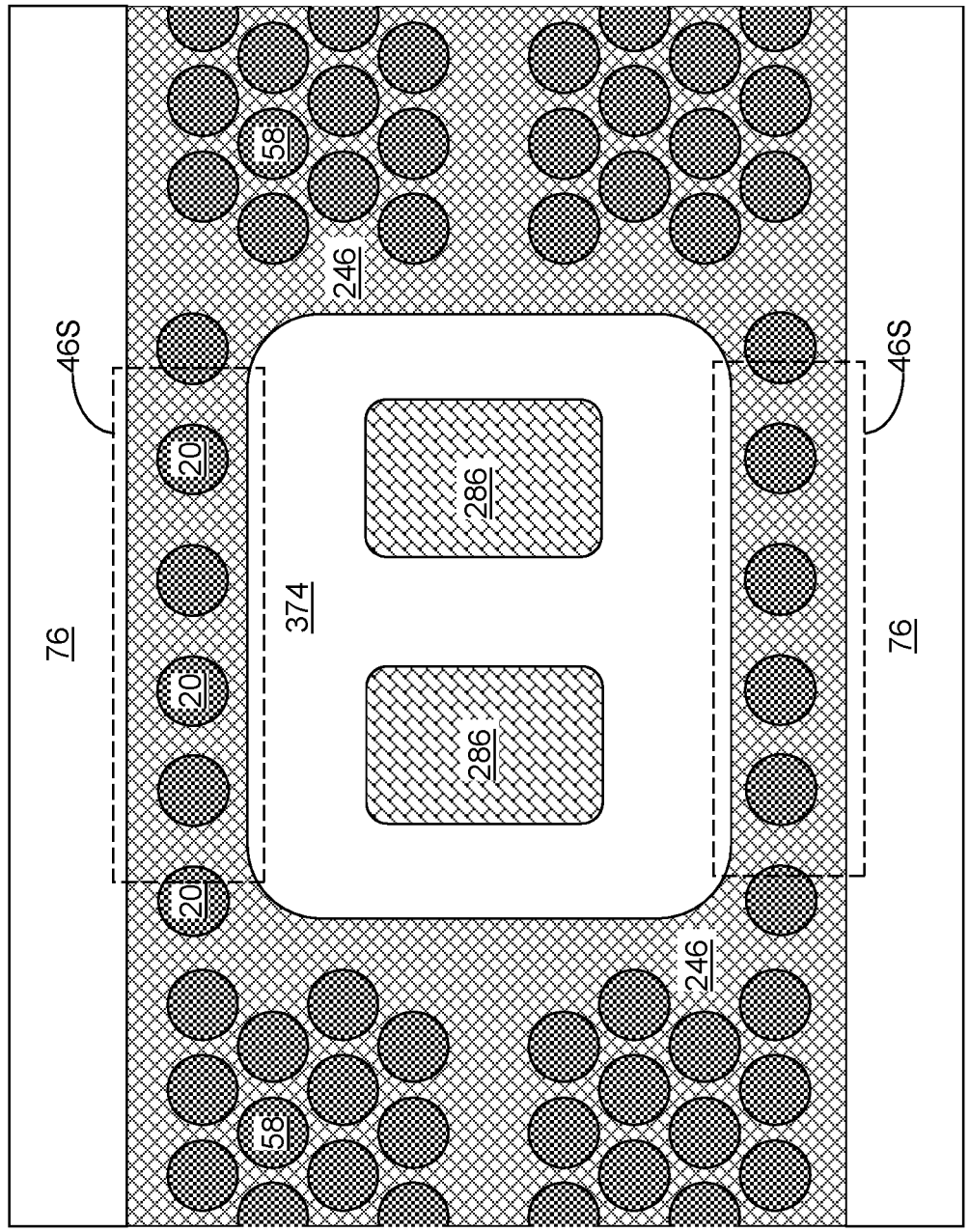
FIG. 26D is a horizontal cross-sectional view of the exemplary structure along the horizontal plane D-D' of FIG. 26B.

Referring to FIG. 25, at least one conductive material is deposited within the contact via cavities (375, 475) to form conductive via structures, which are herein referred to as through-memory-level conductive via structure (286, 486). The through-memory-level conductive via structures (286, 486) include array-region through-memory-level conductive via structures 286 that are formed in the array region contact via cavities 375 and peripheral-region through-memory-level conductive via structures 486 that are formed in the peripheral region contact via cavities 475.

In one embodiment, each of the through-memory-level conductive via structures (286, 486) may include a conductive liner and a conductive fill material. The conductive liner may include a conductive metallic liner such as TiN, TaN, WN, TiC, TaC, WC, an alloy thereof, or a stack thereof. The thickness of the conductive liner may be in a range from 3 nm to 30 nm, although lesser and greater thicknesses may also be used. The conductive fill material may include a metal or a metallic alloy. For example, the conductive fill material may include W, Cu, Al, Co, Ru, Ni, an alloy thereof, or a stack thereof.

Each array-region through-memory-level conductive via structure 286 vertically extends through, and contacts a sidewall of, a respective dielectric pillar structure 374. One or more array-region through-memory-level conductive via structure 286 may vertically extend through a dielectric pillar structure 374. Each peripheral-region through-memory-level conductive via structure 486 vertically extends through, and contacts a sidewall of, at least one dielectric material portion such as the first retro-stepped dielectric material portion 165 and the second retro-stepped dielectric material portion 265.

Generally, a through-memory-level conductive via structure (such as an array-region through-memory-level conductive via structure 286) may vertically extend through a dielectric pillar structure 374. The through-memory-level conductive via structure extends from a first horizontal plane located above a topmost layer of the alternating stack (such as a horizontal plane including the top surface of the first contact-level dielectric material layer 280) to a second horizontal plane located below a bottommost layer of the alternating stack {(132, 146), (232, 246)} (such as a horizontal plane including top surfaces of the landing-pad-level metal line structures 788). The through-memory-level conductive via structure may vertically extend through an opening through each semiconductor material layer in the source-level material layers 10, and may contact one of the lower-level metal interconnect structures 780.

Referring to FIGS. 26A-26D, a second contact level dielectric layer 282 may be formed over the first contact level dielectric layer 280. The second contact level dielectric layer 282 includes a dielectric material such as silicon oxide, and may have a thickness in a range from 100 nm to 600 nm, although lesser and greater thicknesses may also be used.

A photoresist layer (not shown) may be applied over the second contact level dielectric layer 282, and may be lithographically patterned to form various contact via openings. For example, openings overlying drain regions 63 and the array-region through-memory-level conductive via structures 286 may be formed in the memory array region 100, openings overlying horizontal surfaces of the stepped surfaces of the electrically conductive layers (146, 246) may be formed in the staircase region 200, and openings overlying the peripheral-region through-memory-level conductive via structures 486 may be formed in the peripheral device region 400. An anisotropic etch process is performed to transfer the pattern in the photoresist layer through the second and first contact level dielectric layers (282, 280) and underlying dielectric material portions. The drain regions 63, the electrically conductive layers (146, 246), and the through-memory-level conductive via structure (286, 486) may be used as etch stop structures. Drain contact via cavities may be formed over each drain region 63, staircase-region contact via cavities may be formed over each electrically conductive layer (146, 246) at the stepped surfaces underlying the first and second retro-stepped dielectric material portions (165, 265), and connection cavities may be formed over the through-memory-level conductive via structures (286, 486). The photoresist layer may be subsequently removed, for example, by ashing.

At least one conductive material may be deposited within the various cavities by a conformal deposition process. Excess portions of the at least one conductive material may be removed from above the horizontal plane including the top surfaces of the second contact-level dielectric material layer 282. Drain conductive via structures 88 are formed in the drain contact via cavities and on a top surface of a respective one of the drain regions 63. Staircase-region conductive via structures 86 are formed in the staircase-region contact via cavities and on a top surface of a respective one of the electrically conductive layers (146, 246). The staircase-region conductive via structures 86 may include drain select level conductive via structures that contact a subset of the second electrically conductive layers 246 that function as drain select level gate electrodes. Further, the staircase-region conductive via structures 86 may include word line conductive via structures that contact electrically conductive layers (146, 246) that underlie the drain select level gate electrodes and function as word lines for the memory stack structures 55. Interconnection via structures 288 may be formed on top of a respective one of the through-memory-level conductive via structure 286. An array region connection via structure 288 may be formed in each connection cavity that overlies an array region through-memory-level conductive via structure 286. A peripheral region connection via structure 488 may be formed in each connection cavity that overlies a peripheral region through-memory-level conductive via structure 486. The electrically conductive layers (146, 246) comprise a respective strip portion 46S that laterally extend along the first horizontal direction hd1 between a dielectric pillar structure 374 and a pair of backside trenches 79.

Figure 27:
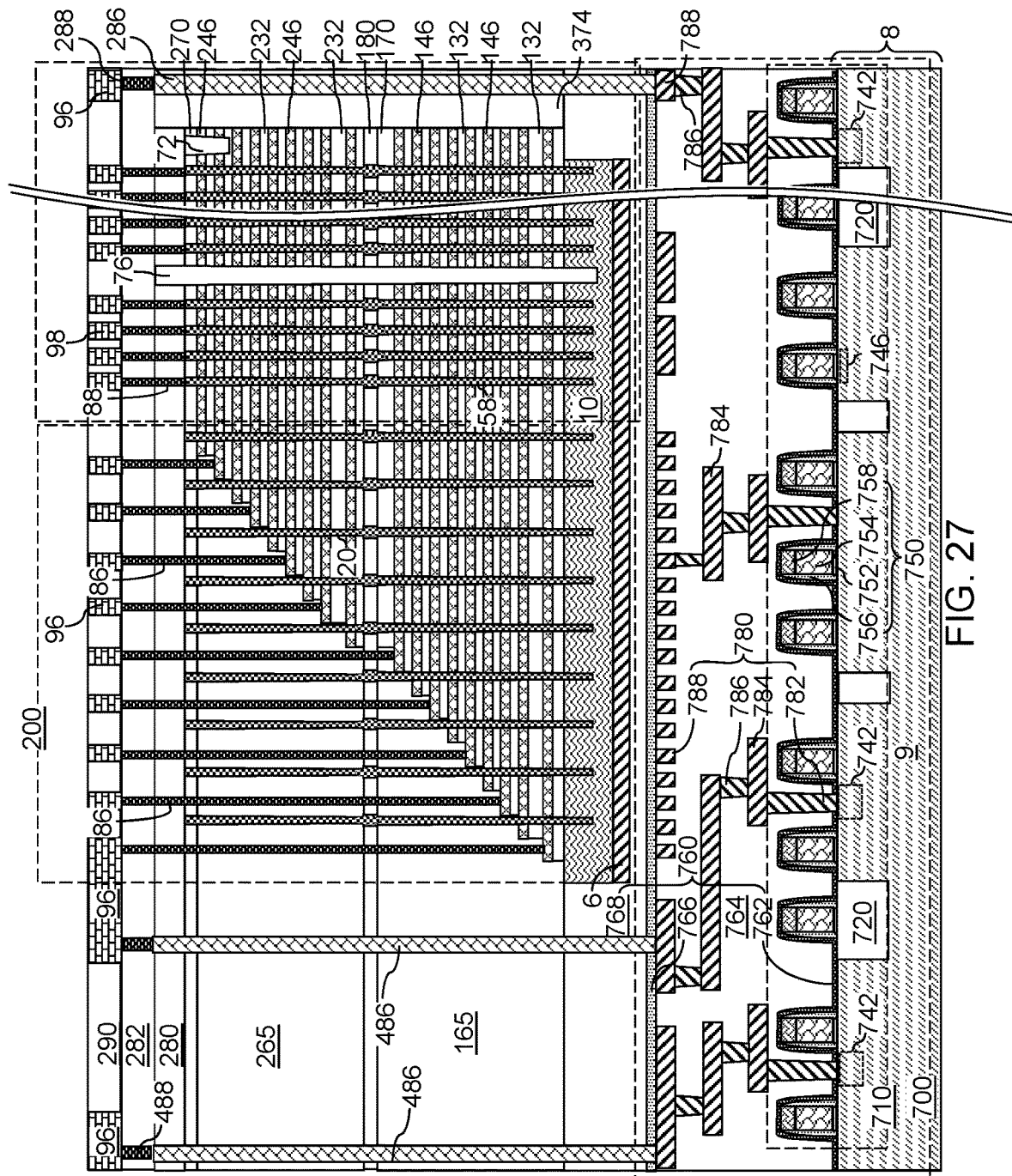
FIG. 27 is a vertical cross-sectional view of the exemplary structure after formation of upper-level metal line structures according to an embodiment of the present disclosure.

Referring to FIG. 27, at least one additional dielectric layer may be formed over the contact level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact level dielectric layers (280, 282). The upper-level metal interconnect structures may include bit lines 98 contacting a respective one of the drain conductive via structures 88, and interconnection line structures 96 contacting, and/or electrically connected to, at least one of the staircase-region conductive via structures 86 and/or the array region connection via structures 288 and/or the peripheral region connection via structures 488. The bit lines 98 may be electrically connected to a respective subset of the drain regions 63. In one embodiment, the electrically conductive layers (146, 246) may laterally extend along the first horizontal direction hd1 and may have a uniform width along the second horizontal direction hd2. The bit lines 98 may laterally extend along the second horizontal direction hd2.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of vertical semiconductor channels 60, wherein at least one end portion of each of the plurality of vertical semiconductor channels 60 extends substantially perpendicular to a top surface of the substrate 8, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of vertical semiconductor channels 60.

According to all drawings and various embodiments of the present disclosure, a semiconductor structure is provided, which comprises: a semiconductor material layer (which is present within the source-level material layers 10) overlying a substrate 8; an alternating stack of insulating layers (132, 232) and electrically conductive layers (146, 246) located over the semiconductor material layer; memory stack structures 55 vertically extending through the alternating stack; a peripheral circuitry including field effect transistors and located over the substrate 8 and underneath the semiconductor material layer; lower-level metal interconnect structures 780 formed in lower-level dielectric material layers 760 and located between the peripheral circuitry and the semiconductor material layer; a pair of backside trench fill structures 76 vertically extending through the alternating stack and laterally extending along a first horizontal direction hd1; a dielectric pillar structure 374 extending through the alternating stack and located between the pair of backside trench fill structures 76, wherein each of the pair of backside trench fill structures 76 and the dielectric pillar structure 374 comprises sidewalls having a bowing profile that provides a greater width at a height between a topmost layer of the alternating stack and a bottommost layer of the alternating stack than at a height of the topmost layer of the alternating stack; and a through-memory-level conductive via structure 286 vertically extending through the dielectric pillar structure 374 and an opening in the semiconductor material layer and contacting one of the lower-level metal interconnect structures 780.

Embodiments of the present disclosure may be used to form backside trenches 79 and the sets of nested trenches (179, 279) using a same lithographic patterning step and a same etch step(s). As such, the set of nested trenches (179, 279) are formed at the same time as neighboring pair of backside trenches 79. The process cost may be reduced by omitting a separate etch step which forms the large size, deep pillar-shaped cavities 379. Furthermore, the chip size may be reduced by using smaller tolerances between the backside trench 79 and pillar-shaped cavity 379 because they are formed during the same lithography step. Sequential removal of sacrificial inner trench fill structures 177, vertically alternating sequences of insulating plates (132' and/or 232') and sacrificial material plates (142' and/or 242'), and sacrificial outer trench fill structures 277 may be performed using a block level lithography process (such as a mid-ultraviolet lithographic patterning process) and low cost etch processes such as wet etch processes. Thus, the processing cost for forming pillar-shaped cavities 379 and dielectric pillar structures 374 between neighboring pairs of backside trenches may be significantly reduced through the use of the methods of the embodiments of the present disclosure. The sidewalls of the backside trenches 79 and the sidewalls of the nested trenches (179, 279) may have same bulging profiles due to use of a same anisotropic etch process.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
a semiconductor material layer overlying a substrate;
an alternating stack of insulating layers and electrically conductive layers located over the semiconductor material layer;
memory stack structures vertically extending through the alternating stack;
a peripheral circuitry including field effect transistors and located on the substrate and underneath the semiconductor material layer, wherein the peripheral circuitry is configured to control charge storage elements within the memory stack structures;

lower-level metal interconnect structures formed in lower-level dielectric material layers and located between the peripheral circuitry and the semiconductor material layer;

a pair of backside trench fill structures vertically extending through the alternating stack and laterally extending along a first horizontal direction;

a dielectric pillar structure extending through the alternating stack and located between the pair of backside trench fill structures, wherein each of the pair of backside trench fill structures and the dielectric pillar structure comprises sidewalls having a bowing profile that provides a greater width at a height between a topmost layer of the alternating stack and a bottommost layer of the alternating stack than at a height of the topmost layer of the alternating stack; and a through-memory-level conductive via structure vertically extending through the dielectric pillar structure and an opening in the semiconductor material layer and contacting one of the lower-level metal interconnect structures; wherein a retro-stepped dielectric material portion overlying stepped surfaces of the alternating stack; and peripheral-region through-memory-level conductive via structures vertically extending through the retro-stepped dielectric material portion and contacting a top surface of a respective one of the lower-level metal interconnect structures; wherein the through-memory-level conductive via structure and the peripheral-region through-memory-level conductive via structure consist essentially of a same set of at least one conductive material.

2. The semiconductor structure of claim 1, further comprising another through-memory-level conductive via structure vertically extending through the dielectric pillar structure and the opening in the semiconductor material layer and contacting another of the lower-level metal interconnect structures, wherein the through-memory-level conductive via structure and the another through-memory-level conductive via structure are laterally spaced apart from each other by the dielectric pillar structure.

3. The semiconductor structure of claim 1, wherein the memory stack structures are located between the pair of backside trench fill structures.

4. The semiconductor structure of claim 1, wherein:
the opening in the semiconductor material layer is filled with a portion of the lower-level dielectric material layers; and
a bottom surface of the dielectric pillar structure contacts a top surface of the portion of the lower-level dielectric material layer located in the opening in the semiconductor material layer.

5. The semiconductor structure of claim 1, further comprising a drain-select-level dielectric isolation structure laterally extending along the first horizontal direction, vertically extending through at least a topmost electrically conductive layer within the alternating stack, and contacting an outer sidewall of the dielectric pillar structure.

6. The semiconductor structure of claim 1, wherein a bottom surface of the dielectric pillar structure does not contact, and is vertically spaced from, the one of the lower-level metal interconnect structures laterally that is contacted by the through-memory-level conductive via structure.

7. The semiconductor structure of claim 1, wherein a subset of the electrically conductive layers within the alternating stack comprises a respective first strip portion that laterally extends along the first horizontal direction between the dielectric pillar structure and a first backside trench fill structure of the pair of backside trench fill structures, and a respective second strip portion that laterally extends along the first horizontal direction between the dielectric pillar structure and a second backside trench fill structure of the pair of backside trench fill structures.

8. The semiconductor structure of claim 7, further comprising:
first support pillar structures vertically extending through each first strip portion of the subset of the electrically conductive layers; and
second support pillar structures vertically extending through each second strip portion of the subset of the electrically conductive layers.

9. The semiconductor structure of claim 8, wherein:
each of the memory stack structures comprises a subset of material portions in a memory opening fill structure located within a respective memory opening that vertically extends through the alternating stack;
each of the memory opening fill structures, the first support pillar structures, and the second support pillar structures comprises a same set of material portions; and
the same set of material portions comprises a vertical semiconductor channel, a memory film that laterally surrounds the vertical semiconductor channel, a dielectric core that is laterally surrounded by the vertical semiconductor channel, and a drain region contacting an upper end of the vertical semiconductor channel.

10. The semiconductor structure of claim 1, wherein a first subset of the memory stack structures is located within a first area that is located between the pair of backside trench fill structures, and a second subset of the memory stack structures is located within a second area that is located between the pair of backside trench fill structures and is laterally offset from the first area by the dielectric pillar structure.

11. The semiconductor structure of claim 1, wherein:
each of the memory stack structures comprises a respective vertical semiconductor channel having a doping of a first conductivity type and a vertical stack of memory elements located at levels of the electrically conductive layers; and
the semiconductor material layer comprises a source contact layer having a doping of a second conductivity type that is an opposite of the first conductivity type.

12. The semiconductor structure of claim 11, wherein the semiconductor material layer comprises:
an upper source-level semiconductor layer contacting a top surface of the source contact layer; and
a lower source-level semiconductor layer contacting a bottom surface of the source contact layer.

13. The semiconductor structure of claim 11, wherein the source contact layer contacts a cylindrical portion of an outer sidewall of each of the vertical semiconductor channels of the memory stack structures.

14. The semiconductor structure of claim 1, wherein a top surface of the through-memory-level conductive via structure is located within a horizontal plane including a top surface of the dielectric pillar structure.

15. The semiconductor structure of claim 14, wherein the top surface of the through-memory-level conductive via structure is located above a horizontal plane including top surfaces of the memory stack structures and a topmost surface of the alternating stack.

16. The semiconductor structure of claim 1, wherein a bottom surface of the through-memory-level conductive via structure is located below a horizontal plane including a bottom surface of the dielectric pillar structure.

17. The semiconductor structure of claim 1, wherein the dielectric pillar structure comprises a pair of straight sidewalls that laterally extend along the first horizontal direction.

18. The semiconductor structure of claim 1, further comprising a pair of dielectric semiconductor oxide plates contacting a bottom surface of a respective one of the pair of backside trench fill structures and contacting a respective surface of the semiconductor material layer.

* * * * *